(12) United States Patent
Park et al.

(10) Patent No.: US 12,178,090 B2
(45) Date of Patent: Dec. 24, 2024

(54) ELECTRONIC DEVICE

(71) Applicant: LG Display Co., Ltd., Seoul (KR)

(72) Inventors: SeHee Park, Seoul (KR); InTak Cho, Gyeonggi-do (KR); PilSang Yun, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 279 days.

(21) Appl. No.: 16/923,444

(22) Filed: Jul. 8, 2020

(65) Prior Publication Data

US 2021/0013290 A1  Jan. 14, 2021

(30) Foreign Application Priority Data

Jul. 9, 2019  (KR) .................. 10-2019-0082473

(51) Int. Cl.
  *H10K 59/131* (2023.01)
  *G09G 3/3291* (2016.01)
  *H10K 59/124* (2023.01)

(52) U.S. Cl.
  CPC ......... *H10K 59/131* (2023.02); *G09G 3/3291* (2013.01); *H10K 59/124* (2023.02)

(58) Field of Classification Search
  CPC ............ H01L 27/3248; H01L 29/4908; H01L 27/3265; H01L 27/3262; H01L 27/3244; H01L 2251/5338; H01L 21/02488; H01L 2251/558; H01L 2924/12044; H01L 23/5223; H01L 2924/19041; H01L 2924/30105; H01L 27/3276; H01L 27/124; H01L 27/32; H01L 29/786; H01L 51/52; H01L 27/3258; H01L 27/1255; G09G 2300/0426; G09G 3/3266; G09G 3/3208; G09G 3/3291; G09G 3/3233; G11C 11/24
  See application file for complete search history.

(56) References Cited

U.S. PATENT DOCUMENTS 6,900,871 B1 * 5/2005 Song .............. G02F 1/136286
                                              257/E27.111
9,276,050 B2 * 3/2016 Kwon ............... H01L 29/78675
(Continued)

FOREIGN PATENT DOCUMENTS

KR  10-2015-0066428 A  6/2015
KR  10-2018-0062229 A  6/2018

OTHER PUBLICATIONS

Office Action issued on Aug. 7, 2023, for counterpart Korean Patent Application No. 10-2019-0082473.

*Primary Examiner* — Benjamin X Casarez
(74) *Attorney, Agent, or Firm* — Morgan, Lewis & Bockius LLP

(57) ABSTRACT

Provided is an electronic device. The electronic device includes at least one first transistor to which a data voltage is applied. The first transistor includes a first conductive layer disposed on a substrate and a first active layer, which is disposed on the first conductive layer, has one end and the other end which are made conductive, and includes a first channel region disposed between the one end and the other end. A second conductive layer overlapping the first conductive layer with a first insulating layer interposed between the second conductive layer and the first conductive layer is included in a storage capacitor in a panel, and the storage capacitor is disposed under the first channel region of the first active layer. In this way, an ultra-high definition panel is fabricated.

33 Claims, 37 Drawing Sheets

(56) References Cited

U.S. PATENT DOCUMENTS

| | | | |
|---|---|---|---|
| 10,622,428 B2* | 4/2020 | Oh | H01L 29/66765 |
| 2017/0162172 A1* | 6/2017 | Saotome | H01L 29/4908 |
| 2018/0006102 A1* | 1/2018 | Oh | G09G 3/3233 |
| 2018/0012948 A1* | 1/2018 | Lee | H01L 27/1218 |
| 2018/0033883 A1* | 2/2018 | Zhou | H01L 27/1255 |
| 2018/0151633 A1* | 5/2018 | Won | H01L 27/1248 |
| 2018/0158405 A1* | 6/2018 | Agostinelli | G09G 3/3233 |
| 2018/0166015 A1* | 6/2018 | Beak | H10K 59/1216 |
| 2018/0182302 A1 | 6/2018 | Yoo et al. | |
| 2019/0131370 A1* | 5/2019 | Heo | H01L 27/1259 |
| 2019/0206971 A1* | 7/2019 | Kim | H10K 59/1201 |
| 2019/0214447 A1* | 7/2019 | Kim | H10K 59/126 |
| 2019/0229131 A1* | 7/2019 | Chung | H01L 27/1248 |
| 2019/0265532 A1* | 8/2019 | Yamazaki | G02F 1/1368 |
| 2020/0135091 A1* | 4/2020 | Kim | G09G 3/3233 |
| 2020/0294446 A1* | 9/2020 | Long | H10K 59/1201 |

* cited by examiner

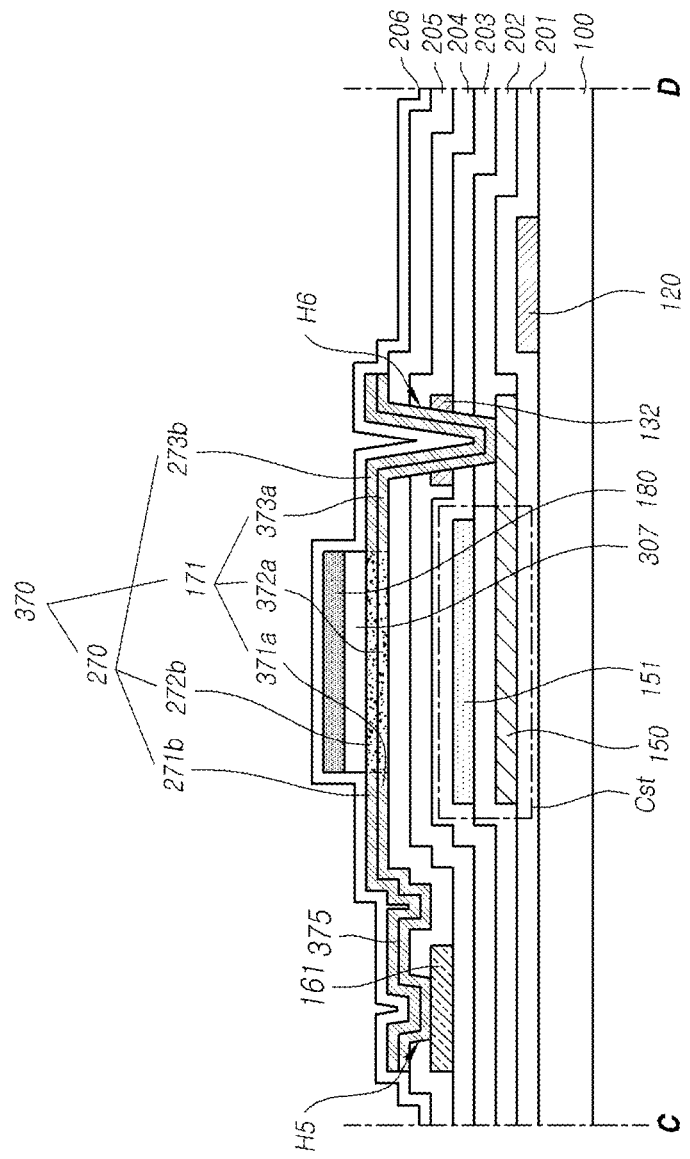

FIG.27
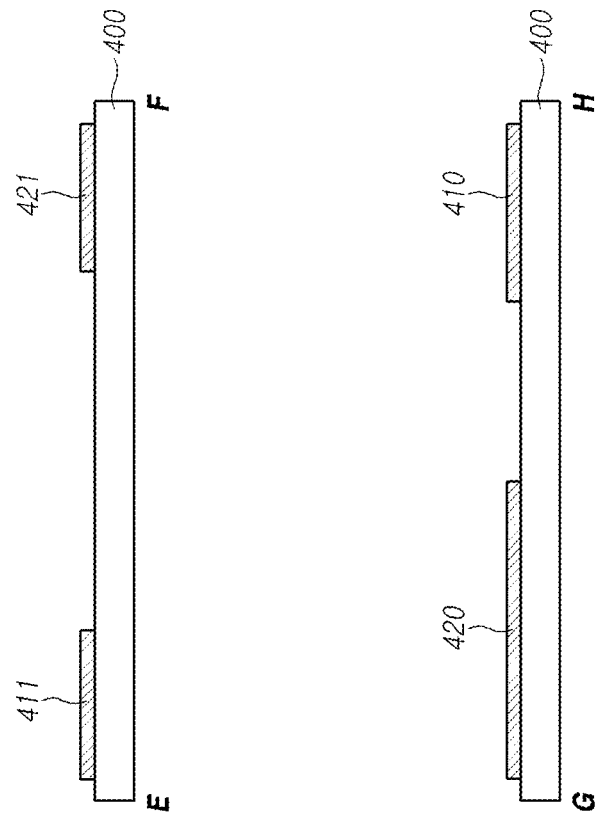
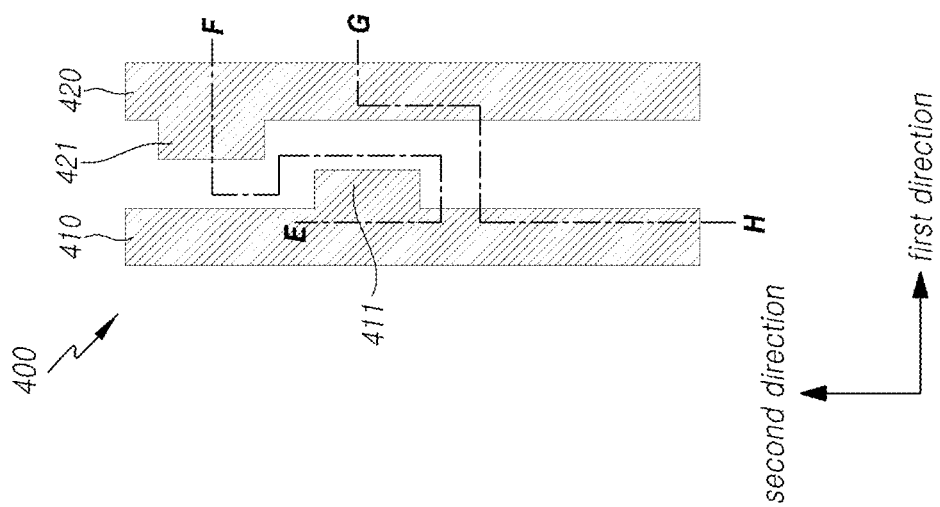

ELECTRONIC DEVICE

CROSS REFERENCE TO RELATED APPLICATION

This application claims priority from Korean Patent Application No. 10-2019-0082473, filed on Jul. 9, 2019, which is hereby incorporated by reference for all purposes as if fully set forth herein.

BACKGROUND

1. Technical Field

The present disclosure relates to an electronic device.

2. Discussion of the Related Art

With the development of information societies, demands for various electronic devices, such as display devices and light fixtures, are increasing in various forms. Such an electronic device may include a panel in which data lines and gate lines are disposed, a data driver for driving the data lines, and a gate driver for driving the gate lines.

In the panel which is the core of the electronic device, numerous transistors for various functions may be disposed to drive the panel.

For this reason, a panel manufacturing process is complicated and difficult to manage. Accordingly, pursuing the convenience of a process may cause degradation in the device performance of transistors.

Also, the degree of integration of transistors is increased to achieve excellent characteristics, such as high resolution, of an electronic device. However, due to the problems in a process and design, it is not possible to reduce the size of transistors limitlessly. Consequently, it is necessary to provide a transistor having a structure for providing an electronic device having high resolution without degrading characteristics of the transistor.

SUMMARY

Accordingly, embodiments of the present disclosure are directed to an electronic device that substantially obviates one or more of the problems due to limitations and disadvantages of the related art.

An aspect of the present disclosure is to provide an electronic device including at least one transistor having a structure which allows forming of a short channel and integration among a plurality of transistors disposed in a panel.

Another aspect of the present disclosure is to provide an electronic device including at least one transistor having a structure in which a driving margin is increased through a high subthreshold (S)-parameter among a plurality of transistors disposed in a panel.

Still another aspect of the present disclosure is to provide a thin film transistor (TFT) array substrate including a transistor having a structure which allows fabrication of an ultra-high definition panel with a reduction in device area and an electronic device including the TFT array substrate.

Yet another aspect of the present disclosure is to provide a TFT array substrate including a transistor having a structure in which an active layer and an insulating layer have no disconnection and an electronic device including the TFT array substrate.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, an electronic device including a panel and a driving circuit for driving the panel.

In the electronic device, a first transistor and a second transistor disposed in the panel may include a first electrode of the first transistor disposed on a substrate and a second electrode of the second transistor disposed apart from the first electrode, a first conductive layer on a first insulating layer disposed on the first electrode and the second electrode, a third insulating layer disposed on a second conductive layer on a second insulating layer, a first active layer of the first transistor and a second active layer of the second transistor disposed apart from each other on the third insulating layer, a fourth insulating layer disposed on the first and second active layers, and a first gate electrode of the first transistor and a second gate electrode of the second transistor disposed on the fourth insulating layer. The first to third insulating layers include a first hole exposing a part of an upper surface of the first electrode and a second hole exposing a part of an upper surface of the second electrode. The first active layer is disposed on a part of an upper surface of the third insulating layer and in the first hole and includes a first channel region having a length proportional to a thickness of the first to third insulating layers, and the second active layer is disposed on a part of the upper surface of the third insulating layer and the second hole and includes a second channel region having a length proportional to a thickness of the second and third insulating layers.

The electronic device may further include a third transistor. The third transistor may include a second conductive layer disposed on the second insulating layer, a third active layer disposed on the third insulating layer, the fourth insulating layer, and a fifth insulating layer, which are sequentially disposed on the second conductive layer, and including a third channel region, and the first conductive layer in contact with a third electrode, which is in contact with one end of the third active layer, and the other end of the third active layer. The third electrode may be disposed on the fourth insulating layer, and the first conductive layer may be disposed on the first insulating layer.

In accordance with another aspect of the present disclosure, there is provided an electronic device including at least one first transistor to which a data voltage is applied. The first transistor includes a first conductive layer disposed on a substrate and includes a first active layer disposed on the first conductive layer, having one end and the otherend made conductive, and including a first channel region disposed between the one end and the other end. A second conductive layer disposed to overlap the first conductive layer with a first insulating layer interposed between the second conductive layer and the first conductive layer is included in a storage capacitor in a panel, and the storage capacitor is disposed under the first channel region of the first active layer.

In the first transistor, the first insulating layer may be disposed on the first conductive layer, the second conductive layer may be disposed on the first insulating layer, a second insulating layer may be disposed on the second conductive layer, a first electrode may be disposed on the second insulating layer, and the one end of the first active layer may be in contact with the first electrode through a first hole provided in the second insulating layer.

The electronic device may further include a second transistor disposed in the panel and connected to a data line, and the second transistor may include a second electrode disposed on the substrate, a second active layer including a second channel region and disposed on an insulating layer, which is disposed on the second electrode and includes a third hole exposing a part of an upper surface of the second electrode, a first gate insulating layer disposed on the second active layer, and a first gate electrode disposed on the first gate insulating layer.

The electronic device may further include a third transistor connected to a reference voltage line, and the third transistor may include a third electrode disposed apart from the second electrode on the substrate, a third active layer including a third channel region and disposed on an insulating layer disposed on the third electrode and including a fifth hole exposing a part of an upper surface of the third electrode, a second gate insulating layer disposed on the third active layer, and a second gate electrode disposed on the second gate insulating layer.

In the first transistor, a fourth electrode may be disposed on the substrate, a fourth insulating layer may be disposed on the first electrode, the first conductive layer may be disposed on the fourth insulating layer, the first insulating layer may be disposed on the first conductive layer, the second conductive layer may be disposed on the first insulating layer, a fifth insulating layer may be disposed on the second conductive layer, the fourth insulating layer, the first insulating layer, and the fifth insulating layer may include a seventh hole exposing a part of an upper surface of the fourth electrode, and one end of the first active layer may be in contact with the fourth electrode through the seventh hole.

A second transistor may include a sixth electrode disposed on the substrate, a second active layer including a second channel region and disposed on an insulating layer disposed on the sixth electrode and including a ninth hole exposing a part of an upper surface of the sixth electrode, a second gate insulating layer disposed on the second active layer, and a first gate electrode disposed on the second gate insulating layer.

A third transistor may include a seventh electrode disposed apart from the sixth electrode on the substrate, a third active layer including a third channel region and disposed on an insulating layer disposed on the seventh electrode and including a tenth hole exposing a part of an upper surface of the seventh electrode, a first gate insulating layer disposed on the third active layer, and a second gate electrode disposed on the first gate insulating layer.

According to embodiments of the present disclosure, it is possible to provide a TFT array substrate including a transistor having a structure which allows forming of a short channel and integration and an electronic device including the TFT array substrate.

According to embodiments of the present disclosure, it is possible to provide a TFT array substrate including a transistor having a structure in which a driving margin is increased through a high S-parameter among a plurality of transistors disposed in a panel and an electronic device including the TFT array substrate.

According to embodiments of the present disclosure, it is possible to provide a TFT array substrate including a transistor having a structure which allows fabrication of an ultra-high definition panel with a reduction in device area and an electronic device including the TFT array substrate.

According to embodiments of the present disclosure, it is possible to provide a TFT array substrate including a transistor having a structure in which an active layer and an insulating layer have no disconnection and an electronic device including the TFT array substrate.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings:

FIG. 11 is a cross-sectional view illustrating another structure of a third transistor of the electronic device according to the embodiment of the present disclosure;

FIGS. 27 to 36 are diagrams schematically illustrating a method of fabricating the electronic device having the structure of FIGS. 12 to 14.

DETAILED DESCRIPTION

Figure 1:
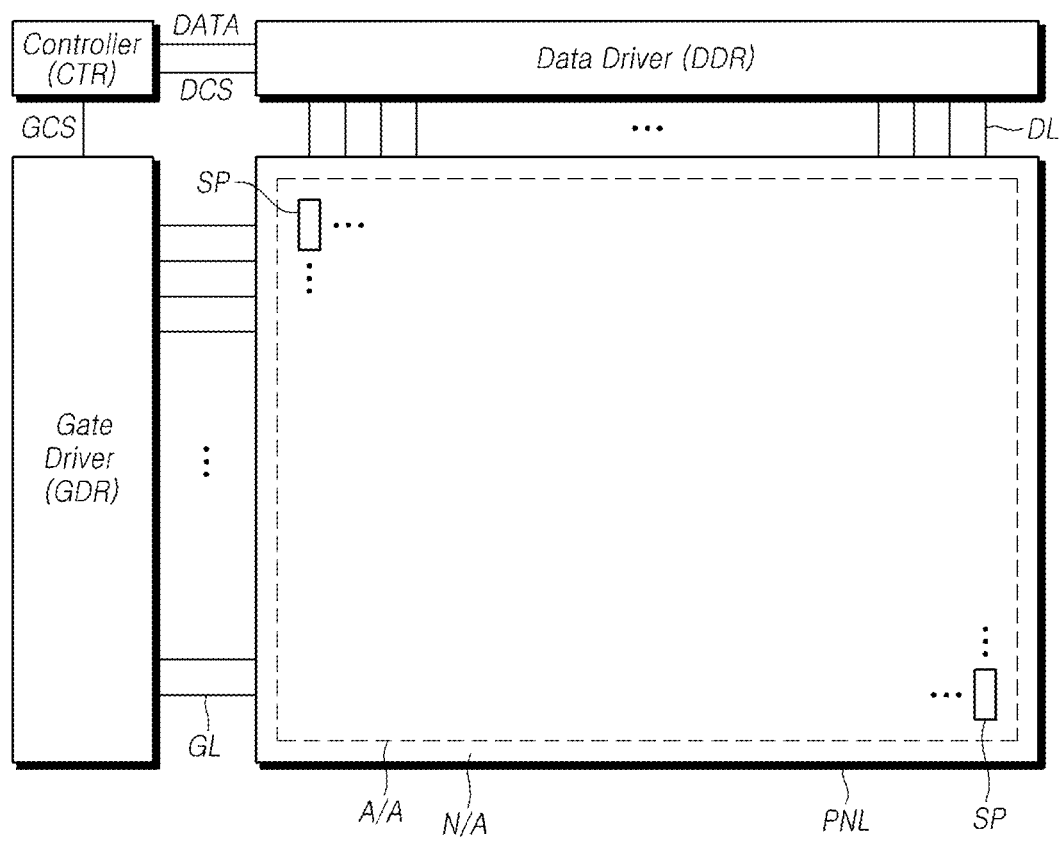
FIG. 1 is a diagram schematically illustrating a configuration of an electronic device according to embodiments of the present disclosure.

In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description may make the subject matter in some embodiments of the present invention rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present invention. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can."

Hereinafter, embodiments of the present disclosure will be described in detail with reference to the accompanying drawings.

FIG. 1 is a diagram schematically illustrating a configuration of an electronic device according to embodiments of the present disclosure.

The electronic device according to the embodiments of the present disclosure may include a display device, a light fixture, a light-emitting device, and the like. For convenience of description, the display device will be mainly described below. However, the present disclosure may be applied to various other electronic devices, such as a light fixture and a light-emitting device, in the same way as long as a transistor is included.

The electronic device according to the embodiments of the present disclosure may include a panel PNL for displaying an image or outputting light and a driving circuit for driving the panel PNL.

In the panel PNL, a plurality of data lines DL and a plurality of gate lines GL may be disposed, and a plurality of subpixels SP defined by the plurality of data lines DL and the plurality of gate lines GL may be arranged in a matrix form.

In the panel PNL, the plurality of data lines DL and the plurality of gate lines GL may be arranged to cross each other. For example, the plurality of gate lines GL may be arranged in rows or columns, and the plurality of data lines DL may be arranged in columns or rows. For convenience of description, it is assumed below that the plurality of gate lines GL are disposed in rows and the plurality of data lines DL are disposed in columns.

In the panel PNL, in addition to the plurality of data lines DL and the plurality of gate lines GL, other kinds of signal lines may be disposed according to a subpixel structure and the like. Driving voltage lines, reference voltage lines, common voltage lines, or the like may be additionally disposed.

The panel PNL may be one of various types of panels such as a liquid crystal display (LCD) panel and an organic light-emitting diode (OLED) panel.

The types of signal lines disposed in the panel PNL may vary depending on a subpixel structure, a panel type (e.g., an LCD panel or an OLED panel), and the like. In this specification, signal lines may include electrodes to which signals are applied.

The panel PNL may include an active region A/A in which a video (image) is displayed and a non-active region (N/A) which is an outer region of the active region A/A and does not display an image. The non-active region N/A may also be referred to as "bezel region."

In the active region A/A, a plurality of subpixels SP for video display are disposed.

In the non-active region N/A, a pad section to which a data driver DDR is electrically connected may be disposed, and a plurality of data link lines for connecting the pad section and the plurality of data lines DL may also be disposed. The plurality of data link lines may be parts of the plurality of data lines DL extending to the non-active region N/A or additional patterns electrically connected to the plurality of data lines DL.

In the non-active region N/A, gate driving-related lines may be disposed to transfer a voltage (a signal) required for gate driving to a gate driver GDR through the pad section to which data driver DDR is electrically connected. For example, the gate driving-related lines may include clock lines for transferring a clock signal, gate voltage lines for transferring gate voltages VGH and VGL, gate-driving control signal lines for transferring various control signals required for scan signal generation, and the like. These gate driving-related lines are disposed in the non-active region N/A unlike the gate lines GL disposed in the active region A/A.

The driving circuit may include the data driver DDR for driving the plurality of data lines DL, the gate driver GDR for driving the plurality of gate lines GL, a controller CTR for controlling the data driver DDR and the gate driver GDR, and the like.

The data driver DDR may drive the plurality of data lines DL by outputting data votlages to the plurality of data lines DL.

The gate driver GDR may drive the plurality of gate lines GL by outputting scan signals to the plurality of gate lines GL.

The controller CTR may control an operation of driving the data driver DDR and the gate driver GDR by supplying various control signals DCS and GCS required for the operation of driving the data driver DDR and the gate driver GDR. Also, the controller CTR may supply image data DATA to the data driver DDR The controller CTR begins scanning according to the timing of each frame, converts input image data, which is input from the outside of the electronic device, into a data signal format used in the data driver DDR to output converted image data DATA, and controls data driving at an appropriate time for scanning.

To control the data driver DDR and the gate driver GDR, the controller CTR receives timing signals, such as a vertical synchronization signal Vsync, a horizontal synchronization signal Hsync, an input data enable (DE) signal, and a clock signal CLK, from the outside (e.g., a host system) and generates and outputs various control signals to the data driver DDR and the gate driver GDR.

For example, to control the gate driver GDR, the controller CTR outputs various gate control signals (GCSs) including a gate start pulse (GSP), a gate shift clock (GSC), a gate output enable (GOE) signal, and the like.

Also, to control the data driver DDR, the controller CTR outputs various data control signals (DCSs) including a source start pulse (SSP), a source sampling clock (SSC), a source output enable (SOE) signal, and the like.

The controller CTR may be a timing controller used in general display technology or a control device which may perform other control functions in addition to those of a timing controller.

The controller CTR may be implemented as a component separate from the data driver DDR or integrated with the data driver DDR into an integrated circuit.

The data driver DDR receives the image data DATA from the controller CTR and supplies data voltages to the plurality of data lines DL and the plurality of gate lines GL, thereby driving the plurality of data lines DL. The data driver DDR is also referred to as "source driver."

The data driver DDR may exchange various signals with the controller CTR through various interfaces.

The gate driver GDR sequentially drives the plurality of gate lines GL by sequentially supplying scan signals to the plurality of gate lines GL. The gate driver GDR is also referred to as "scan driver."

The gate driver GDR sequentially supplies scan signals havng an on-voltage or an off-voltage to the gate lines GL under the control of the controller CTR.

When a specific gate line is activated by the gate driver GDR, the data driver DDR converts the image data DATA received from the controller CTR into analog data voltages and supplies the analog data voltages to the plurality of data lines DL.

The data driver DDR may be disposed on only one side (e.g., the upper side or the lower side) of the panel PNL or disposed on both sides (e.g., the upper side and the lower side) of the panel PNL according to a driving method, a panel design, etc. in some cases.

The gate driver GDR may be disposed on only one side (e.g., the left side or the right side) of the panel PNL or disposed on both sides (e.g., the left side and the right side) of the panel PNL according to a driving method, a panel design, etc. in some cases.

The data driver DDR may include one or more source driver integrated circuits SDIC.

Each of the source driver integrated circuits SDIC may include a shift register, a latch circuit, a digital-to-analog converter (DAC), an output buffer, and the like. The data driver DDR may further include one or more analog-to-digital converters (ADCs) in some cases.

Each of the source driver integrated circuits SDIC may be connected to a bonding pad of the panel PNL as a tape automated bonding (TAB) type or a chip-on-glass (COG) type or may be disposed directly on the panel PNL. In some cases, each of the source driver integrated circuits SDIC may be integrated with the panel PNL. Also, each of the source driver integrated circuits SDIC may be embodied in a chip-on-film (COF) type of source driver integrated circuit. In this case, each of the source driver integrated circuits SDIC may be mounted on a circuit film and connected to data lines DL in the panel PNL through the circuit film.

The gate driver GDR may include a plurality of gate driving circuits GDC. The plurality of gate driving circuits GDC may separately correspond to the plurality of gate lines GL.

Each of the gate driving circuits GDC may include a shift register, a level shifter, and the like.

Each of the gate driving circuits GDC may be connected to the bonding pad of the panel PNL as a TAB type or a COG type of gate driving circuit. Also, each of the gate driving circuits GDC may be embodied in a COF type of gate driving circuit. In some cases, each of the gate driving circuits GDC may be mounted on the circuit film and connected to gate lines GL in the panel PNL through the circuit film. Also, each of the gate driving circuits GDC may be embodied in a gate-in-panel (GIP) type of gate driving circuit and embedded in the panel PNL. In other words, each of the gate driving circuits GDC may be formed directly in the panel PNL.

Figure 2:
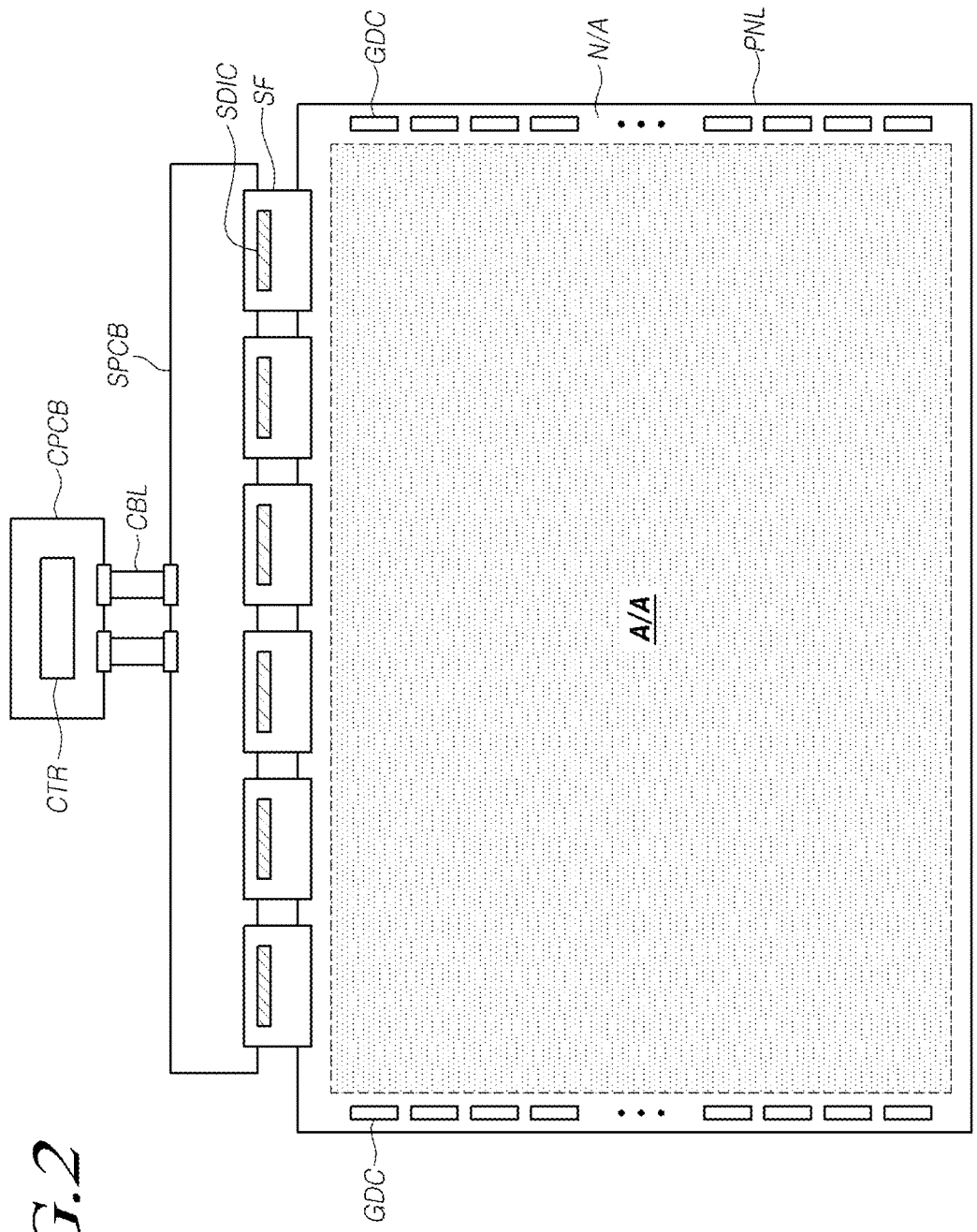
FIG. 2 shows an implementation example of an electronic device according to embodiments of the present disclosure.

FIG. 2 shows an implementation example of an electronic device according to embodiments of the present disclosure.

Referring to FIG. 2, in the electronic device according to the embodiments of the present disclosure, the data driver DDR may be embodied in a COF type of data driver among various types (TAB, COG, COF, etc.) of data drivers, and the gate driver GDR may be embodied in a GIP type of gate driver among various types (TAB, COG, COF, GIP, etc.) of gate drivers.

The data driver DDR may be implemented as one or more source driver integrated circuits SDIC. FIG. 2 shows an example in which the data driver DDR is implemented as a plurality of source driver integrated circuits SDIC.

When the data driver DDR is embodied in a COF type of data driver, each of the source driver integrated circuits SDIC embodying the data driver DDR may be mounted on source-side circuit films SF.

One sides of the source-side circuit films SF may be electrically connected to the pad section (a set of pads) present in the non-active region N/A.

On the source-side circuit films SF, lines may be disposed to electrically connect the source driver integrated circuits SDIC to the panel PNL.

For circuit connection between the plurality of source driver integrated circuits SDIC and other devices, the electronic device may include at least one source printed circuit board SPCB and a control printed circuit board CPCB for mounting control parts and various electrical devices.

The other sides of the source-side circuit films SF on which the source driver integrated circuits SDIC are mounted may be connected to the at least one source printed circuit board SPCB.

In other words, one sides of the source-side circuit films SF on which the source driver integrated circuits SDIC are mounted may be electrically connected to the non-active region N/A of the panel PNL, and the other sides thereof may be electrically connected to the source printed circuit board SPCB.

On the control printed circuit board CPCB, the controller CTR for controlling operation of the data driver DDR, the gate driver GDR, etc. may be disposed.

Also, a power management integrated circuit (IC) PMIC and the like may be additionally disposed on the control printed circuit board CPCB to supply various voltages or currents to the panel PNL, the data driver DDR, the gate driver GDR, etc. or control various voltages or currents to be supplied thereto.

The source printed circuit board SPCB and the control printed circuit board CPCB may be connected through at least one connecting member CBL in a circuit. For example, the connecting member CBL may be a flexible printed circuit (FPC), a flexible flat cable (FFC), or the like.

The at least one source printed circuit board SPCB and the control printed circuit board CPCB may be integrated into one printed circuit board.

When the gate driver GDR is embodied in a GIP type of gate driver, the plurality of gate driving circuits GDC included in the gate driver GDR may be formed directly on the non-active region N/A of the panel PNL.

Each of the plurality of gate driving circuits GDC may output a corresponding scan signal SCAN to a corresponding gate line GL disposed in the active region A/A of the panel PNL The plurality of gate driving circuits GDC disposed on the panel PNM may be supplied with various signals required for generating scan signals (a clock signal, a high-level gate voltage VGH, a low-level gate voltage VGL, a start signal VST, a reset signal RST, etc.) through the gate driving-related lines disposed in the non-active region N/A.

The gate driving-related lines disposed in the non-active region N/A may be electrically connected to source-side circuit films SF disposed closest to the plurality of gate driving circuits GDC.

Figure 3:
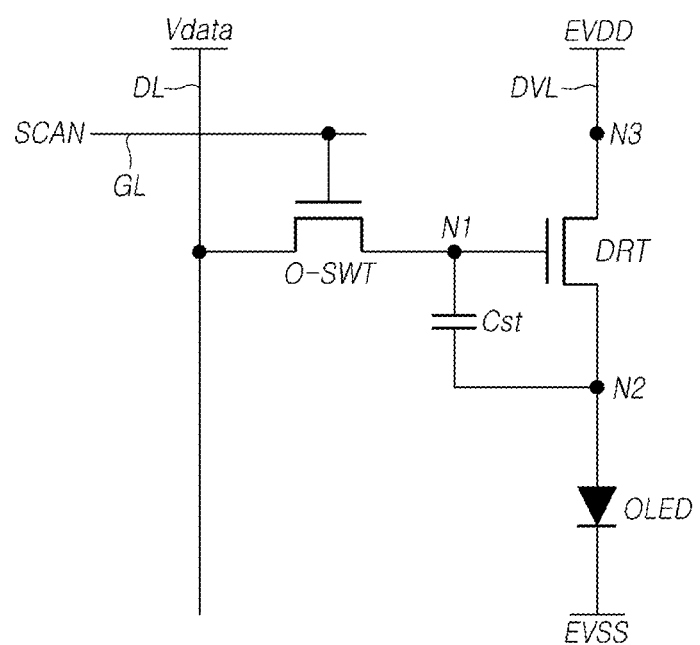
FIG. 3 shows a structure of a subpixel according to an embodiment of the present disclosure when a panel is an organic light-emitting diode (OLED) panel.

FIG. 3 shows a structure of a subpixel SP according to an embodiment of the present disclosure when the panel PNL is an OLED panel.

Referring to FIG. 3, in the panel PNL which is an OLED panel, each subpixel SP may include an organic light-emitting diode OLED, a driving transistor DRT for driving the organic light-emitting diode OLED, a switching transistor O-SWT electrically connected between a first node N1 of the driving transistor DRT and a corresponding data line DL, a storage capacitor Cst electrically connected beween the first node N1 and a second node N2 of the driving transistor DRT, and the like.

The organic light-emitting diode OLED may include an anode electrode, an organic light-emitting layer, a cathode electrode, and the like.

According to the circuit example of FIG. 3, the anode electrode (also referred to as "pixel electrode") of the organic light-emitting diode OLED may be electrically connected to the second node N2 of the driving transistor DRT. A base voltage EVSS may be applied to the cathode electrode (also referred to as "common electrode") of the organic light-emitting diode OLED.

The base voltage EVSS may be a ground voltage or a voltage higher or lower than the ground voltage. Also, the base voltage EVSS may vary depending on a driving state. For example, a base voltage EVSS for an image operation may be set differently from that for a sensing operation.

The driving transistor DRT drives the organic light-emitting diode OLED by supplying a driving current to the organic light-emitting diode OLED.

The driving transistor DRT may include the first node N1, the second node N2, a third node N3, and the like.

The first node N1 of the driving transistor DRT may be the gate node and may be electrically connected to the source node or the drain node of the switching transistor O-SWT. The second node N2 of the driving transistor DRT may be the source node or the drain node and electrically connected to the anode electrode (or the cathode electrode) of the organic light-emitting diode OLED. The third node N3 of the driving transistor DRT may be the drain node or the source node. A driving voltage EVDD may be applied to the third node N3, and the third node N3 may be electrically connected to a driving voltage line DVL which supplies the driving voltage EVDD.

The storage capacitor Cst may be electrically connected between the first node N1 and the second node N2 of the driving transistor DRT and maintain a data voltage Vdata corresponding to an image signal voltage or a voltage corresponding to the data voltage Vdata for one frame time.

The drain node or the source node of the switching transistor O-SWT may be electrically connected to the corresponding data line DL, the source node or the drain node of the switching transistor O-SWT may be electrically connected to the first node N1 of the driving transistor DRT, and the gate node of the switching transistor O-SWT may be electrically connected to a corresponding gate line and receive a scan signal SCAN.

The switching transistor O-SWT may receive the scan signal SCAN through the corresponding gate line so that turning the switching transistor O-SWT on or off may be controlled.

The switching transistor O-SWT may be turned on by the scan signal SCAN and transfer the data voltage Vdata supplied from the corresponding data line DL to the first node N1 of the driving transistor DRT.

Meanwhile, the storage capacitor Cst may be an external capacitor, which is intentionally designed outside the driving transistor DRT, rather than a parasitic capacitor (e.g., Cgs or Cgd), which is an internal capacitor present between the first node N1 and the second node N2 of the driving transistor DRT.

Each of the driving transistor DRT and the switching transistor O-SWT may be an n-type transistor or a p-type transistor.

The subpixel structure illustrated in FIG. 3 is a two-transistor one-capacitor (2T1C) structure and is only an example for description. Each subpixel structure may further include one or more transistors or further include one or more capacitors in some cases. Alternatively, each of the plurality of subpixels may have the same structure, or some of the plurality of subpixels may have another structure.

Figure 4:
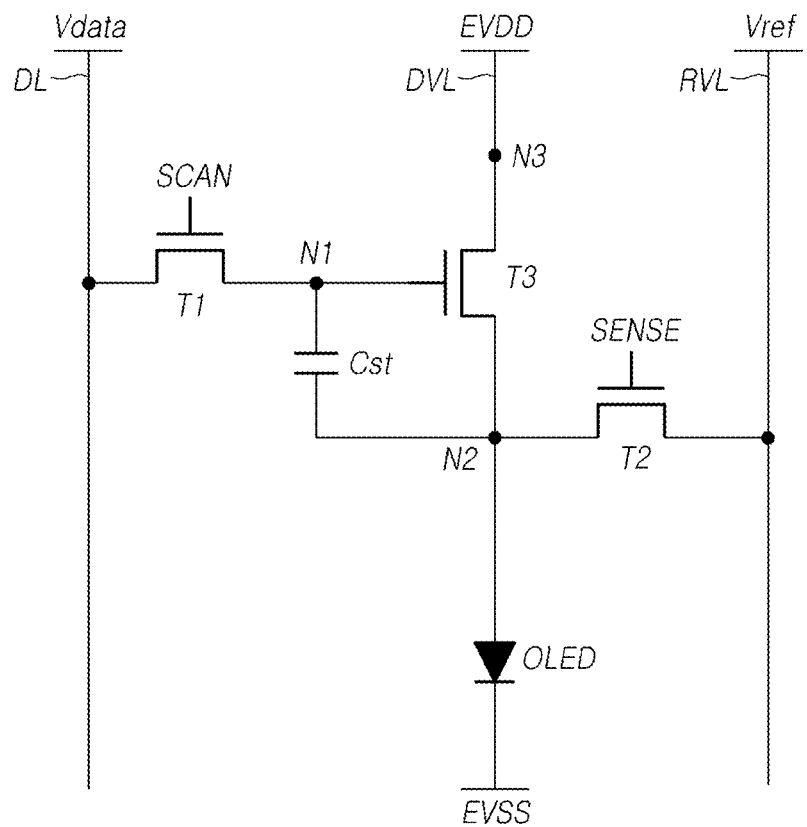
FIG. 4 shows an example of a three-transistor one-capacitor (3T1C) structure of one subpixel further including a second transistor electrically connected between a second node of a driving transistor and a reference voltage line.

FIG. 4 shows an example of a three-transistor one-capacitor (3T1C) structure of one subpixel SP further including a second transistor T2 electrically connected between a second node N2 of a driving transistor T3 and a reference voltage line RVL.

Referring to FIG. 4, the second transistor T2 may be electrically connected between the second node N2 of the driving transistor T3 and the reference voltage line RVL and receive a second scan signal SCAN2 through the gate node so that turning the second transistor T2 on or off may be controlled.

The drain node or the source node of the second transistor T2 may be electrically connected to the reference voltage line RVL, and the source node or the drain node of the second transistor T2 may be electrically connected to the second node N2 of the driving transistor T3.

For example, the second transistor T2 may be turned on during a display operation time period and turned on during a sensing operation time period for sensing a characteristic value of an organic light-emitting diode OLED.

The second transistor T2 may be turned on by the second scan signal SCAN2 according to a corresponding driving timing (e.g., a display driving timing or an initialization timing during a sensing operation time period) and transfer a reference voltage Vref supplied to the reference voltage line RVL to the second node N2 of the driving transistor T3.

Also, the second transistor T2 may be turned on by the second scan signal SCAN2 according to a corresponding driving timing (e.g., a sampling timing during a sensing operation time period) and transfer a voltage of the second node N2 of the driving transistor T3 to the reference voltage line RVL.

In other words, the second transistor T2 may control the voltage of the second node N2 of the driving transistor T3 or transfer the voltage of the second node N2 of the driving transistor T3 to the reference voltage line RVL.

The reference voltage line RVL may be electrically connected to an ADC which senses and converts the voltage of the reference voltage line RVL into a digital value and outputs sensing data including the digital value.

The ADC may be included in a source driver integrated circuit SDIC embodying the data driver DDR.

The sensing data output from the ADC may be used to sense a characteristic value (e.g., a threshold value and a mobility) of the driving transistor T3 or a characteristic value (e.g., a threshold value) of the organic light-emitting diode OLED.

Meanwhile, the capacitor Cst may be an external capacitor, which is intentionally designed outside the driving transistor T3, rather than a parasitic capacitor (e.g., Cgs or Cgd), which is an internal capacitor present between the first node N1 and the second node N2 of the driving transistor T3.

Each of the driving transistor T3, the first transistor T1, and the second transistor T2 may be an n-type transistor or a p-type transistor.

A first scan signal SCAN1 and the second scan signal SCAN2 may be separate gate signals. In this case, the first scan signal SCAN1 and the second scan signal SCAN2 may be applied to the gate node of the first transistor T1 and the gate node of the second transistor T2 through different gate lines, respectively.

In some cases, the first scan signal SCAN1 and the second scan signal SCAN2 may be identical gate signals. In this case, the first scan signal SCAN1 and the second scan signal SCAN2 may be applied in common to the gate node of the first transistor T1 and the gate node of the second transistor T2 through the same gate line.

The subpixel structures illustrated in FIGS. 3 and 4 are only examples for description. The subpixel structures may further include one or more transistors or further include one or more capacitors in some cases.

Alternatively, each of the plurality of subpixels may have the same structure, or some of the plurality of subpixels may have another structure.

Figure 5:
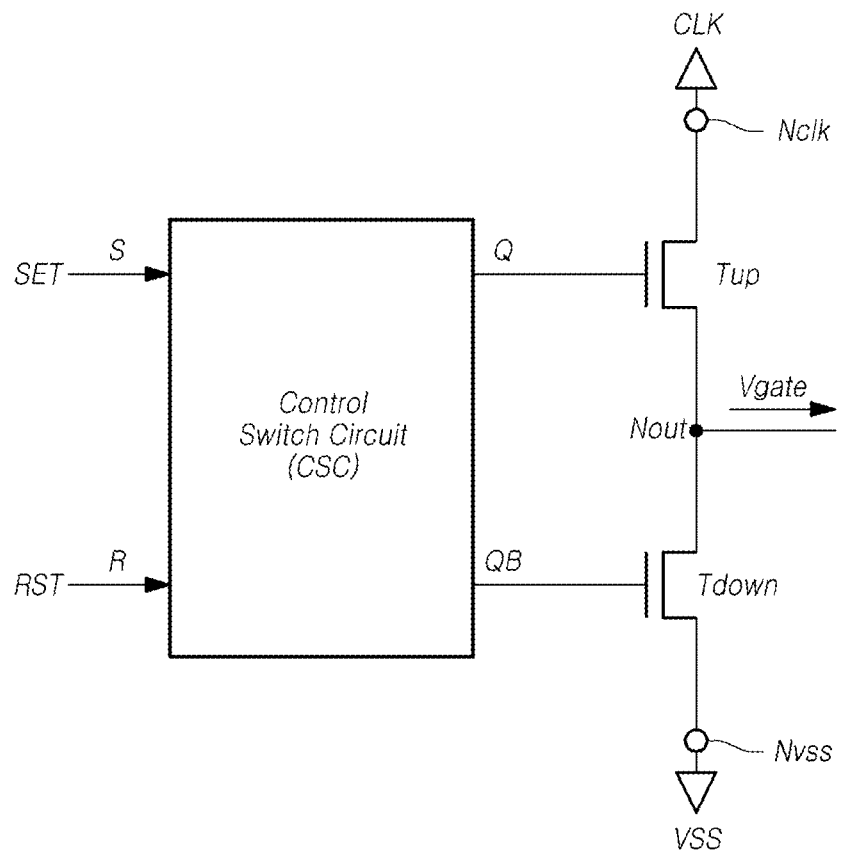
FIG. 5 is a diagram schematically illustrating a gate driving circuit disposed in a panel according to embodiments of the present disclosure.

FIG. 5 is a diagram schematically illustrating a gate driving circuit GDC disposed in the panel PNL according to embodiments of the present disclosure.

Referring to FIG. 5, each gate driving circuit GDC may include a pull-up transistor Tup, a pull-down transistor Tdown, a control switch circuit CSC, and the like.

The control switch circuit CSC is a circuit which controls the voltage of a node Q corresponding to the gate node of the pull-up transistor Tup and the voltage of a node QB corresponding to the gate node of the pull-down transistor Tdown and may include several switches (transistors).

The pull-up transistor Tup supplies a gate signal Vgate corresponding to a first level voltage (e.g., a high level voltage VGH) to a gate line GL through a gate signal output node Nout. The pull-down transistor Tdown supplies the gate signal Vgate corresponding to a second level voltage (e.g., a low level voltage VGL) to the gate line GL through the gate signal output node Nout. The pull-up transistor Tup and the pull-down transistor Tdown may be turned on at different timings.

The pull-up transistor Tup is electrically connected between a clock signal application node Nclk to which the clock signal CLK is applied and the gate signal output node Nout electrically connected to the gate line GL and is turned on or off by the voltage of the node Q.

The gate node of the pull-up transistor Tup is electrically connected to the node Q. The drain node or the source node of the pull-up transistor Tup is electrically connected to the clock signal application node Nclk. The source node or the drain node of the pull-up transistor is electrically connected to the gate signal output node Nout to which the gate signal Vgate is output.

The pull-up transistor Tup is turned on by the voltage of the node Q and outputs the gate signal Vgate, which has the high level voltage VGH in a high level period of the clock signal CLK, to the gate signal output node Nout.

The gate signal Vgate of the high level voltage output to the gate signal output node Nout is supplied to the corresponding gate line GL.

The pull-down transistor Tdown is electrically connected between the gate signal output node Nout and a base voltage node Nvss and turned on or off by the voltage of the node QB.

The gate node of the pull-down transistor Tdown is electrically connected to the node QB. The drain node or the source node of the pull-down transistor Tdown is electrically connected to the base voltage node Nvss, and a base voltage VSS corresponding to a constant voltage is applied to the drain node or the source node connected to the base voltage node Nvss. The source node or the drain node of the pull-down transistor Tdown is electrically connected to the gate signal output node Nout from which the gate signal Vgate is output.

The pull-down transistor Tdown is turned on by the voltage of the node QB and outputs the gate signal Vgate having the low level voltage VGL to the gate signal output node Nout. Accordingly, the gate signal Vgate having the low level voltage VGL may be supplied to the corresponding gate line GL through the gate signal output node Nout. For example, the gate signal Vgate having the low level voltage VGL may be the base voltage VSS.

Meanwhile, the control switch circuit CSC may include two or more transistors and the like, and main nodes, such as the node Q, the node QB, a set node S (also referred to as "start node"), and a reset node R, are included therein. In some cases, an input node to which various voltages, such as a driving voltage VDD, are applied may be additionally present in the control switch circuit CSC.

In the control switch circuit CSC, the node Q is electrically connected to the gate node of the pull-up transistor Tup and is repeatedly charged and discharged.

In the control switch circuit CSC, the node QB is electrically connected to the gate node of the pull-down transistor Tdown and is repeatedly charged and discharged.

In the control switch circuit CSC, a set signal SET for instructing the corresponding gate driving circuit GDC to start gate driving is applied to the set node S.

The set signal SET applied to the set node S may be a start signal VST input from the outside of the gate driver GDR or a feedback signal (a carry signal) of a gate signal Vgate output from a gate driving circuit GDC in a previous stage of the current gate driving circuit GDC.

A reset signal RST applied to the reset node R of the control switch circuit CSC may be a reset signal for simultaneously intializing gate driving circuits GDC in all stages or a carry signal input from another stage (a previous or following stage).

The control switch circuit CSC charges the node Q in response to the set signal SET and discharges the node Q in response to the reset signal RST. The control switch circuit CSC may include an inverter circuit to charge or discharge the node Q and the node QB at different timings.

As shown in FIG. 3, in each of the plurality of subpixels SP in the active region A/A of the panel PNL corresponding to an OLED panel, a driving transistor DRT and a switching transistor O-SWT may be disposed. However, the embodiments of the present disclosure are not limited thereto, and as shown in FIG. 4, three or more transistors may be disposed in the active region A/A of the panel PNL corresponding to an OLED panel.

Also, as shown in FIG. 2, when a gate driving circuit GDC is embodied in an INS1P type of gate driving circuit, that is, when the gate driving circuit GDC is embedded in the panel PNL, various transistors (Tup, Tdown, and transistors in the control switch circuit CSC) included in the gate driving circuit GDC as shown in FIG. 5 may be disposed in the non-active region N/A which is an outer region of the active region A/A of the panel PNL.

Figure 6:
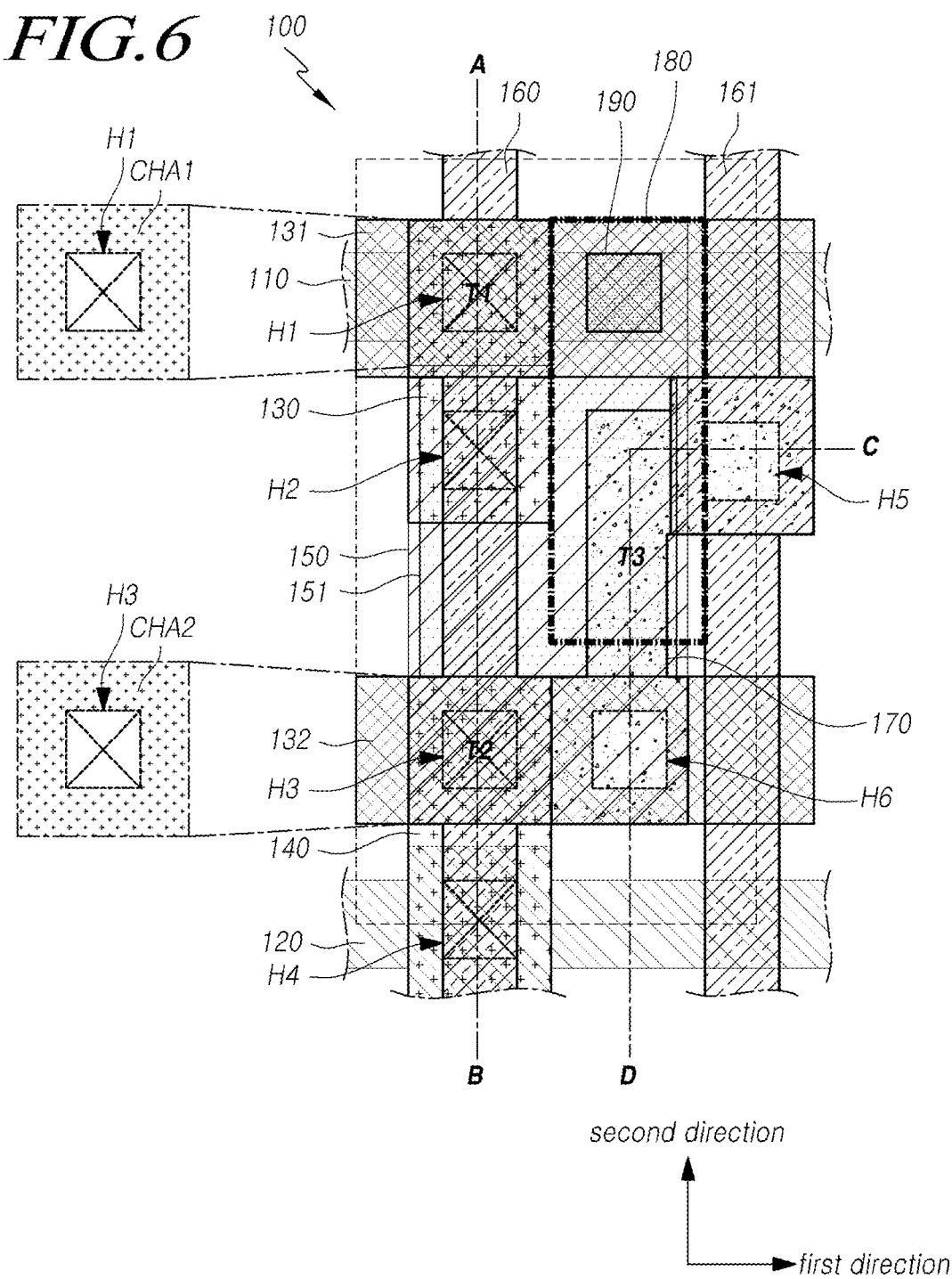
FIG. 6 is a plan view of a region in which transistors are disposed in an electronic device according to an embodiment of the present disclosure.
Figure 7:
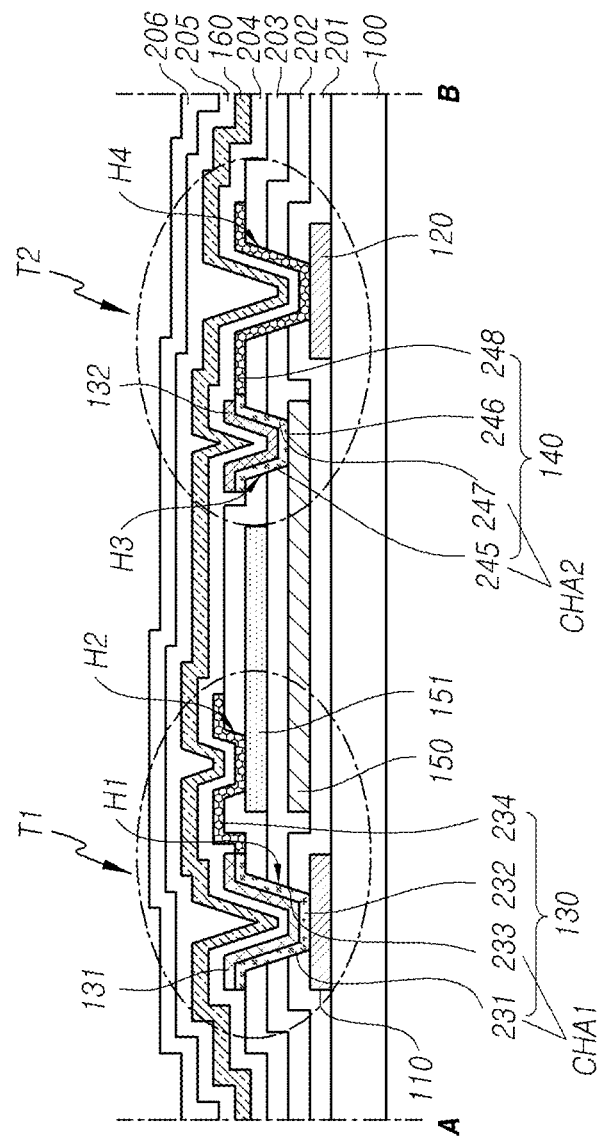
FIG. 7 is a cross-sectional view taken along line A-B of FIG. 6.
Figure 8:
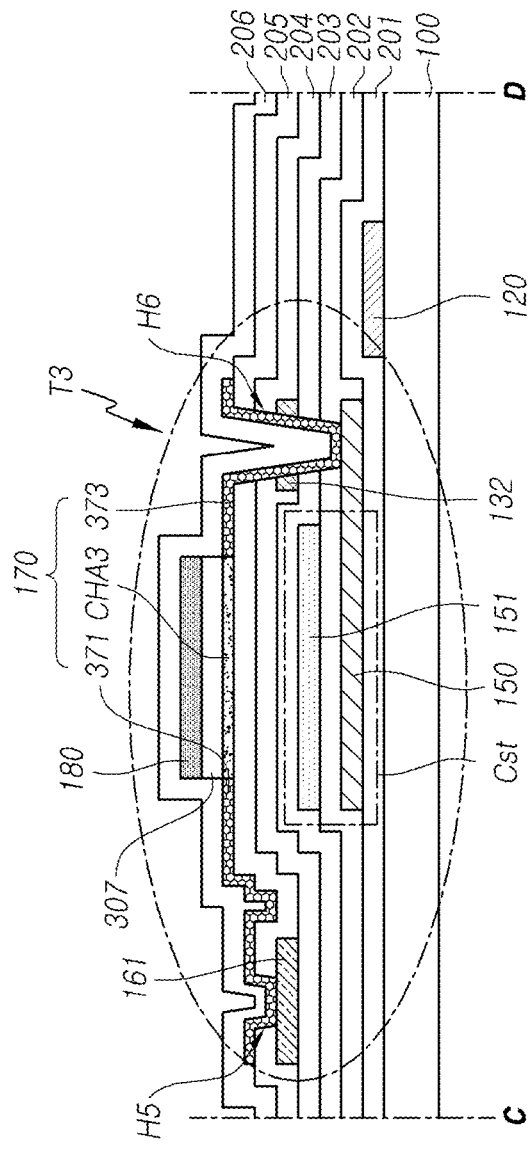
FIG. 8 is a cross-sectional view taken along line C-D of FIG. 6.

FIG. 6 is a plan view of a region in which transistors are disposed in an electronic device according to an embodiment of the present disclosure. FIG. 7 is a cross-sectional view taken along line A-B of FIG. 6. FIG. 8 is a cross-sectional view taken along line C-D of FIG. 6.

Referring to FIGS. 6 to 8, in a panel of the electronic device according to the embodiment of the present disclosure, a plurality of gate lines 160 and 161, a plurality of data lines 110, and a plurality of reference voltage lines 120 may be disposed.

The plurality of data lines 110 and the plurality of reference voltage lines 120 may extend in a first direction (e.g., a horizontal direction), and the plurality of gate lines 160 and 161 may extend in a second direction crossing the first direction (e.g., a vertical direction).

The electronic device according to the embodiment of the present disclosure may include one or more transistors T1, T2, and T3. Also, the electronic device may include at least one storage capacitor Cst.

For example, when the electronic device includes a panel, the circuit region of one subpixel may include the first transistor T1, the second transistor T2, and the third transistor T3 and also include the at least one storage capacitor Cst.

The first transistor T1 may include a first electrode 110, a first active layer 130, a second conductive layer 151, and a gate electrode 160.

The first electrode 110 may be disposed on a substrate 100. As shown in FIG. 7, the first electrode 110 of the first transistor T1 may correspond to a data line 110 extending in the second direction.

On the substrate 100 on which the first electrode 110 is disposed, a first insulating layer 201 is disposed. Although the first insulating layer 201 is shown as a single layer in FIGS. 7 and 8, the present disclosure is not limited thereto. For example, the first insulating layer 201 may be composed of a plurality of layers.

The first insulating layer 201 may include an inorganic insulating material. For example, the first insulating layer 201 may include any one of SiOx, SiNx, and SiON, but the present disclosure is not limited thereto.

The first insulating layer 201 may have a thickness of 200 nm to 700 nm, but the present disclosure is not limited thereto.

A first conductive layer 150 may be disposed on the first insulating layer 201.

The first conductive layer 150 may include any one of aluminum (Al), gold (Au), copper (Cu), titanium (Ti), tungsten (W), molybdenum (Mo), and an alloy thereof, but the present disclosure is not limited thereto.

As shown in FIG. 6, the first conductive layer 150 may have a plate shape in a plane view, but the present disclosure is not limited thereto. Also, the first conductive layer 150 may overlap any one of the data line 110 and a first reference voltage line 120 disposed in the same direction (the first direction) as the data line 110 extends.

A second insulating layer 202 may be disposed on the first conductive layer 150.

Although the second insulating layer 202 is shown as a single layer in FIGS. 7 and 8, the present disclosure is not limited thereto. For example, the second insulating layer 202 may be composed of a plurality of layers.

The second insulating layer 202 may include an inorganic insulating material. For example, the second insulating layer 202 may include any one of SiNx, SiON, and SiOx, but the present disclosure is not limited thereto.

The second insulating layer 202 may have a smaller thickness than the first insulating layer 201, but the present disclosure is not limited thereto. For example, the second insulating layer 202 may have a thickness of 100 nm or less.

The second conductive layer 151 may be disposed on the second insulating layer 202.

The second conductive layer 151 may be disposed to overlap the first conductive layer 150.

The second conductive layer 151 may include any one of aluminum (Al), gold (Au), copper (Cu), titanium (Ti), tungsten (W), molybdenum (Mo), and an alloy thereof, but the present disclosure is not limited thereto.

The second conductive layer 151 may overlap the first conductive layer 150 to constitute the storage capacitor Cst.

The area of the second conductive layer 151 may be smaller than that of the first conductive layer 150, but the present disclosure is not limited thereto.

A third insulating layer 203 may be disposed on the second conductive layer 151.

Although the third insulating layer 203 is shown as a single layer in FIGS. 7 and 8, the present disclosure is not limited thereto. For example, the third insulating layer 203 may be composed of a plurality of layers.

The third insulating layer 203 may include an inorganic insulating material. For example, the third insulating layer 203 may include any one of SiOx, SiNx, and SiON, but the present disclosure is not limited thereto.

The first insulating layer 201, the second insulating layer 202, and the third insulating layer 203 may have a first hole H1 which exposes a part of the upper surface of the first electrode 110.

The first active layer 130 of the first transistor T1 may be disposed on a part of the upper surface of the third insulating layer 203 and in the first hole H1.

The first active layer 130 may be formed of an amorphous silicon (a-Si) semiconductor. A transistor TR including the first active layer 130 is referred to as a-Si transistor.

As another example, the first active layer 130 may be formed of an oxide semiconductor. A transistor TR including the first active layer 130 is referred to as an oxide transistor. In this case, the oxide semiconductor may be an n-type oxide semiconductor, such as an indium gallium zinc oxide (IGZO), an indium zinc oxide (IZO), and an indium titanium zinc oxide (ITZO), or a p-type oxide semiconductor such as CuOx, SnOx, and NiOx.

The first active layer 130 may include first to fourth parts 231, 232, 233, and 234 which are integrally formed.

The first part 231 of the first active layer 130 is disposed on a part of the upper surface of the third insulating layer 203 and one side surface of each of the first to third insulating layers 201 to 203 in a region in which the first hole H1 is provided.

The second part 232 of the first active layer 130 may extend from the first part 231 and may be in contact with the upper surface of the first electrode 110 exposed through the first hole H1.

Meanwhile, when the first active layer 130 is formed of an oxide semiconductor, a metal (e.g., Ti) present in the first electrode 110 may absorb oxygen (O) included in the second part 232 of the first active layer 130 so that the second part 232 may have characteristics similar to those of a conductor.

Also, although not shown in the drawings, an insulating layer having a small thickness may be disposed between the second part 232 of the first active layer 130 and the first electrode 110 to reduce the contact resistance between the second part 232 and the first electrode 110.

When a metal and a semiconductor are in direct contact with each other, a high Schottky barrier is present therebetween, and thus the contact resistance increases. However, when a thin insulating layer is inserted (metal-insulator-semiconductor (MIS) contact) between the metal and the semiconductor, the direct contact between the metal and the semiconductor is avoided so that an increase in the contact resistance may be prevented.

Also, as for a second active layer 140 of the second transistor T2 to be described below, the contact resistance between the second active layer 140 and the first conductive layer 150 may be reduced in the same way as the contact resistance between the first active layer 130 and the first electrode 110.

The third part 233 of the first active layer 130 may extend from the second part 232 to a part of the upper surface of the third insulating layer 203 and may be disposed on the other side surface of each of the first to third insulating layers 201 to 203 in the region in which the first hole H1 is provided.

The fourth part 234 of the first active layer 130 may be a part extending from the third part 233, disposed on a part of the upper surface of the third insulating layer 203, and made conductive. In other words, the fourth part 234 of the first active layer 130 may have a higher electrical conductivity than the first to third parts 201 to 203 of the first active layer 130.

The fourth part 234 of the first active layer 130 may be in contact with a part of the upper surface of the second conductive layer 151 through a second hole H2 provided in the third insulating layer 203.

Specifically, as shown in FIGS. 6 and 7, the third insulating layer 203 may include the second hole H2 which exposes the part of the upper surface of the second conductive layer 151, and the fourth part 234 of the first active layer 130 may be disposed on the second conductive layer 151 in the second hole H2.

Each of the first electrode 110 and the second conductive layer 151 may serve as any one of the source electrode and the drain electrode of the first transistor T1. For example, the first electrode 110 may serve as the source electrode of the first transistor T1, and the second conductive layer 151 may serve as the drain electrode of the first transistor T1, but the present disclosure is not limited thereto. The first electrode 110 may serve as the drain electrode, and the second conductive layer 151 may serve as the source electrode.

The first electrode 110 may be the source electrode or the drain electrode of the first transistor T1 as well as the data line 110 disposed in the panel.

Likewise, the second conductive layer 151 may be the source electrode or the drain electrode of the first transistor T1 as well as an electrode of the storage capacitor Cst.

In the structure, the source electrode or the drain electrode of the first transistor T1 does not branch from a plurality of lines. Consequently, it is possible to reduce the area of the subpixels SP in the active region A/A by an area required for branching out into the source electrode and the drain electrode.

The first active layer 130 of the first transistor T1 may include a first channel region CHA1.

The first channel region CHA1 may be the first part 231 and the third part 233.

As shown in FIG. 6, the first channel region CHA1 may be disposed to surround the entrance of the first hole H1 in a plane view.

The first channel region CHA1 shown in FIG. 6 may be a region of the first part 231 of the first active layer 130 disposed on the upper surface of the third insulating layer 203 and a region of the third part 233 of the first active layer 130 disposed on the upper surface of the third insulating layer 203.

The first channel region CHA1 of the first active layer 130 may include a region which is not disposed parallel to the substrate 100 as shown in FIG. 7.

The first channel region CHA1 not disposed parallel to the substrate 100 may be a region in which the first part 231 is disposed on the one side surface of each of the first to third insulating layers 201 to 203 and a region in which the third part 233 is disposed on the other side surface of each of the first to third insulating layers 201 to 203.

The length of the first channel region CHA1 may be the sum of the length of the first part 231 and the length of the third part 233 of the first active layer 130.

Specifically, the length of the first part 231 and the third part 233 corresponding to a part of the first channel region CHA1 may be the sum of the lengths of regions of the first part 231 and the third part 233 disposed on the third insulating layer 203 (hereinafter, "first length") and the lengths of regions of the first part 231 and the third part 233 disposed on the side surfaces of the first to third insulating layers 201 to 203 in the first hole H1 (hereinafter, "second length").

The first length may be a length in a direction corresponding to cross-section line A-B, and the second length may be a length in a direction perpendicular to cross-section line A-B.

The length of the first channel region CHA1 may be proportional to the length of the first and third parts 231 and 233.

In another aspect, each of the first and third parts 231 and 233 of the first active layer 130 is disposed on the side surfaces of the first to third insulating layers 201 to 203. Consequently, the length of the first channel region CHA1 may be proportional to the sum of the thicknesses of the first to third insulating layers 201 to 203.

Meanwhile, to fabricate a high-resolution panel, it is necessary to reduce the size of subpixels SP present in the active region A/A.

To reduce the size of subpixels SP, the length of a channel region of a transistor disposed in the subpixels SP may be reduced. However, due to limitations of exposure equipment, it is difficult to reduce the length of a channel region.

Further, even when an active layer having a short channel is formed through exposure equipment, the channel regions of transistors TR formed in the panel PNL may have different lengths rather than the same length.

In the embodiment of the present disclosure, the length of the first channel region CHA1 of the first transistor T1 is proportional to the thickness of the first to third insulating layers 201 to 203.

In other words, in the first transistor T1 according to the embodiment of the present disclosure, the length of the first channel region CHA1 in the first active layer 130 is not determined through an exposure process or the like and may be adjusted only by adjusting the thickness of the first to third insulating layers 201 to 203.

The first transistor T1 including the first active layer 130 having the above-described structure may occupy a reduced area in the panel and thus can facilitate fabrication of a high-resolution panel.

A first gate insulating layer 131 may be disposed on the first active layer 130 of the first transistor T1.

As shown in FIG. 6, the first gate insulating layer 131 may overlap the first hole H1. Also, the first gate insulating layer 131 may extend in the direction in which the data line 110 extends.

The first gate insulating layer 131 may overlap the first to third parts 231 to 233 of the first active layer 130 as shown in FIG. 7. In another aspect, the first gate insulating layer 131 may be disposed to expose the fourth part 234 of the first active layer 130.

The first gate insulating layer 131 may prevent the first channel region CHA1 of the first active layer 130 from being made conductive in a process of making the fourth part 234 of the first active layer 130 conductive.

A fourth insulating layer 204 may be disposed on the substrate 100 on which the first gate insulating layer 131 is disposed.

Although the fourth insulating layer 204 is shown as a single layer in FIGS. 7 and 8, the present disclosure is not limited thereto. For example, the fourth insulating layer 204 may be composed of a plurality of layers.

The fourth insulating layer 204 may include an inorganic insulating material. For example, the fourth insulating layer 204 may include any one of SiOx, SiNx, and SiON, but the present disclosure is not limited thereto.

The first gate electrode 160 of the first transistor T1 may be disposed on the fourth insulating layer 204.

The first gate electrode 160 of the first transistor T1 may correspond to a first gate line 160 extending in the second direction.

In other words, in the structure, the first gate electrode 160 of the first transistor T1 does not branch from the first gate line 160. Consequently, an area required for branching out into the first gate electrode 160 may be omitted from the area of subpixels SP in the active region A/A.

A fifth insulating layer 205 and a sixth insulating layer 206 may be sequentially disposed on the first gate electrode 160.

Although the fifth and sixth insulating layers 205 and 206 are shown as single layers in FIGS. 7 and 8, the present disclosure is not limited thereto. For example, the fifth and sixth insulating layers 205 and 206 may be composed of a plurality of layers.

The fifth and sixth insulating layers 205 and 206 may include an inorganic insulating material. For example, the fifth and sixth insulating layers 205 and 206 may include any one of SiOx, SiNx, and SiON, but the present disclosure is not limited thereto.

Since the first channel region CHA1 in the first transistor T1 having the above structure includes a region which is not parallel to the substrate 100, the first active layer 130 may have a short channel region.

In this way, the size of subpixels SP can be reduced, and thus it can be easy to fabricate a high-resolution panel.

The first transistor T1 may be a switching transistor electrically connected to the data line 110.

The second transistor T2 may include a second electrode 120, the second active layer 140, the first conductive layer 150, and a second gate electrode 160.

The second electrode 120 of the second transistor T2 may be disposed on the substrate 100. The second electrode 120 may be disposed on the same layer as the first electrode 110 of the first transistor Ti and may be formed of the same material as that of the first electrode 110.

As shown in FIG. 6, the second electrode 120 of the second transistor T2 may correspond to the first reference voltage line 120 extending in the direction in which the data line 110 extends (the first direction).

The first insulating layer 201, the first conductive layer 150, the second insulating layer 202, and the third insulating layer 203 may be sequentially disposed on the substrate 100 on which the second electrode 120 is disposed.

A fourth hole H4 which exposes a part of the upper surface of the second electrode 120 may be provided in the second insulating layer 202 and the third insulating layer 203.

The second active layer 140 of the second transistor T2 may be disposed on a part of the upper surface of the third insulating layer 203 and in a third hole H3.

The second active layer 140 may be formed of an a-Si semiconductor or an oxide semiconductor, but the present disclosure is not limited thereto.

The second active layer 140 may include fifth to eighth parts 245 to 248 which are integrally formed.

The fifth part 245 of the second active layer 140 may be disposed on a part of the upper surface of the third insulating layer 203 and one side surface of each of the second and third insulating layers 202 and 203 in a region in which the third hole H3 is provided.

The sixth part 246 of the second active layer 140 may extend from the fifth part 245 and may be in contact with the upper surface of the first conductive layer 150 exposed through the third hole H3.

The seventh part 247 of the second active layer 140 may extend from the sixth part 246 to a part of the upper surface of the third insulating layer 203 and may be disposed on the other side surface of each of the second and third insulating layers 202 and 203 in the region in which the third hole H3 is provided.

The eighth part 248 of the second active layer 140 may be a part extending from the seventh part 247, disposed on a part of the upper surface of the third insulating layer 203, and made conductive.

The eigth part 248 of the second active layer 140 may be in contact with a part of the upper surface of the second electrode 120 through the fourth hole H4 provided in the first to third insulating layers 201 to 203.

Specifically, as shown in FIGS. 6 and 7, the first to third insulating layers 201 to 203 may include the fourth hole H4 which exposes the part of the upper surface of the second electrode 120, and the eighth part 248 of the second active layer 140 may be disposed on the second electrode 120 in the fourth hole H4.

Each of the second electrode 120 and the first conductive layer 150 may serve as any one of the source electrode and the drain electrode of the second transistor T2. For example, the second electrode 120 may serve as the source electrode of the second transistor T2, and the first conductive layer 150 may serve as the drain electrode of the second transistor T2, but the present disclosure is not limited thereto. The second electrode 120 may serve as the drain electrode, and the first conductive layer 150 may serve as the source electrode.

The second electrode 120 may be the source electrode or the drain electrode of the second transistor T2 as well as the reference voltage line 120 disposed in the panel.

Likewise, the first conductive layer 150 may be the source electrode or the drain electrode of the second transistor T2 as well as an electrode of the storage capacitor Cst.

As such, in the structure, the source electrode or the drain electrode of the first transistor T1 does not branch from a plurality of lines. Consequently, it is possible to reduce the area of the subpixels SP in the active region A/A by an area required for branching out into the source electrode and the drain electrode.

The second active layer 140 of the second transistor T2 may include a second channel region CHA2.

The second channel region CHA2 may be the fifth part 245 and the seventh part 247.

As shown in FIG. 6, the second channel region CHA2 may be disposed to surround the entrance of third first hole H2 in a plane view.

The second channel region CHA2 shown in FIG. 6 may be a region of the fifth part 245 of the second active layer 140 disposed on the upper surface of the third insulating layer 203 and a region of the seventh part 247 of the second active layer 140 disposed on the upper surface of the third insulating layer 203.

The second channel region CHA2 of the second active layer 140 may include a region which is not disposed parallel to the substrate 100 as shown in FIG. 7.

Due to the above-described structure of the second channel region CHA2, the second channel region CHA2 in the second active layer 140 may have a short length.

For this reason, the area of the second transistor T2 including the second active layer 140 can be reduced, and the size of subpixels SP in which the second transistor T2 is disposed can also be reduced. Consequently, it can be easy to fabricate a high-resolution panel.

The second channel region CHA2 not disposed parallel to the substrate 100 may be a region in which the fifth part 245 is disposed on the one side surface of each of the second and third insulating layers 202 and 203 and a region in which the seventh part 247 is disposed on the other side surface of each of the second and third insulating layers 202 and 203.

The length of the second channel region CHA2 may be the sum of the length of the fifth part 245 and the length of the seventh part 247 of the second active layer 140.

Specifically, the length of the fifth part 245 corresponding to a part of the second channel region CHA2 may be the sum of the length of the part of the third insulating layer 203 on which the fifth part 245 is disposed (hereinafter, "third length") and the lengths of the one side surface of each of the second and third insulating layers 202 and 203 on which the fifth part 245 is disposed in the third hole H3 (hereinafter, "fourth length").

The third length may be a length in the direction corresponding to cross-section line A-B, and the fourth length may be a length in the direction perpendicular to cross-section line A-B.

The length of the second channel region CHA2 may be proportional to the length of the fifth and seventh parts 245 and 247.

In another aspect, each of the fifth and seventh parts 245 and 247 of the second active layer 140 is disposed on the side surfaces of the second and third insulating layers 202 and 203. Consequently, the length of the second channel region CHA2 may be proportional to the sum of the thicknesses of the second and third insulating layers 202 and 203.

In the second transistor T2 according to the embodiment of the present disclosure, the length of the second channel region CHA2 can be adjusted only by adjusting the length of the second and third insulating layers 202 and 203.

Also, in the first and second transistors T1 and T2 present in one subpixel SP, the channel regions of the first and second active layers 130 and 140 may have different lengths.

As described above, the length of the first channel region CHA1 of the first active layer 130 is proportional to the thickness of the first to third insulating layers 201 to 203, and the length of the second channel region CHA2 of the second active layer 140 is proportional to the thickness of the second and third insulating layers 202 and 203. Therefore, the first channel region CHA1 may have a greater length than the second channel region CHA2.

For example, the length of the first channel region CHA1 may be greater than the length of the second channel region CHA2 by two times the thickness of the first insulating layer 201.

In other words, in the electronic device according to the embodiment of the present disclosure, the length of a channel region in each transistor may be adjusted by considering performance of transistors disposed in one subpixel SP, and the length of a channel region may be adjusted through the thickness of an insulating layer rather than an exposure process. Consequently, the process is simplified, and the length of a channel region may be reliably obtained.

A second gate insulating layer 132 may be disposed on the second active layer 140 of the second transistor T2.

As shown in FIG. 6, the second gate insulating layer 132 may overlap the third hole H3. Also, the second gate insulating layer 132 may extend in the direction in which the reference voltage line 120 extends.

The second gate insulating layer 132 may overlap the fifth to seventh parts 245 to 247 of the second active layer 140 as shown in FIG. 7. In another aspect, the second gate insulating layer 132 may be disposed to expose the eighth part 248 of the second active layer 140.

The second gate insulating layer 132 may prevent the second channel region CHA2 of the second active layer 140 from being made conductive in a process of making the eighth part 248 of the second active layer 140 conductive.

Meanwhile, although FIGS. 6 and 7 show a structure in which the second gate insulating layer 132 is disposed, the present disclosure is not limited thereto, and the second gate insulating layer 132 may not be present.

The fourth insulating layer 204 may be disposed on the substrate 100 on which the second gate insulating layer 132 is disposed.

The second gate electrode 160 of the second transistor T2 may be disposed on the fourth insulating layer 204.

The fifth insulating layer 205 and the sixth insulating layer 206 may be sequentially disposed on the second gate electrode 160.

The second gate electrode 160 of the second transistor T2 may correspond to the first gate line 160.

In another aspect, the second gate electrode 160 of the second transistor T2 may be integrated with the first gate electrode 160 of the first transistor T1. In other words, the second gate electrode 160 of the second transistor T2 and the first gate electrode 160 of the first transistor T1 may correspond to the single first gate line 160.

Specifically, as shown in FIG. 6, the first gate line 160 extends in the second direction and thus may be used as the common gate electrode 160 of the first and second transistors T1 and T2.

According to the embodiment of the present disclosure, in the structure, the first gate electrode 160 of the first transistor T1 and the second gate electrode 160 of the second transistor T2 do not branch from the first gate line 160. Consequently, it is possible to reduce the area of subpixels SP in the active region A/A by an area required for branching out into the first and second gate electrodes 160.

In other words, since the single first gate line 160 can serve as the gate electrodes 160 of the two transistors, it is unnecessary to separately form the gate electrodes of the transistors.

The second transistor T2 may be a sensing transistor electrically connected to the reference voltage line 120.

Meanwhile, FIG. 7 shows the first to fourth holes H1 to H4 having a tapered shape in the cross-sectional structure of the first to fourth holes H1 to H4, but the present disclosure is not limited thereto.

Figure 9:
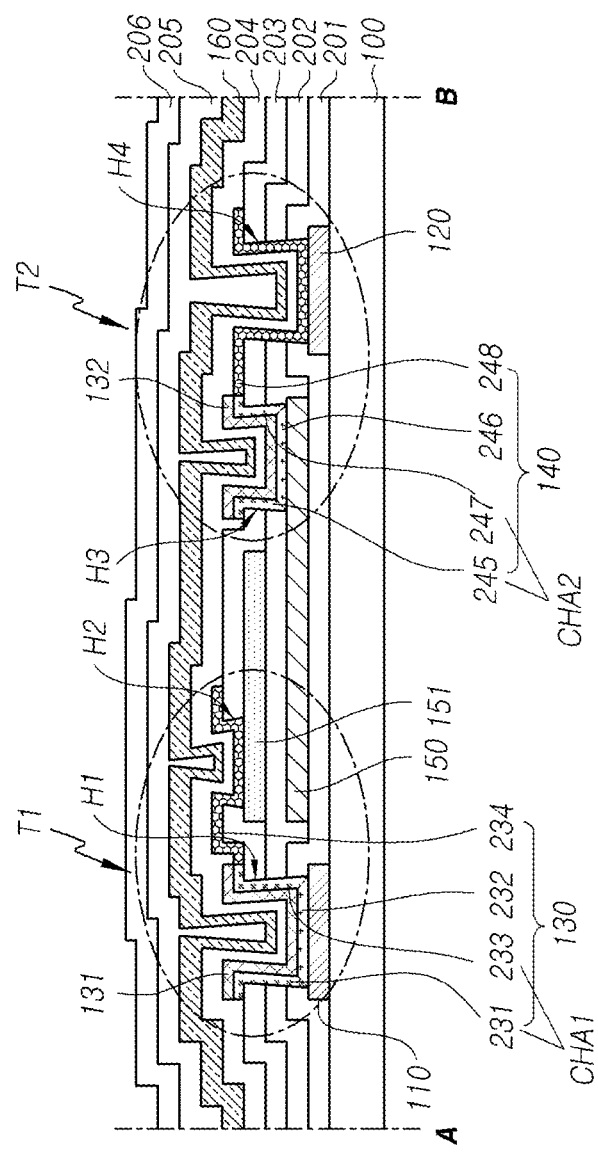
FIG. 9 is a cross-sectional view of an electronic device according to another embodiment of the present disclosure.

FIG. 9 is a cross-sectional view of an electronic device according to another embodiment of the present disclosure.

As shown in FIG. 9, the cross-sectional structure of first to fourth holes H1 to H4 may have an inverted tapered shape.

Meanwhile, although not shown in the drawing, side surfaces of the first to fourth holes H1 to H4 may be perpendicular to the horizontal plane in the cross-sectional structure of the first to fourth holes H1 to H4.

As shown in FIGS. 7 and 9, when the shapes of the first to fourth holes H1 to H4 valy, the area of the first active layer 130 in contact with the first electrode 110 may be changed, and the length of the first channel region CHA1 may also be changed.

Also, the area of the second active layer 140 in contact with the first conductive layer 150 may be changed, and the length of the second channel region CHA2 may be changed. Further, the areas of the fourth part 234 of the first active layer 130 and the eighth part 248 of the second active layer 140 respectively in contact with the second conductive layer 151 and the second electrode 120 may be changed.

In other words, it is possible to adjust the lengths of the channel regions CHA1 and CHA2 in the first and second transistors T1 and T2 or the areas of the first and second active layers 130 and 140 in contact with the electrodes or the conductive layers by modifying the shapes of the first to fourth holes H1 to H4.

The structure of FIG. 9 may be applied to all of embodiments described below.

The relationship between the shape of a hole and the length of an active layer will be described in detail below with reference to FIG. 10A.

Figure 10A:
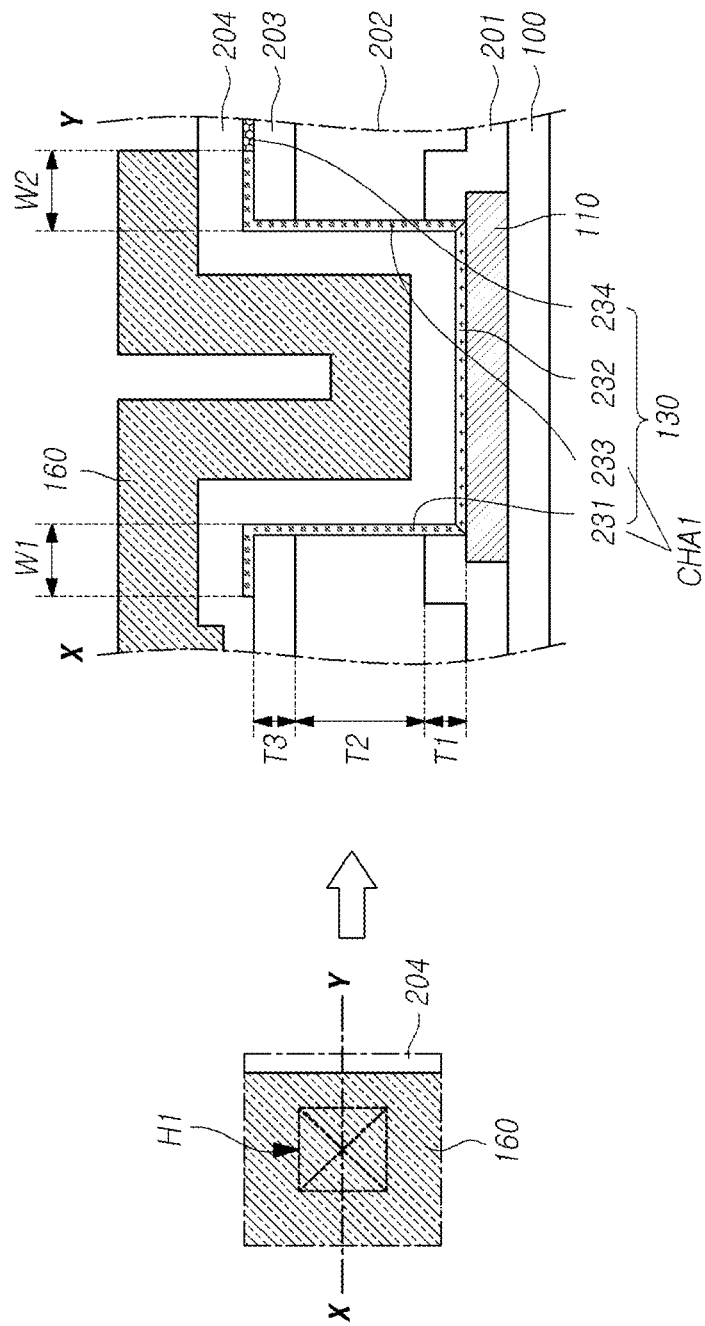
FIG. 10A is a diagram illustrating a structure of a first hole and a first transistor.

FIG. 10A is a diagram illustrating a structure of a first hole and a first transistor.

Referring to FIG. 10A, the first active layer 130 of the first transistor T1 may include the first channel region CHA1.

The first channel region CHA1 may be the first part 231 and the third part 233.

The first channel region CHA1 may be disposed to surround the entrance of the first hole H1 in a plane view.

The first channel region CHA1 may be a region of the first part 231 of the first active layer 130 disposed on the upper surface of the third insulating layer 203 and a region of the third part 233 of the first active layer 130 disposed on the upper surface of the third insulating layer 203.

The length of the first channel region CHA1 may be the sum of the length of the first part 231 and the length of the third part 233 of the first active layer 130.

The length of the first part 231 of the first active layer 130 may be the sum of a thickness T1 of the first insulating layer 201, a thickness T2 of the second insulating layer 202, a thickness T3 of the third insulating layer 203, and a width W1 of the first part 231 from a region of the first part 231 disposed on a side surface of the third insulating layer 203 to a region of the first part 231 extending to the upper surface of the third insulating layer 203.

Also, the length of the third part 233 of the first active layer 130 may be the sum of the thickness T1 of the first insulating layer 201, the thickness T2 of the second insulating layer 202, the thickness T3 of the third insulating layer 203, and a width W2 of the first part 231 from a region of the third part 233 disposed on another side surface of the third insulating layer 203 to a region of the third part 233 extending to the upper surface of the third insulating layer 203.

Meanwhile, a transistor has a characteristic that a current is proportional to the width of a hole and inversely proportional to the length of a channel.

In the case of a high-resolution panel, the area of subpixels SP is reduced, and widths W of a plurality of holes disposed in the subpixels SP may also be reduced accordingly.

Since the current characteristic of transistors may be degraded in the high-resolution panel due to the reduction in the widths W of holes, channels may be formed with short lengths to ensure the current characteristic of the transistors.

According to the embodiment of the present disclosure, the length of the first channel region CHA1 may be adjusted through the thickness of the first to third insulating layers 201 to 203.

In other words, according to the embodiment of the present disclosure, the length of the first channel region CHA1 may be shortened by forming the first to third insulating layers 201 to 203 to be thin.

Also, the length of the first channel region CHA1 disposed on the first to third insulating layers 201 to 203 in the first hole H1 may be adjusted by adjusting an angle Z between the substrate 100 and the first to third insulating layers 201 to 203. In this way, the length of the first channel region CHA1 may be adjusted to be applicable to a high-resolution panel.

Although FIG. 10A shows a structure in which the first active layer 130 including the first channel region CHA1 has a single layer, the present disclosure is not limited thereto. For example, the first active layer 130 may have two or more layers.

A structure of a first active layer according to another embodiment of the present disclosure will be described below with reference to FIG. 10B.

Figure 10B:
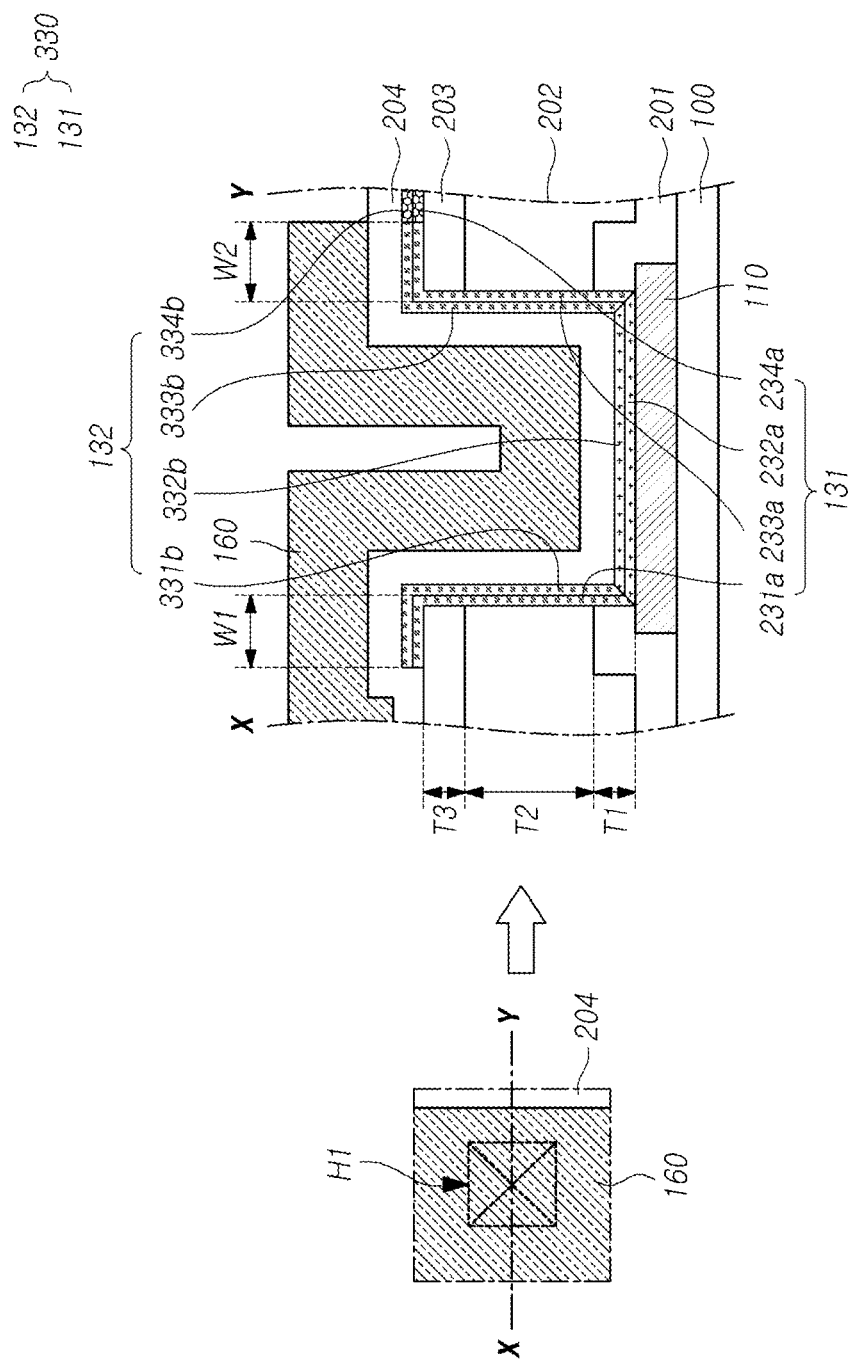
FIG. 10B is a diagram illustrating another structure of a first active layer of the first transistor.

FIG. 10B is a diagram illustrating another structure of a first active layer of the first transistor.

In the following description, details (a configuration, effects, etc.) which are the same as those of the above-described embodiments may be omitted.

Referring to FIG. 10B, a first active layer 330 of the first transistor T1 may include a first layer 131 disposed on the first to third insulating layers 201 to 203 and a second layer 132 disposed on the first layer 131.

The first layer 131 of the first active layer 330 may have the same structure as the first active layer 130 shown in FIG. 10A, but the present disclosure is not limited thereto.

The first layer 131 and the second layer 132 of the first active layer 330 of FIG. 10B may be oxide semiconductors. For example, the first layer 131 and the second layer 132 may include oxygen (O) and at least one of indium (In), gallium (Ga), zinc (Zn), titanium (Ti), and tin (Sn).

The first layer 131 of the first active layer 330 may include a first part 231a disposed on a part of the upper surface of the third insulating layer 203 and one side surface of each of the first to third insulating layers 201 to 203 in a region in which the first hole H1 is provided, a second part 232a extending from the first part 231a to be in contact with the upper surface of the first electrode 110, a third part 233a extending from the second part 232a to a part of the upper surface of the third insulating layer 203 and disposed on the other side surface of each of the first to third insulating layers 201 to 203, and a fourth part 234a extending from the third part 233a and disposed on a part of the upper surface of the third insulating layer 203.

Also, the second layer 132 of the first active layer 330 may include a first region 331b overlapping the first part 231a of the first layer 131, a second region 332b overlapping the second part 232a of the first layer 131, a third region 333b overlapping the third part 233a of the first layer 131, and a fourth region 334b overlapping the fourth part 2334a of the first layer 131.

The first layer 131 and the second layer 132 of the first active layer 330 may be oxide semiconductors. For example, the first layer 131 and the second layer 132 may include oxygen (O) and at least one of indium (In), gallium (Ga), zinc (Zn), titanium (Ti), and tin (Sn).

The content of elements included in the first layer 131 of the first active layer 330 may differ from the content of elements included in the second layer 132.

For example, the content of gallium (Ga) included in the first layer 131 of the first active layer 330 may be higher than the content of gallium (Ga) included in the second layer 132 of the first active layer 330. Also, the content of tin (Sn) included in the first layer 131 of the first active layer 330 may be higher than the content of tin (Sn) included in the second layer 132 of the first active layer 330. In other words, the content of gallium (Ga) and tin (Sn) included in the first active layer 330 may increase farther apart from the gate electrode 160.

A main channel region of the first active layer 330 having the above structure may be the first part 231a and the third part 233a of the first layer 131 or the first region 331b and the third region 333b of the second layer 132.

For example, as shown in FIG. 10B, when the gate electrode 160 of the first transistor T1 is disposed on the first active layer 330, the main channel region of the first active layer 330 may be the first region 331b and the third region 333b of the second layer 132 of the second layer 132.

The embodiments of the present disclosure are not limited thereto, and when the gate electrode 160 of the first transistor T1 is disposed under the first active layer 330, the main channel region of the first active layer 330 may be the first part 231a and the third part 233a of the first layer 131.

In other words, according to the embodiment of the present disclosure, the position of the main channel region of the first active layer 330 may be changed depending on the position of the gate electrode 160 of the first transistor T1.

When the first active layer 330 has two or more layers as described above, it is possible to prevent characteristics of the first transistor T1 from being degraded by degradation of the uniformity of layer formation. In other words, since the first active layer 330 has two or more layers, the reliability of the first active layer 330 can be improved.

Although a structure in which the first active layer 330 of the first transistor T1 has two or more layers has been described in FIG. 10B, the present disclosure is not limited thereto. For example, a second active layer 340 of the second transistor T2 may also have two or more layers.

Meanwhile, as shown in FIGS. 6 and 8, the third transistor T3 may be further disposed in the single subpixel SP.

The third transistor T3 may include a third electrode 161, the second conductive layer 151, and a third active layer 170.

The first insulating layer 201 may be disposed on the substrate 100. Also, the reference voltage line 120 may be disposed on the substrate 100 in the cross-sectional view taken along line C-D of FIG. 6, and the first insulating layer 201 may be disposed on the reference voltage line 120.

The first conductive layer 150 may be disposed on the first insulating layer 201.

The second insulating layer 202 may be disposed on the first conductive layer 150.

The second conductive layer 151, which overlaps the first conductive layer 150 to form the storage capacitor Cst, may be disposed on the second insulating layer 202. The second conductive layer 151 may be disposed below the third active layer 170 and serve as the gate electrode of the third transistor T3.

The third insulating layer 203 may be disposed on the second conductive layer 151.

The second gate insulating layer 132 may be disposed on the third insulating layer 203. The second gate insulating layer 132 may be disposed to overlap a part of the first conductive layer 150.

The fourth insulating layer 204 may be disposed on the second gate insulating layer 132.

The third electrode 161 of the third transistor T3 may be disposed on the fourth insulating layer 204. The third electrode 161 may be disposed in the same layer as the gate electrode 160, which is a common gate electrode of the first and second transistors T1 and T2, and formed of the same material as that of the gate electrode 160.

Also, as shown in FIG. 6, the third electrode 161 of the third transistor T3 may correspond to the second gate line 161 which is disposed parallel to the first gate line 160.

The fifth insulating layer 205 may be disposed on the third electrode 161.

The third active layer 170 of the third transistor T3 may be disposed on the fifth insulating layer 205.

The third active layer 170 may be formed of an a-Si semiconductor or an oxide semiconductor, but the present disclosure is not limited thereto.

One end 371 of the third active layer 170 may be in contact with the third electrode 161 through a fifth hole H5 provided in the fifth insulating layer 205. Another end 373 of the third active layer 170 may be in contact with the first conductive layer 150 through a sixth hole H6 provided in the second to fifth insulating layers 202 to 205 and the second gate insulating layer 132.

Specifically, as shown in FIGS. 6 and 8, the fifth insulating layer 205 has the fifth hole H5 which exposes a part of the upper surface of the third electrode 161, and the one end 371 of the third active layer 170 may be disposed on the third electrode 161 in the fifth hole H5.

Also, the second to fifth insulating layers 202 to 205 and the second gate insulating layer 132 may have the sixth hole H6 which exposes a part of the upper surface of the first conductive layer 150, and the other end 373 of the third active layer 170 may be disposed on the first conductive layer 150 in the sixth hole H6.

Each of the third electrode 161 and the first conductive layer 150 may serve as any one of the source electrode and the drain electrode of the third transistor T3. For example, the third electrode 161 may serve as the source electrode of the third transistor T3, and the first conductive layer 150 may serve as the drain electrode of the third transistor T3, but the present disclosure is not limited thereto. The third electrode 161 may serve as the drain electrode, and the first conductive layer 150 may serve as the source electrode.

In other words, the third electrode 161 may be the source electrode or the drain electrode of the third transistor T3 as well as the second gate line 161.

Also, the first conductive layer 150 may be an electrode of the storage capacitor Cst, the source electrode or the drain electrode of the second transistor T2, and also the source electrode or the drain electrode of the third transistor T3 simultaneously.

As such, in the structure, the source electrode or the drain electrode of the third transistor T3 does not branch from a plurality of lines. Consequently, it is possible to reduce the area of subpixels SP in the active region A/A.

The third active layer 170 of the third transistor T3 may include a third channel region CHA3.

The third channel region CHA3 may be a region overlapping a first protection layer 307 and a third conductive layer 180 disposed on the third active layer 170.

The length of the third channel region CHA3 may correspond to the width of the first protection layer 307 and also correspond to the width of the third conductive layer 180.

The third channel region CHA3 of the third active layer 170 may overlap the second conductive layer 151 which serves as the gate electrode of the third transistor T3.

Unlike the third channel region CHA3, the one end 371 and the other end 373 of the third active layer 170 may be regions made conductive. The one end 371 and the other end 373 of the third active layer 170 may have a higher electrical conductivity than the third channel region CHA3 of the third active layer 170.

The one end 371 of the third active layer 170, which is a region made conductive, may be in contact with the third electrode 161, and the other end 373 of the third active layer 170, which is another region made conductive, may be in contact with the first conductive layer 150.

The third conductive layer 180 disposed on the first protection layer 307 may be electrically connected to a ground line which supplies a ground voltage to the panel.

Specifically, the third conductive layer 180 may be electrically connected to the first conductive layer 150 through a contact hole 190 shown in FIG. 6. In this case, the first conductive layer 150 may be electrically connected to the ground line.

Roles of the third conductive layer 180 according to the embodiment of the present disclosure are not limited thereto. For example, the third conductive layer 180 may be electrically connected to the second conductive layer 151 which serves as the gate electrode of the third transistor T3 and may serve as the gate electrode together with the second conductive layer 151. In this case, the third transistor T3 may have a double gate structure.

As such, the third conductive layer 180 serves as the gate electrode to prevent light incident from above the panel from seeping into the third channel region CHA3 of the third active layer 170.

In other words, the third conductive layer 180 may serve to protect the third channel region CHA3 of the third active layer 170.

The sixth insulating layer 206 may be disposed on the substrate 100 on which the third conductive layer 180 is disposed.

A data voltage may be applied to the third transistor T3 having the above-described structure. In other words, although not shown in FIGS. 6 and 8, an organic light-emitting diode OLED may be electrically connected to the third transistor T3, and the third transistor T3 may be a driving transistor for driving the organic light-emitting diode OLED.

A driving transistor requires a high subthreshold (S) parameter. An S-parameter may be obtained from an S-parameter graph.

The S-parameter graph shows a ratio of a variation of a driving voltage of a driving transistor to a variation of a gate voltage. When the S-parameter graph of a driving transistor has a high gradient, an available data voltage range is small, and thus expression of a low gray color is difficult. Also, it may take a long time for the driving transistor to switch from an off-state to an on-state.

The gradient of the S-parameter graph may be 1/S-parameter.

In other words, an S-parameter denotes how fast a channel potential is changed when a gate voltage is changed, and a large S-parameter denotes that a channel potential is slowly changed in relation to a small S-parameter.

Such an S-parameter is inversely proportional to a width-to-length ratio of a channel region of a driving transistor. According to the present disclosure, the third channel CHA3 of the third transistor T3 is fabricated to have a length corresponding to the width of the first protection layer 307. Consequently, it is possible to prevent an S-parameter from being reduced by an excessive reduction in the length of the third channel region CHA3.

In other words, since the third transistor T3 according to the embodiment of the present disclosure has an appropriate length of the third channel region CHA3 for a driving transistor, it is possible to obtain a high S-parameter, and an available data voltage range can be increased.

Although FIG. 8 shows the fifth hole H5 and the sixth hole H6 having a tapered shape in the cross-sectional structure of the fifth hole H5 and the sixth hole H6, the present disclosure is not limited thereto. For example, like the first to fourth holes H1 to H4 shown in FIG. 9, the fifth hole H5 and the sixth hole H6 may have an inverted tapered shape in the cross-sectional structure. Also, in the cross-sectional structure of the fifth hole H5 and the sixth hole H6, the side surface of each hole may be perpendicular to the horizontal plane.

Meanwhile, as shown in FIG. 8, the storage capacitor Cst may be disposed under the third channel region CHA3 in the third active layer 170 of the third transistor T3 which is a driving transistor.

The electronic device according to the embodiment of the present disclosure includes a structure in which the storage capacitor Cst is disposed under the third channel region CHA3 in the third active layer 170 of the third transistor T3, and the electrodes (the first conductive layer and the second conductive layer) included in the storage capacitor Cst may serve as electrodes included in the first to third transistors T1 to T3. For this reason, it is unnecessary to separately form various electrodes included in the first to third transistors T1 to T3. Consequently, it is possible to fabricate an ultra-high definition panel by greatly reducing the area of subpixels SP.

As shown in FIG. 8, in the electronic device according to the embodiment of the present disclosure, the third active layer 170 of the third transistor T3 may be a single layer, but the present disclosure is not limited thereto.

Another structure of the third active layer of the third transistor T3 will be described below with reference to FIG. 11.

FIG. 11 is a cross-sectional view illustrating another structure of a third transistor of the electronic device according to the embodiment of the present disclosure.

In the following description, details (a configuration, effects, etc.) which are the same as those of the above-described embodiments may be omitted.

Referring to FIG. 11, a third active layer 370 of the third transistor T3 to which a data voltage is applied may include a first layer 171 disposed on the fifth insulating layer 205 and a second layer 270 disposed on the first layer 171.

The first layer 171 of the third active layer 370 may have the same structure as the third active layer 170 shown in FIG. 8, but the present disclosure is not limited thereto.

Like a first region 371a and a second region 373a of the first layer 171 of the third active layer 370, a first region 271b and a second region 273b of the second layer 270 of the third active layer 370 may be made conductive. Also, a third region 272b of the second layer of the third active layer 370 may be provided in a region overlapping the second region 373a of the first layer 171 of the third active layer 370.

In FIG. 11, the first layer 171 and the second layer 270 of the third active layer 370 may be oxide semiconductors. For example, the first layer 171 and the second layer 270 may include oxygen (O) and at least one of indium (In), gallium (Ga), zinc (Zn), titanium (Ti), and tin (Sn).

The content of elements included in the first layer 171 of the third active layer 370 may differ from the content of elements included in the second layer 270.

For example, the content of gallium (Ga) included in the second layer 270 of the third active layer 370 may be higher than the content of gallium (Ga) included in the first layer 171 of the third active layer 370. Also, the content of tin (Sn) included in the second layer 270 of the third active layer 370 may be higher than the content of tin (Sn) included in the first layer 171 of the third active layer 370.

For this reason, the second layer 270 of the third active layer 370 may have a lower electrical conductivity than the first layer 171. Also, the second layer 270 of the third active layer 370 may have a larger bandgap than the first layer 171.

When an oxide semiconductor is used as an active layer of a driving transistor, a threshold voltage may be remarkably shifted according to a change in channel length. Therefore, when an oxide semiconductor is used as an active layer of a driving transistor, it is difficult to acquire a short channel while maintaining a threshold voltage value required for an electronic device.

In the electronic device according to the embodiment of the present disclosure, it is possible to acquire a short channel while maintaining a threshold voltage value required by the electronic device through the third active layer 370 having two layers.

As described above, in the electronic device according to the embodiment of the present disclosure, the third active layer 370 of the third transistor T3, which is a driving transistor, includes the first and second layers 171 and 270, and thus the third active layer 370 may have a hetero junction structure.

In the junction of the first layer 171 and the second layer 270 of the third active layer 370, a depletion region may be formed due to a built-in potential Vbi. The built-in potential Vbi causes band bending at the junction. Since the third active layer 370 has a depletion region, the total charge density can be controlled. Therefore, it is possible to prevent a threshold voltage from being distorted according to a channel length.

The main channel region of the third active layer 370 having the above structure may be the third region 372a of the first layer 171 or the third region 272b of the second layer 270.

For example, as shown in FIG. 11, when the second conductive layer 151 which is the gate electrode of the third transistor T3 is disposed under the third active layer 370, the main channel region may be the third region 372a of the first layer 171.

The present disclosure is not limited thereto, and when the second conductive layer 151, which is the gate electrode of the third transistor T3, is disposed on the third active layer 370, the main channel region of the third active layer 370 may be the third region 272b of the second layer 270.

In other words, in the embodiment of the present disclosure, the position of the main channel region of the third active layer 370 may be changed depending on the position of the second conductive layer 151 which is the gate electrode of the third transistor T3.

Although a structure in which only the third active layer 370 of the third transistor T3 has double layers has been described in FIG. 11, the first and second active layers 130 and 140 of the first and second transistors T1 and T2 may also have double layers in some cases.

In addition, the structure of FIG. 11 may be applied to all of embodiments described below.

Subsequently, a structure of a region in which transistors are disposed in an electronic device according to another embodiment of the present disclosure will be described below with reference to FIGS. 12 to 14.

Figure 12:
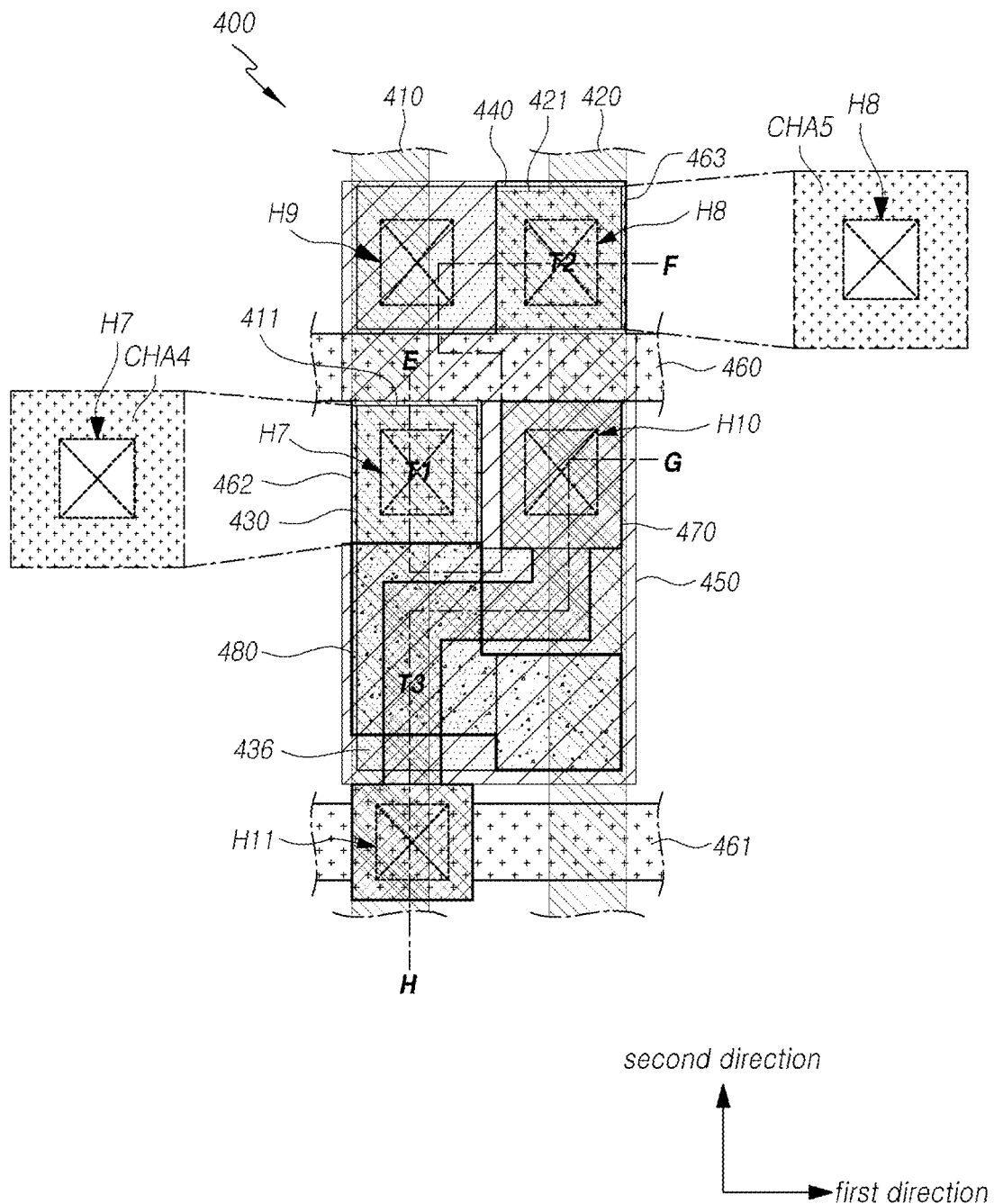
FIG. 12 is a plan view of a region in which transistors are disposed in an electronic device according to another embodiment of the present disclosure.

FIG. 12 is a plan view of a region in which transistors are disposed in an electronic device according to another embodiment of the present disclosure. FIG. 13 is a cross-sectional view taken along line E-F of FIG. 12. FIG. 14 is a cross-sectional view taken along line G-H of FIG. 12.

Figure 13:
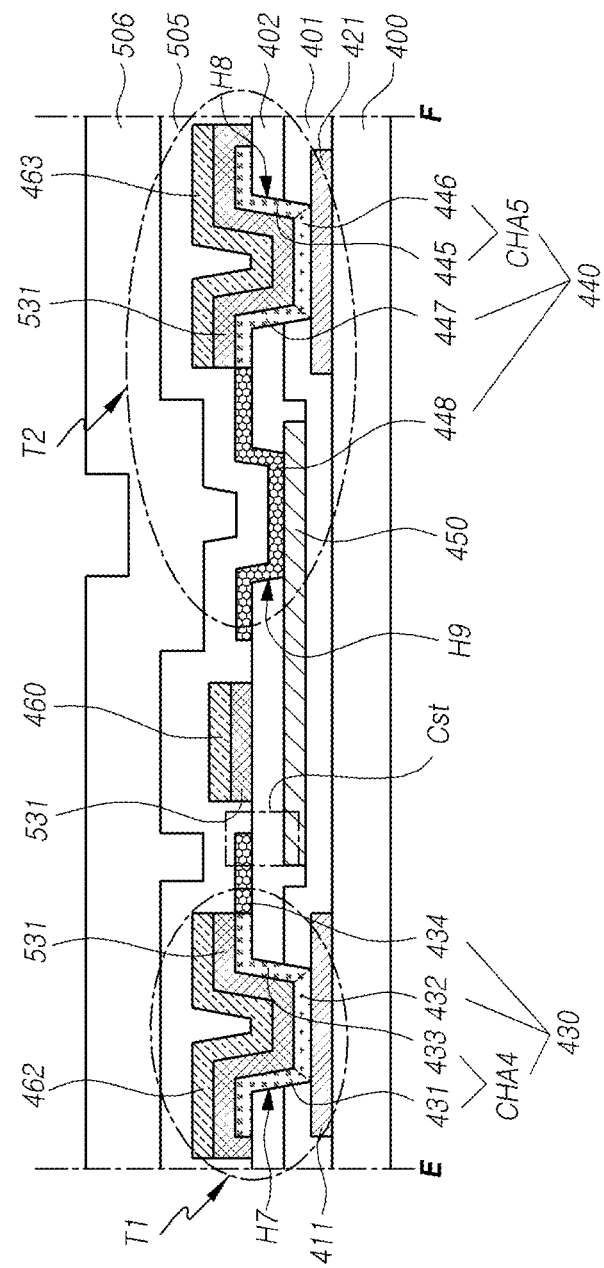
FIG. 13 is a cross-sectional view taken along line E-F of FIG. 12.
Figure 14:
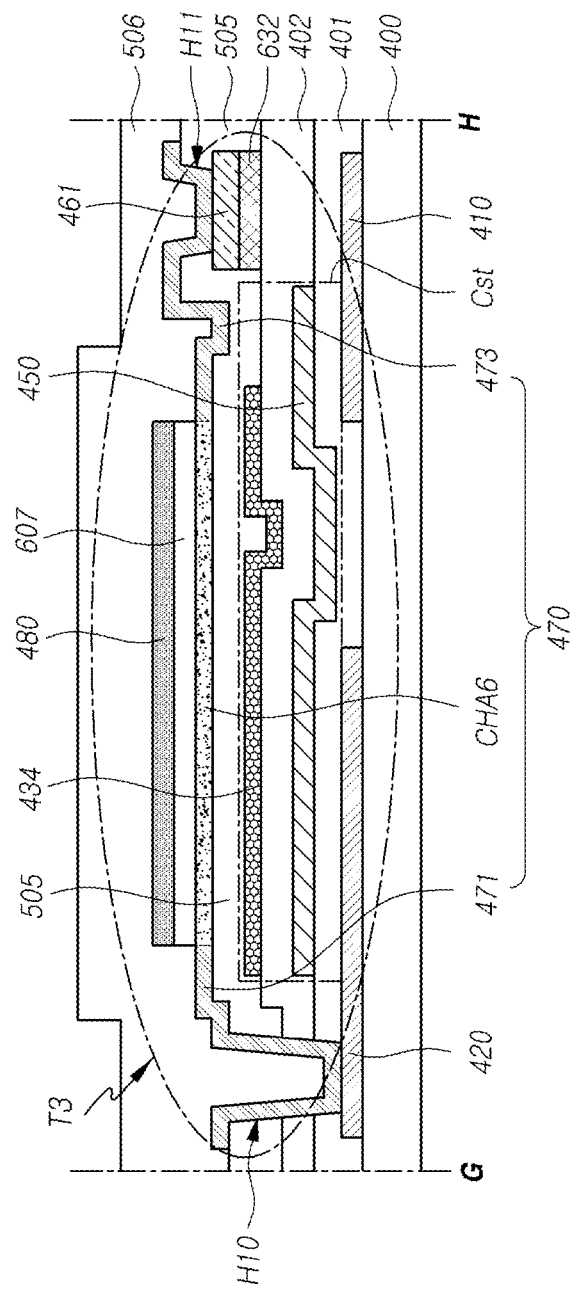
FIG. 14 is a cross-sectional view taken along line G-H of FIG. 12.

Referring to FIGS. 12 to 14, in a panel of the electronic device according to the embodiment of the present disclosure, a plurality of gate lines 460 and 461, a plurality of data lines 410, and a plurality of reference voltage lines 420 may be disposed.

The plurality of gate lines 460 and 461 may extend in a first direction (e.g., a horizontal direction). The plurality of data lines 410 and the plurality of reference voltage lines 420 may extend in a second direction crossing the first direction (e.g., a vertical direction).

The electronic device according to the embodiment of the present disclosure may include one or more transistors T1, T2, and T3. Also, the electronic device may include at least one storage capacitor Cst.

For example, when the electronic device includes a panel, the circuit region of one subpixel may include the first transistor T1, the second transistor T2, and the third transistor T3 and also include the at least one storage capacitor Cst.

The first transistor T1 may include a fourth electrode 411, a fourth active layer 430, a fourth region 434 of the fourth active layer 430 which is made conductive, and a first gate electrode 462.

The fourth electrode 111 may be disposed on a substrate 400. As shown in FIG. 12, the fourth electrode 111 of the first transistor T1 may include a region branching from a data line 410 extending in the second direction.

Although FIG. 12 shows a structure in which the fourth electrode 411 of the first transistor T1 includes the region branching from the data line 410, the present disclosure is not limited thereto. The fourth electrode 411 of the first transistor T1 may correspond to the data line 410. In other words, the region branching from the data line 410 to form the fourth electrode 411 may not be present.

On the substrate 400 on which the fourth electrode 411 is disposed, a first insulating layer 401 may be disposed. Although the first insulating layer 401 is shown as a single layer in FIGS. 13 and 14, the present disclosure is not limited thereto. For example, the first insulating layer 401 may be composed of a plurality of layers.

The first insulating layer 401 may include an inorganic insulating material. For example, the first insulating layer 401 may include any one of SiOx, SiNx, and SiON, but the present disclosure is not limited thereto.

A first conductive layer 450 may be disposed on the first insulating layer 401.

The first conductive layer 450 may include any one of aluminum (Al), gold (Au), copper (Cu), titanium (Ti), tungsten (W), molybdenum (Mo), and an alloy thereof, but the present disclosure is not limited thereto.

As shown in FIG. 12, the first conductive layer 450 may have a plate shape in a plane view, but the present disclosure is not limited thereto. Also, the first conductive layer 450 may overlap at least one of the plurality of gate lines 460 and 461.

A second insulating layer 402 may be disposed on the first conductive layer 450.

Although the second insulating layer 402 is shown as a single layer in FIGS. 13 and 14, the present disclosure is not limited thereto. For example, the second insulating layer 402 may be composed of a plurality of layers.

The second insulating layer 402 may include an inorganic insulating material. For example, the second insulating layer 402 may include any one of SiNx, SiON, and SiOx, but the present disclosure is not limited thereto.

The second insulating layer 402 may have a smaller thickness than the first insulating layer 401, but the present disclosure is not limited thereto. For example, the second insulating layer 402 may have a thickness of 100 nm or less.

In the first insulating layer 401 and the second insulating layer 402, a seventh hole H7 which exposes a part of the upper surface of the fourth electrode 411 may be provided.

The fourth active layer 430 of the first transistor T1 may be disposed on a part of the upper surface of the second insulating layer 402 and in the seventh hole H7.

The fourth active layer 430 may be an a-Si semiconductor or an oxide semiconductor, but the present disclosure is not limited thereto.

The fourth active layer 430 may include first to fourth regions 431 to 434 which are integrally formed.

The first region 431 of the fourth active layer 430 is disposed on a part of the upper surface of the second insulating layer 402 and one side surface of each of the first and second insulating layers 401 and 402 in a region in which the seventh hole H7 is provided.

The second region 432 of the fourth active layer 430 may extend from the first region 431 and may be in contact with the upper surface of the fourth electrode 411 exposed through the seventh hole H7.

Meanwhile, when the fourth active layer 430 is formed of an oxide semiconductor, a metal (e.g., Ti) present in the fourth electrode 411 may absorb oxygen (O) included in the second region 432 of the fourth active layer 430 so that the second region 432 may have characteristics similar to those of a conductor.

Although not shown in the drawings, an insulating layer having a small thickness may be disposed between the second region 432 of the fourth active layer 430 and the fourth electrode 411 to reduce the contact resistance between the second region 432 and the fourth electrode 411.

Also, as for a fifth active layer 440 of the second transistor T2 to be described below, the contact resistance between the fifth active layer 440 and a fifth electrode 421 may be reduced in the same way as the contact resistance between the fourth active layer 430 and the fourth electrode 411.

The third region 433 of the fourth active layer 430 may extend from the second region 432 to a part of the upper surface of the second insulating layer 402 and may be disposed on the other side surface of each of the first and second insulating layers 401 and 402 in the region in which the seventh hole H7 is provided.

The fourth region 434 of the fourth active layer 430 may be a part extending from the third region 433, disposed on a part of the upper surface of the second insulating layer 402, and made conductive. In other words, the fourth region 434 of the fourth active layer 430 may have a higher electrical conductivity than the first to third regions 431 to 433 of the fourth active layer 430.

Each of the fourth electrode 411 and the fourth region 434 of the fourth active layer 430 may serve as any one of the source electrode and the drain electrode of the first transistor T1. For example, the fourth electrode 411 may serve as the source electrode of the first transistor T1, and the fourth region 434 of the fourth active layer 430 may serve as the drain electrode of the first transistor T1, but the present disclosure is not limited thereto. The fourth electrode 411 may serve as the drain electrode, and the fourth region 434 of the fourth active layer 430 may serve as the source electrode.

In the embodiment of the present disclosure, only the fourth region 434 of the fourth active layer 430 is made conductive and used as a source electrode or a drain electrode so that an additional source electrode or drain electrode may not be formed.

The fourth active layer 430 of the first transistor T1 may include a fourth channel region CHA4.

The fourth channel region CHA4 may be the first region 431 and the third region 433.

As shown in FIG. 12, the fourth channel region CHA4 may be disposed to surround the entrance of the seventh hole H7 in a plane view.

The fourth channel region CHA4 shown in FIG. 12 may correspond to a part of the first region 431 of the fourth active layer 430 disposed on the upper surface of the second insulating layer 402 and a part of the third region 433 of the fourth active layer 430 disposed on the upper surface of the second insulating layer 402.

The fourth channel region CHA4 of the fourth active layer 430 may include a region which is not disposed parallel to the substrate 400 as shown in FIG. 13.

The fourth channel region CHA4 not disposed parallel to the substrate 400 may be a part of the first region 431 disposed on the one side surface of each of the first and second insulating layers 401 and 402 and a part of the third region 433 disposed on the other side surface of each of the first and second insulating layers 401 and 402.

The length of the fourth channel region CHA4 may be the sum of the length of the first region 431 and the length of the third region 433 of the fourth active layer 430.

Specifically, the length of the first region 431 and the third region 433 corresponding to a part of the fourth channel region CHA4 may be the sum of the lengths of parts of the first region 431 and the third region 433 disposed on the upper surface of the second insulating layer 402 (hereinafter, "fifth length") and the lengths of parts of the first region 431 and the third region 433 disposed on the side surfaces of the first and second insulating layers 401 and 402 in the seventh hole H7 (hereinafter, "sixth length").

The fifth length may be a length in a direction corresponding to cross-section line E-F, and the sixth length may be a length in a direction perpendicular to cross-section line E-F.

The length of the fourth channel region CHA4 may be proportional to the length of the first and third regions 431 and 433.

In another aspect, each of the first and third regions 431 and 433 of the fourth active layer 430 is disposed on the side surfaces of the first and second insulating layers 401 and 402. Consequently, the length of the fourth channel region CHA4 may be proportional to the sum of the thicknesses of the first and second insulating layers 401 and 402.

In other words, in the first transistor T1 according to the embodiment of the present disclosure, the length of the fourth channel region CHA4 in the fourth active layer 430 is not determined through an exposure process or the like and may be adjusted only by adjusting the thickness of the first and second insulating layers 401 and 402.

The first transistor T1 including the fourth active layer 430 having the above-described structure may occupy a reduced area in the panel and thus can facilitate fabrication of a high-resolution panel.

As shown in FIG. 13, a third gate insulating layer 531 may overlap the seventh hole H7.

Also, the third gate insulating layer 531 may be disposed under the first and second gate lines 460 and 461 so that the first and second gate lines 460 and 461 may overlap the third gate insulating layer 531. Also, the third gate insulating layer 531 may be disposed under the first gate electrode 462 and a second gate electrode 463 branching from the first gate line 460 so that the the first gate electrode 462 and the second gate electrode 463 may overlap the third gate insulating layer 531.

Specifically, the third gate insulating layer 531 may overlap the first to third regions 431 to 433 of the fourth active layer 430. In another aspect, the third gate insulating layer 531 may be disposed to expose the fourth region 434 of the fourth active layer 430.

The third gate insulating layer 531 may prevent the fourth channel region CHA4 of the fourth active layer 430 from being made conductive in a process of making the fourth region 434 of the fourth active layer 430 conductive.

Also, the third gate insulating layer 531 may be disposed on the upper surface and a side surface of the first region 431 to prevent the first region 431 of the fourth active layer 430 from being made conductive.

The fourth region 434 of the fourth active layer 430 may serve as an electrode of the storage capacitor Cst which is disposed to overlap the first conductive layer 450 as well as the source electrode or the drain electrode of the first transistor T1.

Consequently, it is possible to reduce a process of forming an electrode included in the storage capacitor Cst to form the storage capacitor Cst in the electronic device according to the embodiment of the present disclosure.

The first gate electrode 462 may be disposed on the third gate insulating layer 531 disposed on the fourth active layer 430.

In the first transistor T1 having such a structure, the fourth active region CHA4 includes a region which is not parallel to the substrate 400 as described above. Therefore, the fourth active layer 430 may have a short channel region.

The first transistor T1 may be a switching transistor electrically connected to the data line 410.

The second transistor T2 may include the fifth electrode 421, the fifth active layer 440, the first conductive layer 450, and the second gate electrode 463.

The fifth electrode 421 may be disposed on the substrate 400. As shown in FIG. 12, the fifth electrode 421 of the second transistor T2 may include a region branching from the reference voltage line 420 extending in the second direction. However, the embodiments of the present disclosure are not limited thereto, and the fifth electrode 421 may correspond to the reference voltage line 420. In other words, the region branching from the reference voltage line 420 to form the fifth electrode 421 may not be present.

On the substrate 400 on which the fifth electrode 421 is disposed, the first insulating layer 401 may be disposed.

The first conductive layer 450 and the second insulating layer 402 may be sequentially disposed on the first insulating layer 401.

In the first insulating layer 401 and the second insulating layer 402, an eighth hole H8 which exposes a part of the upper surface of the fifth electrode 421 may be provided.

The fifth active layer 440 of the second transistor T2 may be disposed on a part of the upper surface of the second insulating layer 402 and in the eighth hole H8.

The fifth active layer 440 may be an a-Si semiconductor or an oxide semiconductor, but the present disclosure is not limited thereto.

The fifth active layer 440 may include fifth to eighth regions 445 to 448 which are integrally formed.

The fifth region 445 of the fifth active layer 440 is disposed on a part of the upper surface of the second insulating layer 402 and one side surface of each of the first and second insulating layers 401 and 402 in a region in which the eighth hole H8 is provided.

The sixth region 446 of the fifth active layer 440 may extend from the fifth region 445 and may be in contact with the upper surface of the fifth electrode 421 exposed through the eighth hole H8.

The seventh region 447 of the fifth active layer 440 may extend from the sixth region 446 to a part of the upper surface of the second insulating layer 402 and may be disposed on the other side surface of each of the first and second insulating layers 401 and 402 in the region in which the eighth hole H8 is provided.

The eighth region 448 of the fifth active layer 440 may be a part extending from the seventh region 447, disposed on a part of the upper surface of the second insulating layer 402, and made conductive. In other words, the eighth region 448 of the fifth active layer 440 may have a higher electrical conductivity than the fifth to seventh regions 445 to 447 of the fifth active layer 440.

The eighth region 448 of the fifth active layer 440 may be in contact with a part of the upper surface of the first conductive layer 450 through a ninth hole H9 provided in the second insulating layer 402.

Each of the fifth electrode 421 and the first conductive layer 450 may serve as any one of the source electrode and the drain electrode of the second transistor T2. For example, the fifth electrode 421 may serve as the source electrode of the second transistor T2, and the first conductive layer 450 may serve as the drain electrode of the second transistor T2, but the present disclosure is not limited thereto. The fifth electrode 421 may serve as the drain electrode, and the first conductive layer 450 may serve as the source electrode.

In other words, the fifth electrode 421 may be the source electrode or the drain electrode of the second transistor T2.

Also, the first conductive layer 450 may be the source electrode or the drain electrode of the second transistor T2 as well as an electrode of the storage capacitor Cst.

The fifth active layer 440 of the second transistor T2 may include a fifth channel region CHA5.

The fifth channel region CHA5 may be the fifth region 445 and the seventh region 447.

As shown in FIG. 12, the fifth channel region CHA5 may be disposed to surround the entrance of the eighth hole H8 in a plane view.

The fifth channel region CHA5 shown in FIG. 12 may correspond to a part of the fifth region 445 of the fifth active layer 440 disposed on the upper surface of the second insulating layer 402 and a part of the seventh region 447 of the fifth active layer 440 disposed on the upper surface of the second insulating layer 402.

The fifth channel region CHA5 of the fifth active layer 440 may include a region which is not disposed parallel to the substrate 400 as shown in FIG. 13.

The fifth channel region CHA5 not disposed parallel to the substrate 400 may be a part of the fifth region 445 disposed on the one side surface of each of the first and second insulating layers 401 and 402 and a part of the seventh region 447 disposed on the other side surface of each of the first and second insulating layers 401 and 402.

The length of the fifth channel region CHA5 may be the sum of the length of the fifth region 445 and the length of the seventh region 447 of the fifth active layer 440.

Specifically, the length of the fifth region 445 and the seventh region 447 corresponding to a part of the fifth channel region CHA5 may be the sum of the lengths of parts of the fifth region 445 and the seventh region 447 disposed on the upper surface of the second insulating layer 402 (hereinafter, "seventh length") and the lengths of parts of the fifth region 445 and the seventh region 447 disposed on the side surfaces of the first and second insulating layers 401 and 402 in the eighth hole H8 (hereinafter, "eighth length").

The seventh length may be a length in a direction corresponding to cross-section line E-F, and the eighth length may be a length in a direction perpendicular to cross-section line E-F.

The length of the fifth channel region CHA5 may be proportional to the length of the fifth and seventh regions 445 and 447.

In another aspect, each of the fifth and seventh regions 445 and 447 of the fifth active layer 440 is disposed on the side surfaces of the first and second insulating layers 401 and 402. Consequently, the length of the fifth channel region CHA5 may be proportional to the sum of the thicknesses of the first and second insulating layers 401 and 402.

In other words, in the second transistor T2 according to the embodiment of the present disclosure, the length of the fifth channel region CHA5 in the fifth active layer 440 is not determined through an exposure process or the like and may be adjusted only by adjusting the thickness of the first and second insulating layers 401 and 402.

The second transistor T2 including the fifth active layer 440 having the above-described structure may occupy a reduced area in the panel and thus can facilitate fabrication of a high-resolution panel.

As shown in FIG. 13, a third gate insulating layer 531 may overlap the eighth hole H8.

Specifically, the third gate insulating layer 531 may overlap the fifth to seventh regions 445 to 447 of the fifth active layer 440. In another aspect, the third gate insulating layer 531 may be disposed to expose the eight region 448 of the fifth active layer 440.

The third gate insulating layer 531 may prevent the fifth channel region CHA5 of the fifth active layer 440 from being made conductive in a process of making the eighth region 448 of the fifth active layer 440 conductive.

Also, the third gate insulating layer 531 may be disposed on the upper surface and a side surface of the fifth region 445 to prevent the fifth region 445 of the fifth active layer 440 from being made conductive.

The second gate electrode 463 may be disposed on the third gate insulating layer 531 disposed on the fifth active layer 440.

Referring to FIGS. 12 and 13, the first gate electrode 462 and the second gate electrode 463 may branch from the first gate line 460.

The first gate line 460 may be disposed on the same layer as the first gate electrode 462 and the second gate electrode 463 and may be formed of the same material as that of the first gate electrode 462 and the second gate electrode 463.

Referring to FIG. 13, third and fourth insulating layers 505 and 506 may be sequentially disposed on the substrate 400 on which the first gate electrode 462, the second gate electrode 463, and the first gate line 460 are disposed.

According to the embodiment of the present disclosure, as shown in FIGS. 12 and 14, the third transistor T3 may be further disposed in the single subpixel SP.

The third transistor T3 may include a sixth electrode 420, a seventh electrode 461, a second conductive layer 434, and a sixth active layer 470.

The sixth electrode 420 of the third transistor T3 may be disposed on the substrate 400.

As shown in FIG. 12, the sixth electrode 420 of the third transistor T3 may correspond to the reference voltage line 420.

The sixth electrode 420 of the third transistor T3 and the reference voltage line 420 may be disposed in the same layer and formed of the same material.

As shown in FIG. 14, the first insulating layer 401 may be disposed on the sixth electrode 420.

The first conductive layer 450 may be disposed on the first insulating layer 401. The first conductive layer 450 may overlap a part of the sixth electrode 420 and a part of the reference voltage line 420.

The second insulating layer 402 may be disposed on the first conductive layer 450.

The second conductive layer 434, which is the gate electrode of the third transistor T3, may be disposed on the second insulating layer 402.

The second conductive layer 434 may correspond to the fourth region 434 of the first transistor T1. In other words, the second conductive layer 434 may be a region of the fourth active layer 430 of the first transistor T1 made conductive.

Also, the seventh electrode 461 of the third transistor T3 may be disposed on the second insulating layer 402. A second gate insulating layer 632 may be disposed under the seventh electrode 461.

The third insulating layer 505 may be disposed on the second conductive layer 434, which is the fourth region 434 of the fourth active layer 430 of the first transistor T1, and the seventh electrode 461 of the third transistor T3.

The sixth active layer 470 of the third transistor T3 may be disposed on the third insulating layer 505.

The sixth active layer 470 may be formed of an a-Si semiconductor or an oxide semiconductor, but the present disclosure is not limited thereto.

One end 471 of the sixth active layer 470 may be in contact with the sixth electrode 420 through a tenth hole H10 provided in the first, second, and third insulating layers 401, 402, and 505. Another end 473 of the sixth active layer 470 may be in contact with the seventh electrode 461 through an eleventh hole H11 provided in the third insulating layer 505.

Each of the sixth electrode 420 and the seventh electrode 461 may serve as any one of the source electrode and the drain electrode of the third transistor T3. For example, the sixth electrode 420 may serve as the source electrode of the third transistor T3, and the seventh electrode 461 may serve as the drain electrode of the third transistor T3, but the present disclosure is not limited thereto. The sixth electrode 420 may serve as the drain electrode, and the seventh electrode 461 may serve as the source electrode.

In other words, the seventh electrode 461 may be the source electrode or the drain electrode of the third transistor T3 as well as the second gate line 461.

As such, in the structure, the source electrode or the drain electrode of the third transistor T3 does not branch from a plurality of lines. Consequently, the area of subpixels SP in the active region A/A may be reduced by an area required for branching out into the source electrode and the drain electrode.

The sixth active layer 470 of the third transistor T3 may include a sixth channel region CHA6.

The six channel region CHA6 may be a region overlapping a second protection layer 607 and a third conductive layer 480 disposed on the sixth active layer 470.

The length of the sixth channel region CHA6 may correspond to the width of the second protection layer 607 and also the width of the third conductive layer 480.

The sixth channel region CHA6 of the sixth active layer 470 may overlap the second conductive layer 434 of the third transistor T3.

The one end 471 and the other end 473 of the sixth active layer 470 may be made conductive unlike the sixth channel region CHA6. The one end 471 and the other end 473 of the sixth active layer 470 may have a higher electrical conductivity than the sixth channel region CHA6.

The one end 471 of the sixth active layer 470, which is a region made conductive, may be in contact with the sixth electrode 420, and the other end 473 of the sixth active layer 470, which is another region made conductive, may be in contact with the seventh conductive layer 461.

Although not shown in the drawings, the third conductive layer 480 disposed on the second protection layer 607 may be electrically connected to a ground line which supplies a ground voltage to the panel.

Roles of the third conductive layer 480 according to the embodiment of the present disclosure are not limited thereto. For example, the third conductive layer 480 may be electrically connected to the second conductive layer 434 which serves as the gate electrode of the third transistor T3 and may serve as the gate electrode together with the second conductive layer 434. In this case, the third transistor T3 may have a double gate structure.

The fourth insulating layer 506 may be disposed on the substrate 400 on which the third conductive layer 480 is disposed.

A data voltage may be applied to the third transistor T3 having the above-described structure. In other words, although not shown in FIGS. 12 and 14, an organic light-emitting diode OLED may be electrically connected to the third transistor T3, and the third transistor T3 may be a driving transistor for driving the organic light-emitting diode OLED.

Subsequently, a method of fabricating the electronic device having the structure of FIGS. 6 to 8 will be described below with reference to FIGS. 15 to 26.

FIGS. 15 to 26 are diagrams schematically illustrating a method of fabricating the electronic device having the structure of FIGS. 6 to 8.

For convenience of description, a region of one subpixel in which three transistors and one capacitor are disposed in an electronic device will be mainly described below.

In the following description, details (a configuration, effects, etc.) which are the same as those of the above-described embodiments may be omitted.

Figure 15:
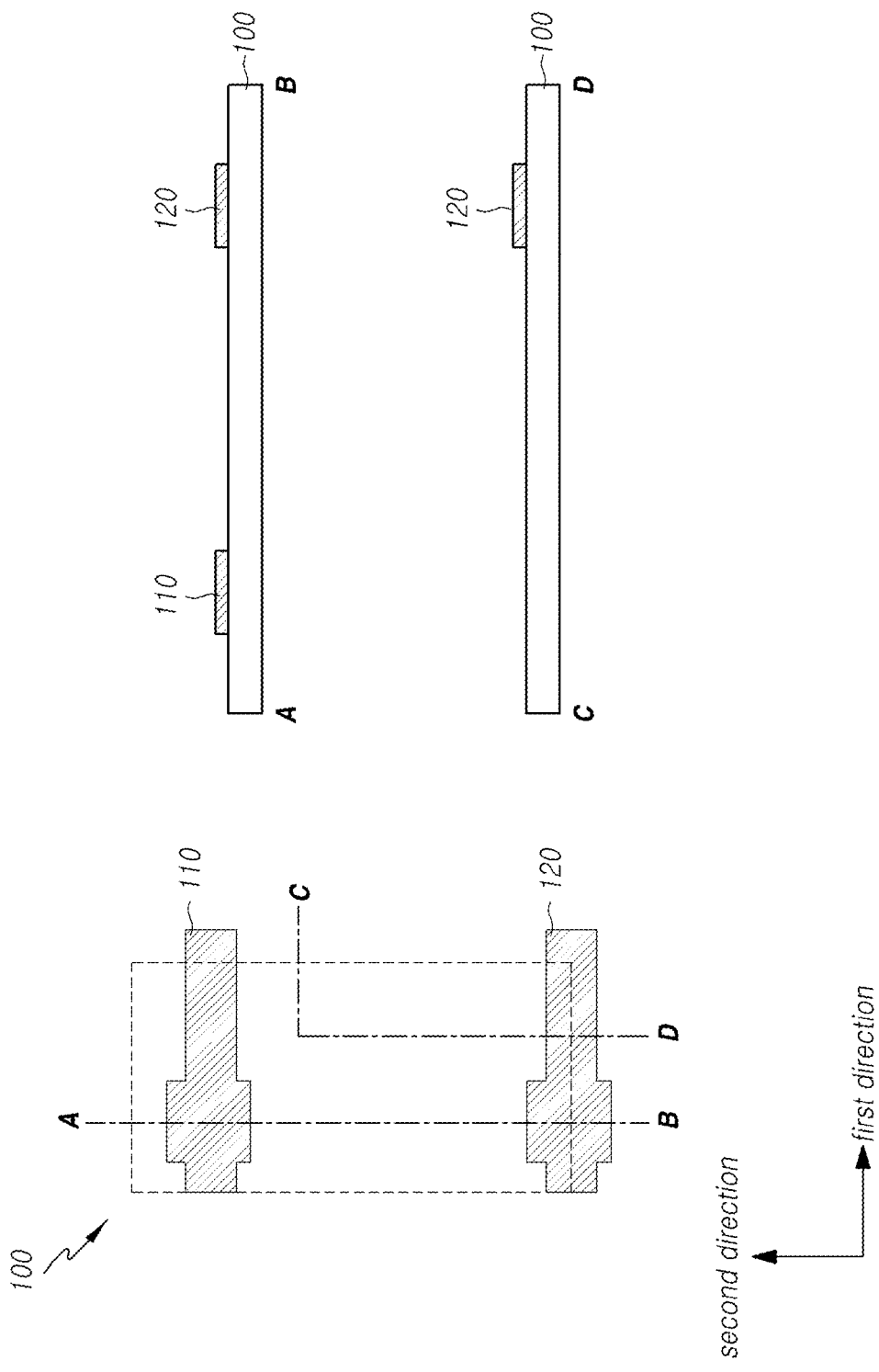
FIGS. 15 to 26 are diagrams schematically illustrating a method of fabricating the electronic device having the structure of FIGS. 6 to 8.

Referring to FIG. 15, the data line 110 and the reference voltage line 120 arranged in the first direction may be disposed on the substrate 100. The data line 110 and the reference voltage line 120 may be disposed apart from each other.

The data line 110 and the reference voltage line 120 may be disposed in the same layer and formed of the same material.

Although FIG. 15 shows a configuration in which one data line 110 and one reference voltage line 120 are disposed on the substrate 100, the present disclosure is not limited thereto. A plurality of data lines 110 and a plurality of reference voltage lines 120 may be disposed on the substrate 100.

The data line 110 may be used as a first electrode which is the source electrode or the drain electrode of the first transistor T1. The reference voltage line 120 may be used as a second electrode which is the source electrode or the drain electrode of the second transistor T2.

Figure 16:
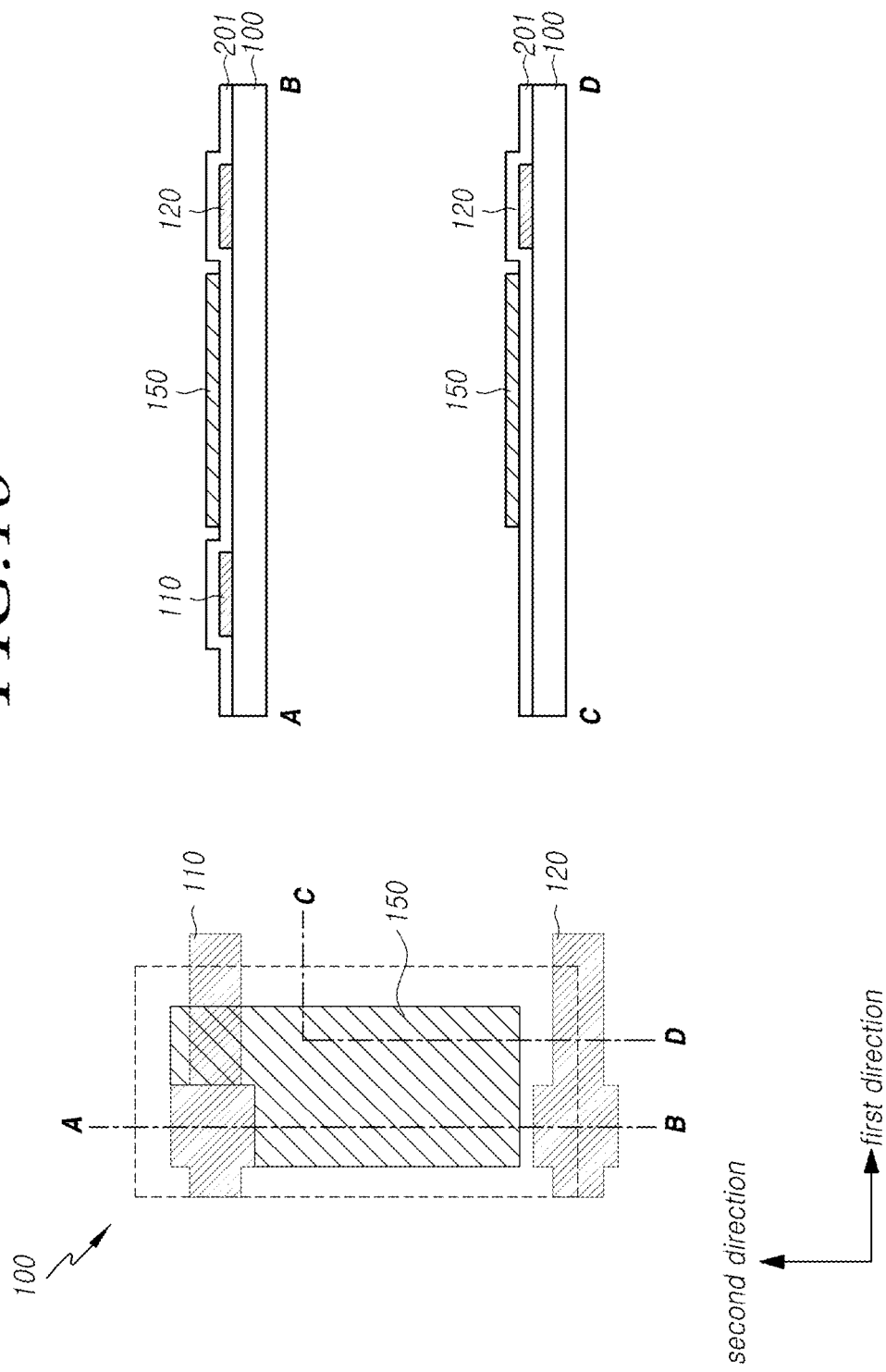

Referring to FIG. 16, the first insulating layer 201 may be disposed on the substrate 100 on which the data line 110 and the reference voltage line 120 are disposed.

The first conductive layer 150 may be disposed on the first insulating layer 201.

A part of the first conductive layer 150 may overlap a part of the data line 110.

Figure 17:
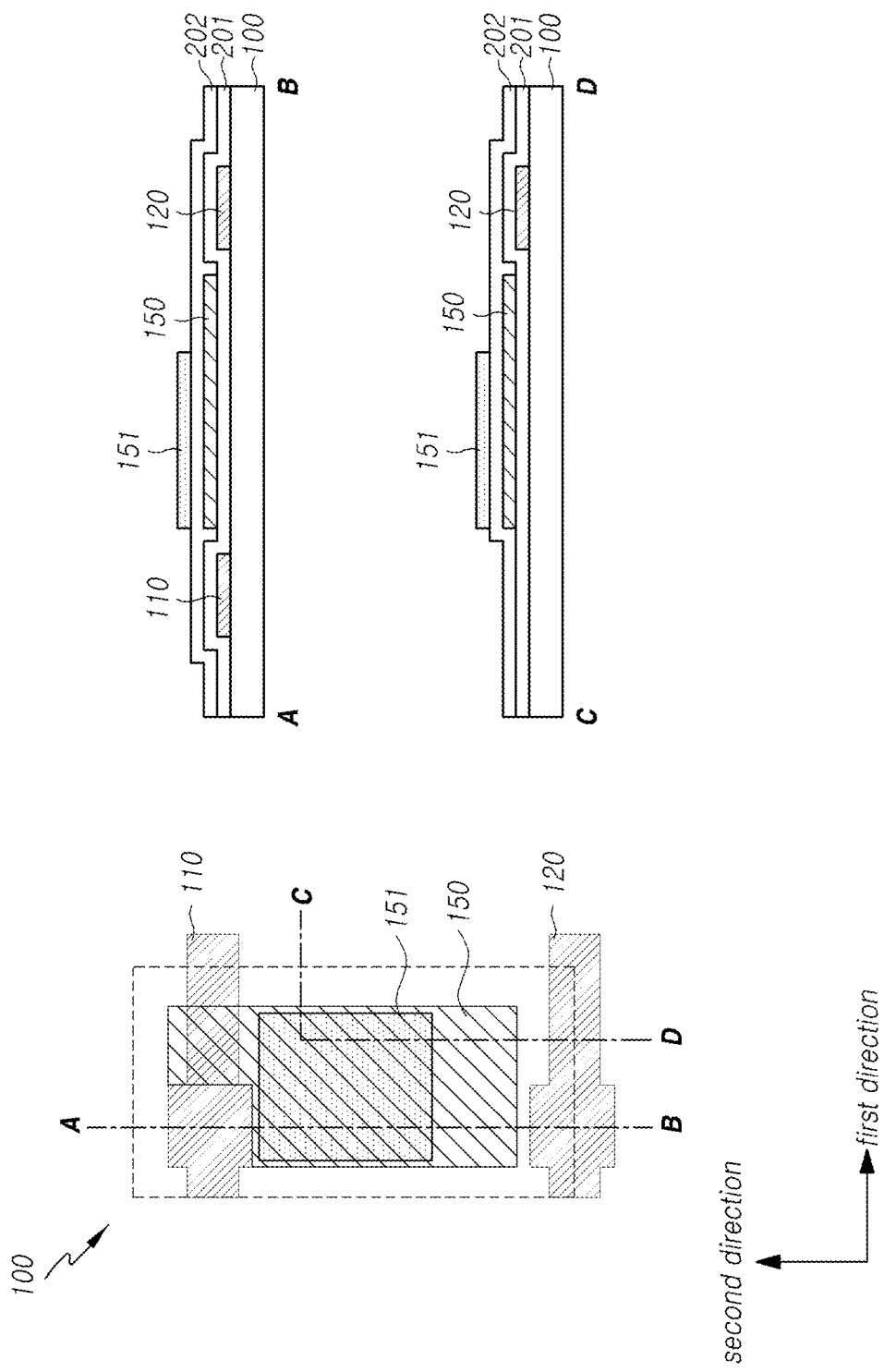

Referring to FIG. 17, the second conductive layer 202 may be disposed on the substrate 100 on which the first conductive layer 150 is disposed.

Subsequently, the second conductive layer 151 may be disposed on the second insulating layer 202 to overlap the first conductive layer 150.

The first conductive layer 150 and the second conductive layer 151 may have a plate shape, but the present disclosure is not limited thereto.

Figure 18:
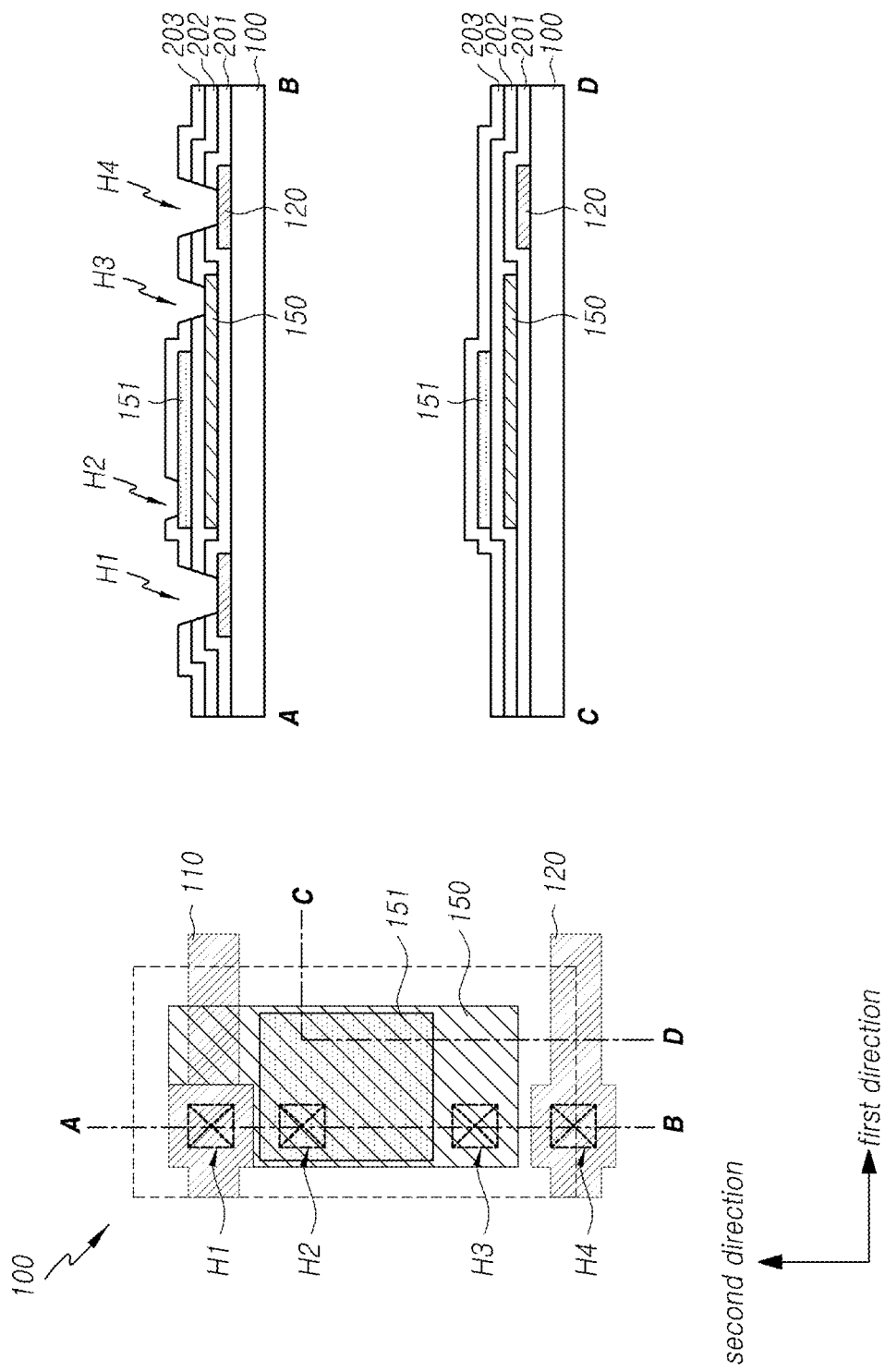

Referring to FIG. 18, the third insulating layer 203 may be disposed on the second conductive layer 151.

Subsequently, the first to fourth holes H1 to H4 may be formed in the first to third insulating layers 201 to 203 through a photolithography process employing a half-tone mask. However, the present disclosure is not limited thereto, and different masks may be used to form the first to fourth holes H1 to H4.

The first hole H1 may be formed in the first to third insulating layers 201 to 203 and may expose a part of the first electrode 110 of the first transistor T1.

The second hole H2 may be formed in the third insulating layer 203 and may expose a part of the upper surface of the second conductive layer 151.

The third hole H3 may be formed in the second and third insulating layers 202 and 203 and may expose a part of the upper surface of the first conductive layer 150.

The fourth hole H4 may be formed in the first to third insulating layers 201 to 203 and may expose a part of the upper surface of the second electrode 120 of the second transistor T2.

Figure 19:
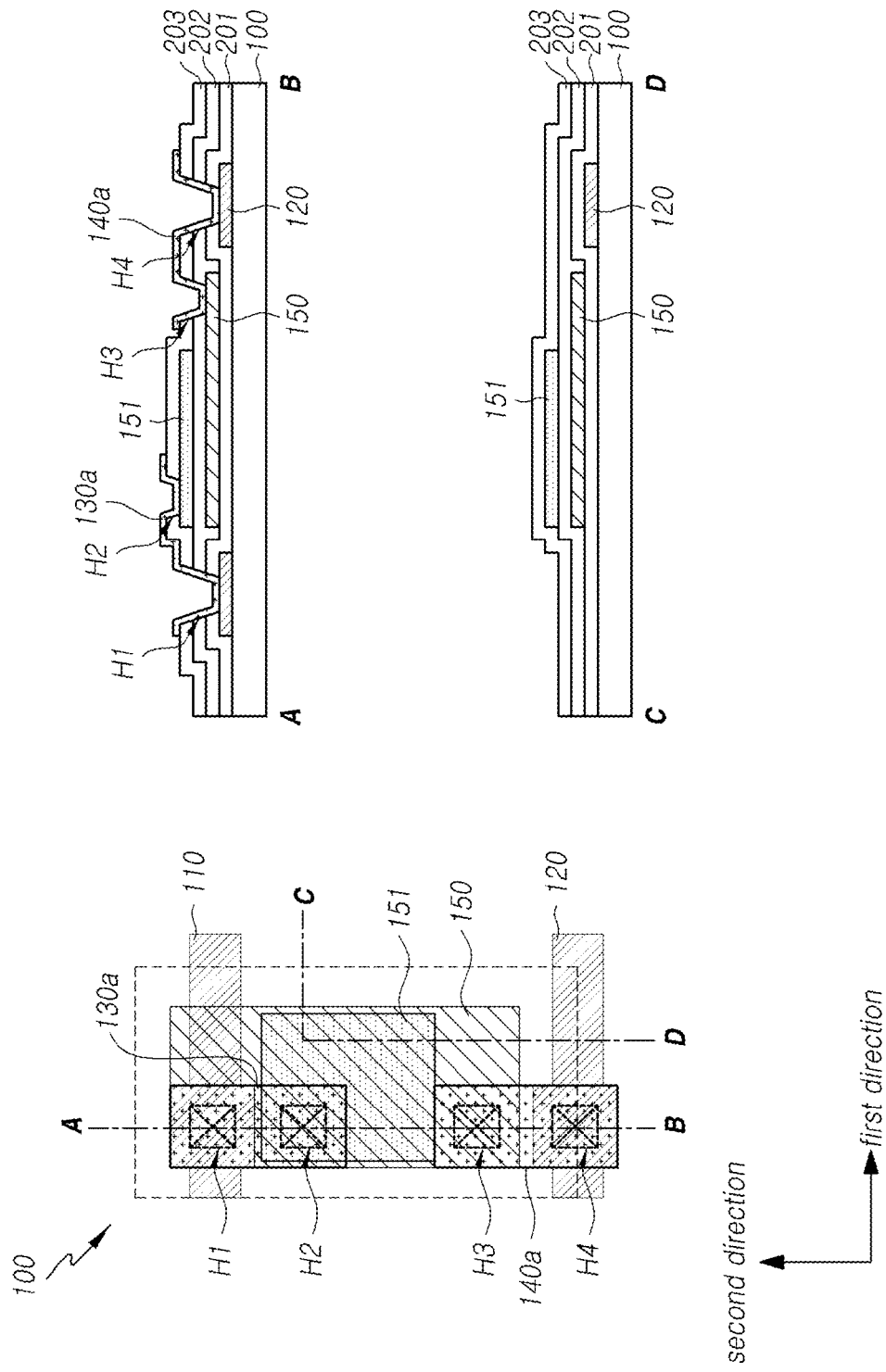

Subsequently, as shown in FIG. 19, a first active layer material 130a of the first transistor T1 and a second active layer material 140a of the second transistor T2 may be formed.

Specifically, an active layer material may be formed on the substrate 100 on which the third insulating layer 203 is disposed.

As shown in FIG. 19, the active layer material may remain as the first active layer material 130a and the second active layer material 140a through a wet etching process.

Meanwhile, since the active layer material is disposed on the third insulating layer 203 to overlap the plurality of holes, a photoresist may be formed on the active layer material. For this reason, in the wet etching process, it is possible to form patterns of the active layer material (the first active layer material 130a and the second active layer material 140a) in desired regions.

In other words, in a process of patterning the active layer material, it is possible to form patterns of the active layer material in desired regions without loss of the active layer material.

The first active layer material 130a may be formed to overlap the first and second holes H1 and H2.

In particular, the first active layer material 130a may extend from a part of the upper surface of the third insulating layer 203 to be disposed in the first hole H1, may extend from the region disposed in the first hole H1 to the upper surface of the third insulating layer 203 to be disposed in the second hole H2, and may be formed to extend from the region disposed in the second hole H2 to a part of the upper surface of the third insulating layer 203.

The second active layer material 140a may be formed to overlap the third and fourth holes H3 and H4.

In particular, the second active layer material 140a may extend from a part of the upper surface of the third insulating layer 203 to be disposed in the third hole H3, may extend from the region disposed in the third hole H3 to the upper surface of the third insulating layer 203 to be disposed in the fourth hole H4, and may be formed to extend from the region disposed in the fourth hole H4 to a part of the upper surface of the third insulating layer 203.

In this case, in the first to fourth holes H1 to H4 having small widths, the active layer material may be formed through a thin film deposition method for controlling thin film deposition such as metal-organic chemical vapor deposition (MOCVD) or atomic layer deposition (ALD).

MOCVD is a kind of chemical vapor deposition (CDV) for delivering a source gas, which includes an organometallic complex, onto a heated substrate and causing a decomposition reaction on the surface to form a thin film. MOCVD is a technique for growing a semiconductor thin film by thermally decomposing an organometallic gas on a heated substrate. In the case of MOCVD, manipulation is performed at a lower temperature than in other CVD methods such as plasma enhanced chemical vapor deposition (PECVD) and low pressure chemical vapor deposition (LPCVD), and thin film control is possible in an atomic order. Also, it is possible to obtain a uniform film.

ALD is a deposition method of separately supplying reaction materials and depositing particles formed through a chemical reaction between reactive gases on a substrate surface to form a thin film. After one reaction material is chemically adsorbed on a substrate on which a thin film will be deposited, a second or third gas is introduced and chemically adsorbed on the substrate again so that a thin film may be deposited.

When MOCVD or ALD is used, the thin film productivity or growth rate may be increased compared with those of general physical vapor deposition (PVD) and other CVD methods, and also the thin film deposition characteristics are favorable. Consequently, it is possible to minutely adjust a thin film thickness. In other words, when MOCVD or ALD is used, it is possible to form a thin film having excellent step coverage characteristics.

In addition, compared with other general deposition methods, MOCVD or ALD exhibits higher thickness uniformity and composition uniformity and makes it possible to form a high-density thin film.

The first active layer material 130a and the second active layer material 140a formed through such MOCVD or ALD may be a very thin film which is formed without disconnection even in a region having a step.

The first active layer material 130a and the second active layer material 140a formed through MOCVD or ALD may have a very small thickness deviation according to positions. In other words, the first active layer material 130a and the second active layer material 140a may have high thickness uniformity.

Figure 20:
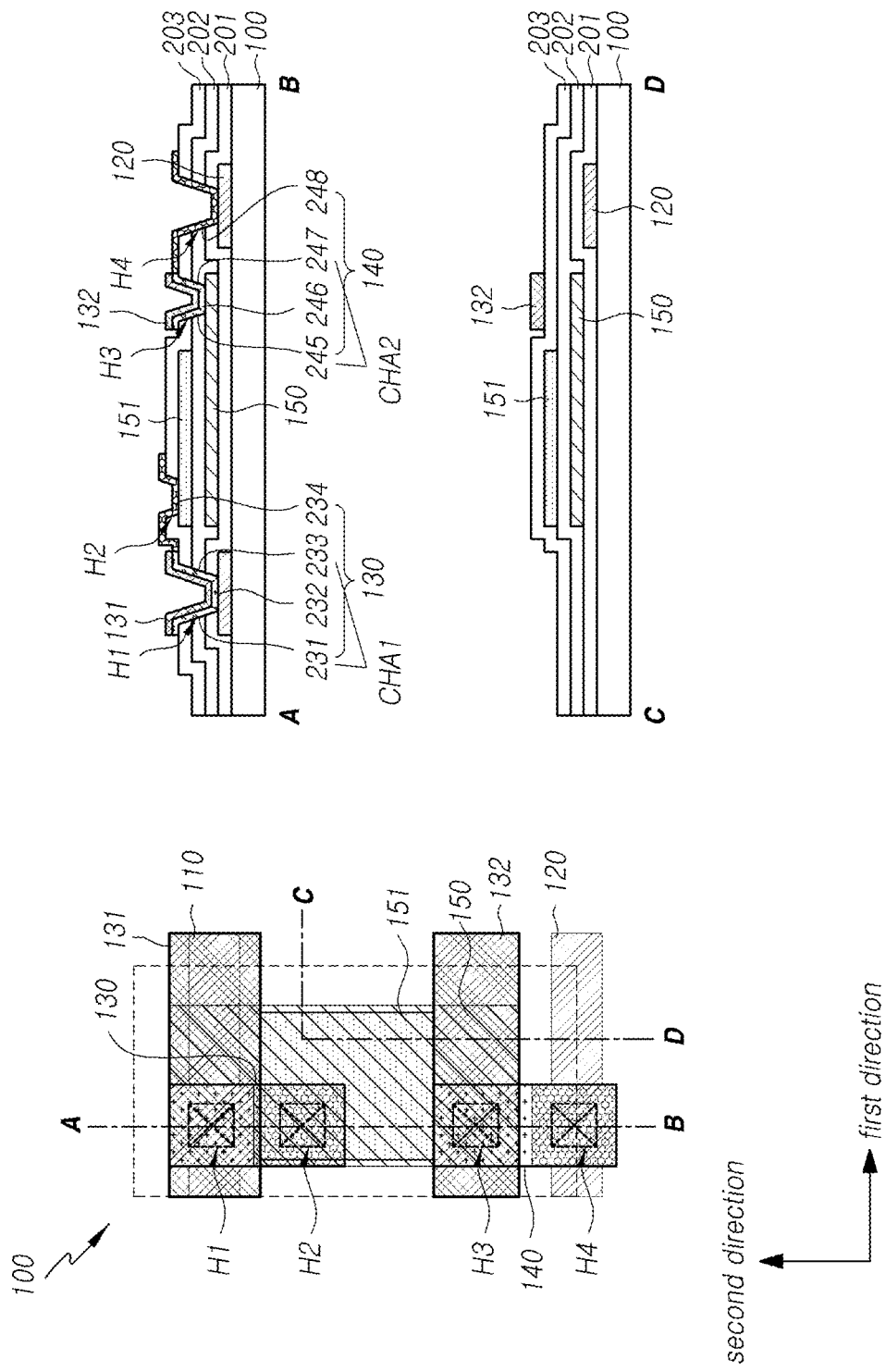

Subsequently, referring to FIGS. 19 and 20, the first gate insulating layer 131 is disposed to overlap a part of the first active layer 130, and the second gate insulating layer 132 is disposed to overlap a part of the second active layer 140.

Specifically, a gate insulating layer material may be formed on the substrate 100 on which the first and second active layer materials 130a and 140a are disposed.

Subsequently, the gate insulating layer material may be patterned into the first and second gate insulating layers 131 and 132 show in FIG. 20 using a dry etching process.

The first gate insulating layer 131 formed through the dry etching process may extend in the same direction as the data line 110 extends.

In addition, the first gate insulating layer 131 may overlap the data line 110 while overlapping a part of the first active layer material 130a and the first hole H1.

The second gate insulating layer 132 may also extend in the same direction as the data line 110 extends.

In addition, the second gate insulating layer 132 may overlap a part of the second active layer material 140*a* and the third hole H3.

In the dry etching process, the first and second active layer materials 130*a* and 140*a* disposed in regions in which the first and second gate insulating layers 131 and 132 are disposed remain without any change, but the first and second active layer materials 130*a* and 140*a* disposed in regions from which the gate insulating layer material is removed may be made conductive.

In the dry etching process, the first and second gate insulating layers 131 and 132 may shield the first and second active layers 130 and 140 disposed thereunder from plasma. In this case, the first and second gate insulating layers 131 and 132 may also shield the second part 232 and the sixth part 246 of the first and second active layers 130 and 140 from plasma.

In another aspect, the first and second gate insulating layers 131 and 132 may prevent the first and second channel regions CHA1 and CHA2 of the first and second active layers 130 and 140 from being made conductive in the dry etching process.

For this reason, the first active layer 130 may include the fourth part 234 which is not made conductive in a region not overlapping the first gate insulating layer 131, and the second active layer 140 may include the eighth part 248 which is not made conductive in a region not overlapping the second gate insulating layer 132.

Figure 21:
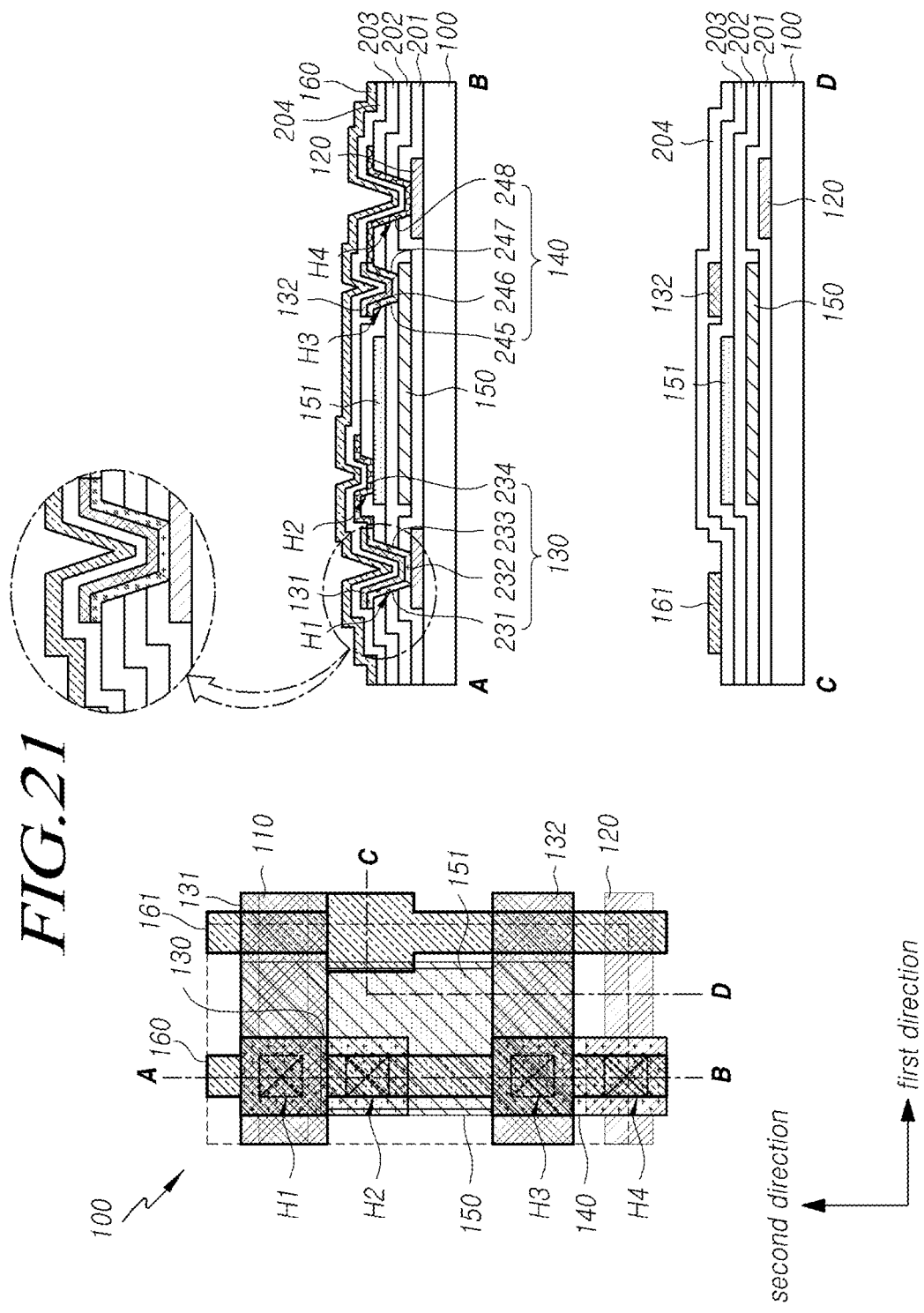

Subsequently, as shown in FIG. 21, the fourth insulating layer 204 may be disposed on the substrate 100 on which the first and second gate insulating layers 131 and 132 are formed.

Subsequently, the first and second gate lines 160 and 161 may be disposed on the fourth insulating layer 204 to extend in a direction crossing the direction in which the data line 110 and the reference voltage line 120 extend.

The first gate line 160 may be used as first and second gate electrodes of the first and second transistors T1 and T2.

The second gate line 160 may be used as a third electrode which is the source electrode or the drain electrode of the third transistor T3.

The fourth insulating layer 204 and the first and second gate lines 160 and 161 may be formed through MOCVD or ALD.

For this reason, the fourth insulating layer 204 and the first and second gate lines 160 and 161 may be formed on the substrate 100 in which a plurality of holes having small widths are disposed without disconnection.

Figure 22:
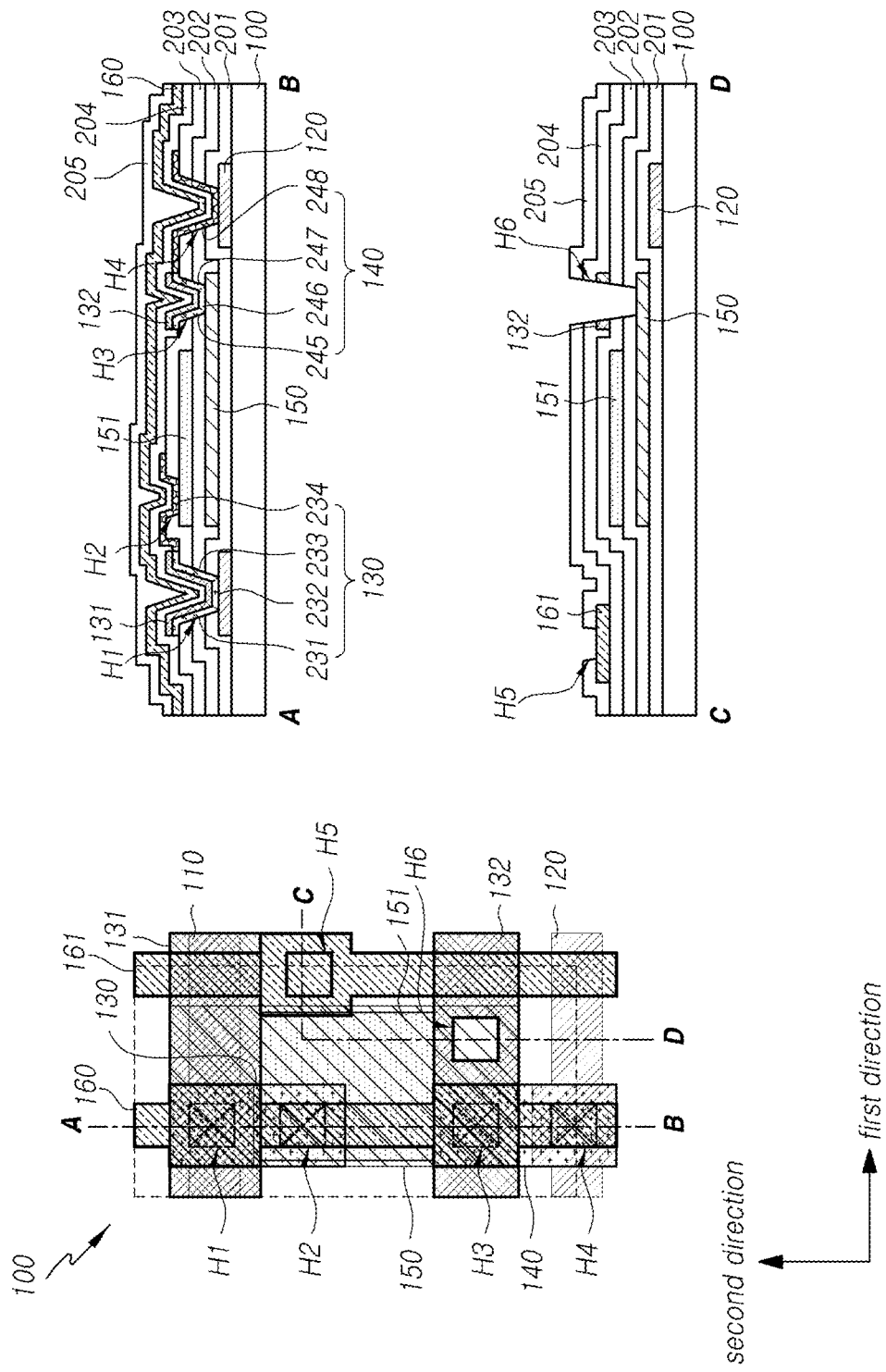

Subsequently, as shown in FIG. 22, the fifth insulating layer 205 may be formed on the substrate 100 on which the first and second gate lines 160 and 161 are disposed.

The fifth insulating layer 205 may be formed through a process of forming a fifth insulating layer material on the substrate 100 and then forming the fifth hole H5, which exposes a part of the upper surface of the third electrode 161 of the third transistor T3, and the sixth hole H6, which exposes a part of the upper surface of the first conductive layer 150.

The fifth hole H5 and the sixth hole H6 may be formed using a half-tone mask in the same process, but the present disclosure is not limited thereto. The fifth hole H5 and the sixth hole H6 may be formed using different masks in different processes.

The fifth hole H5 may be formed in the fifth insulating layer 205.

The sixth hole H6 may be formed in the second to fifth insulating layers 202 to 205 and also the second gate insulating layer 132 disposed on the third insulating layer 203.

Figure 23:
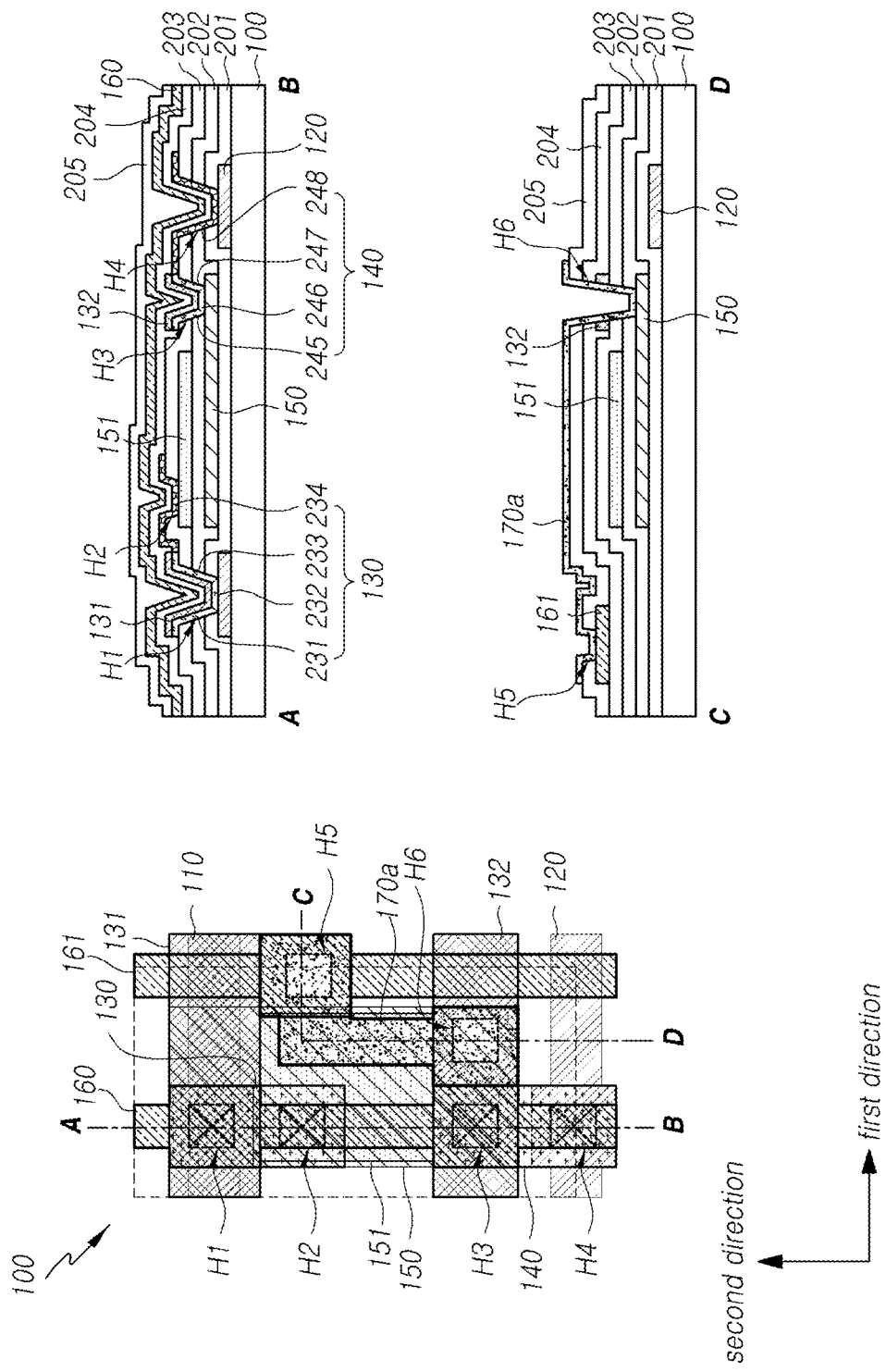

Subsequently, as shown in FIG. 23, a third active layer material 170*a* may be formed.

Specifically, a material for forming the third active layer material 170*a* may be formed on the substrate 100 on which the fifth insulating layer 205 is formed. Then, the third active layer material 170*a* may be formed in the structure shown in FIG. 23 through a wet etching process.

The third active layer material 170*a* may extend from a part of the upper surface of the fifth insulating layer 205 to be disposed in the fifth hole H5, may extend from the region disposed in the fifth hole H5 to the upper surface of the fifth insulating layer 205 to be disposed in the sixth hole H6, and may be formed to extend from the region disposed in the sixth hole H6 to a part of the upper surface of the fifth insulating layer 205.

The third active layer material 170*a* may be formed through MOCVD or ALD so as to be formed in the fifth hole H5 and the sixth hole H6 having small widths without disconnection.

Figure 24:
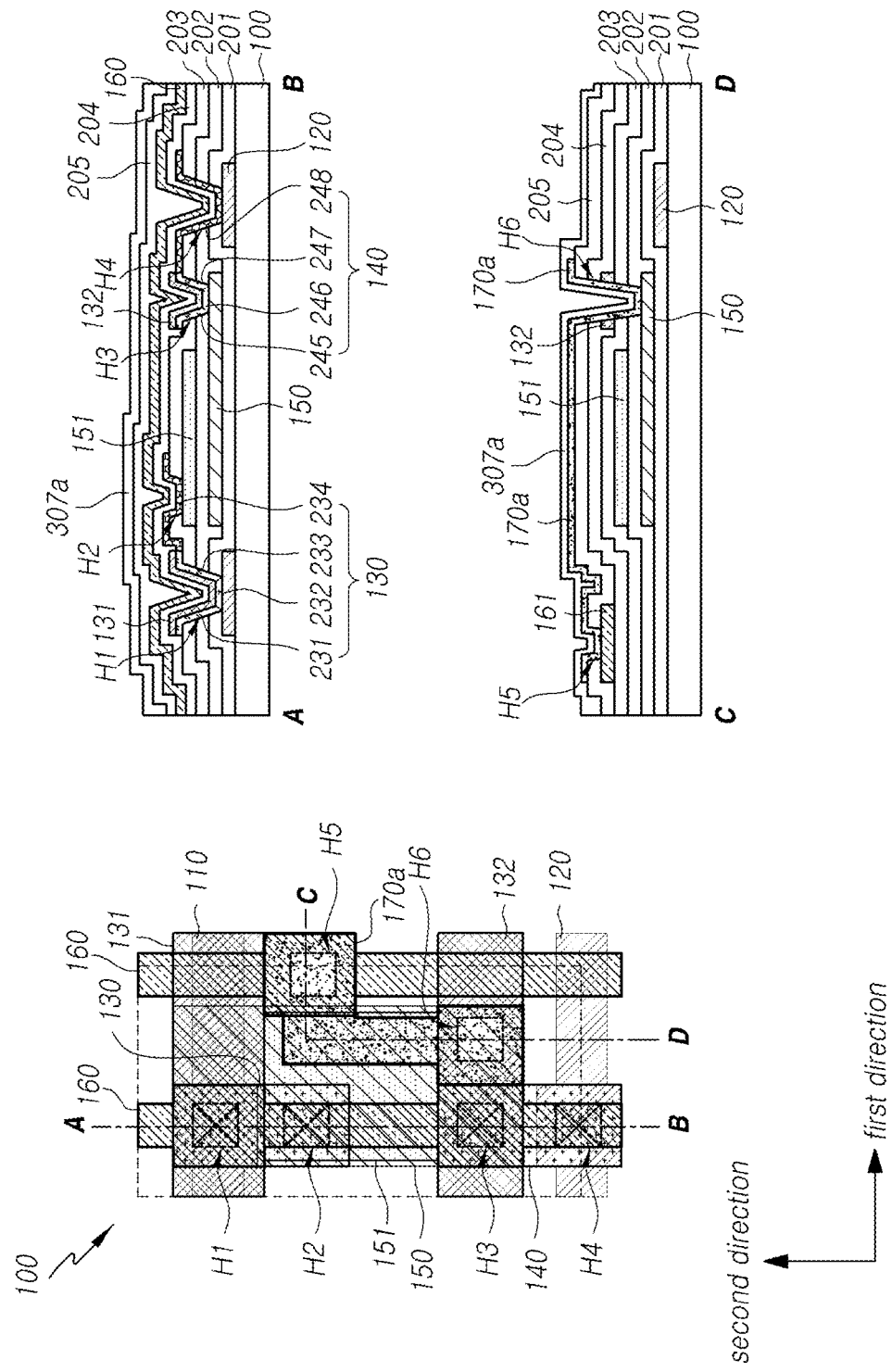

Subsequently, as shown in FIG. 24, a first protection layer material 307*a* may be formed on the substrate 100 on which the third active layer material 170*a* is formed.

Figure 25:
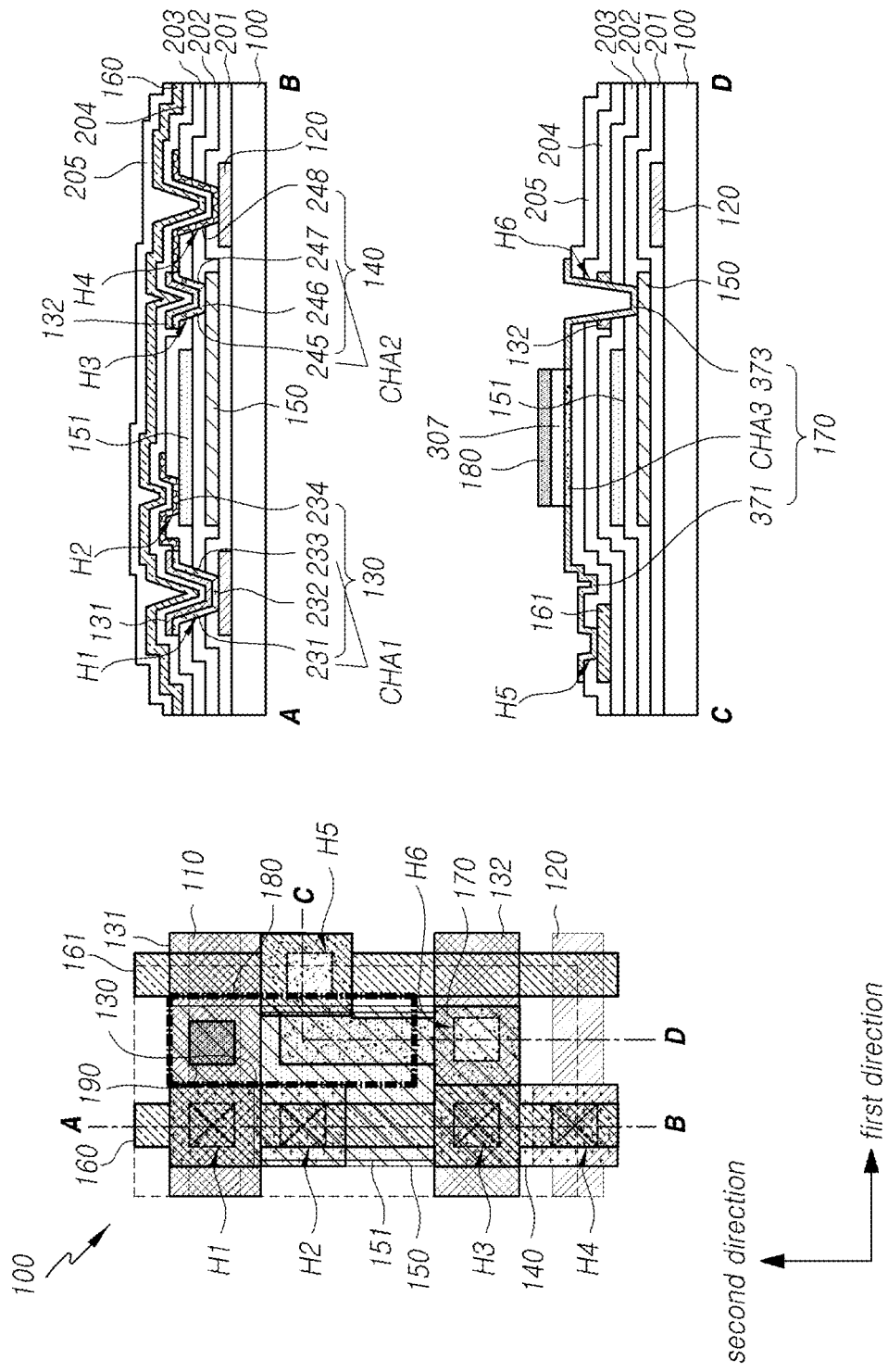

Then, as shown in FIG. 25, the first protection layer material 307*a* is patterned into the first protection layer 307 disposed on a part of the upper surface of the third active layer 170 through a dry etching process. Also, a third conductive layer material may be formed on the first protection layer material 307*a*. The first protection layer material 307*a* and the third conductive layer material may be etched through the same process so that the first protection layer 307 and the third conductive layer 180 may be formed, but the present disclosure is not limited thereto.

Also, as shown in the plan view of FIG. 25, the contact hole 190 may be formed in the first protection layer material 307*a* and the second to fifth insulating layers 202 to 205 to expose a part of the upper surface of the first conductive layer 150.

Meanwhile, in the dry etching process, the third active layer material 170*a* disposed in a region in which the first protection layer 307 is disposed remains without any change, but the third active layer material 170*a* disposed in a region in which the first protection layer 307 is not disposed may be made conductive.

In this way, the third active layer 170 may be formed to have the one end 371 and the other end 373 which are made conductive.

The region of the third active layer 170 overlapping the first protection layer 307 may be the third channel region CHA5.

Also, as shown in FIG. 25, the third conductive layer 180 may be disposed in the contact hole 190, which exposes a part of the upper surface of the first conductive layer 150, and may be in contact with the first conductive layer 150.

In this case, the first conductive layer 150 may be electrically connected to a ground line.

Meanwhile, FIG. 6 and FIGS. 15 to 25 show a structure in which the third conductive layer 180 is electrically connected to the first conductive layer 150 through the contact hole 190, which exposes a part of the upper surface of the first conductive layer 150, but the present disclosure is not limited thereto.

For example, the second conductive layer 151 may extend under the contact hole 190, and the third conductive layer 180 may be electrically connected to the second conductive layer 151 through the contact hole 190. In this case, the third conductive layer 180 may serve as the gate electrode of the the third transistor T3 together with the second conductive layer 151.

Figure 26:
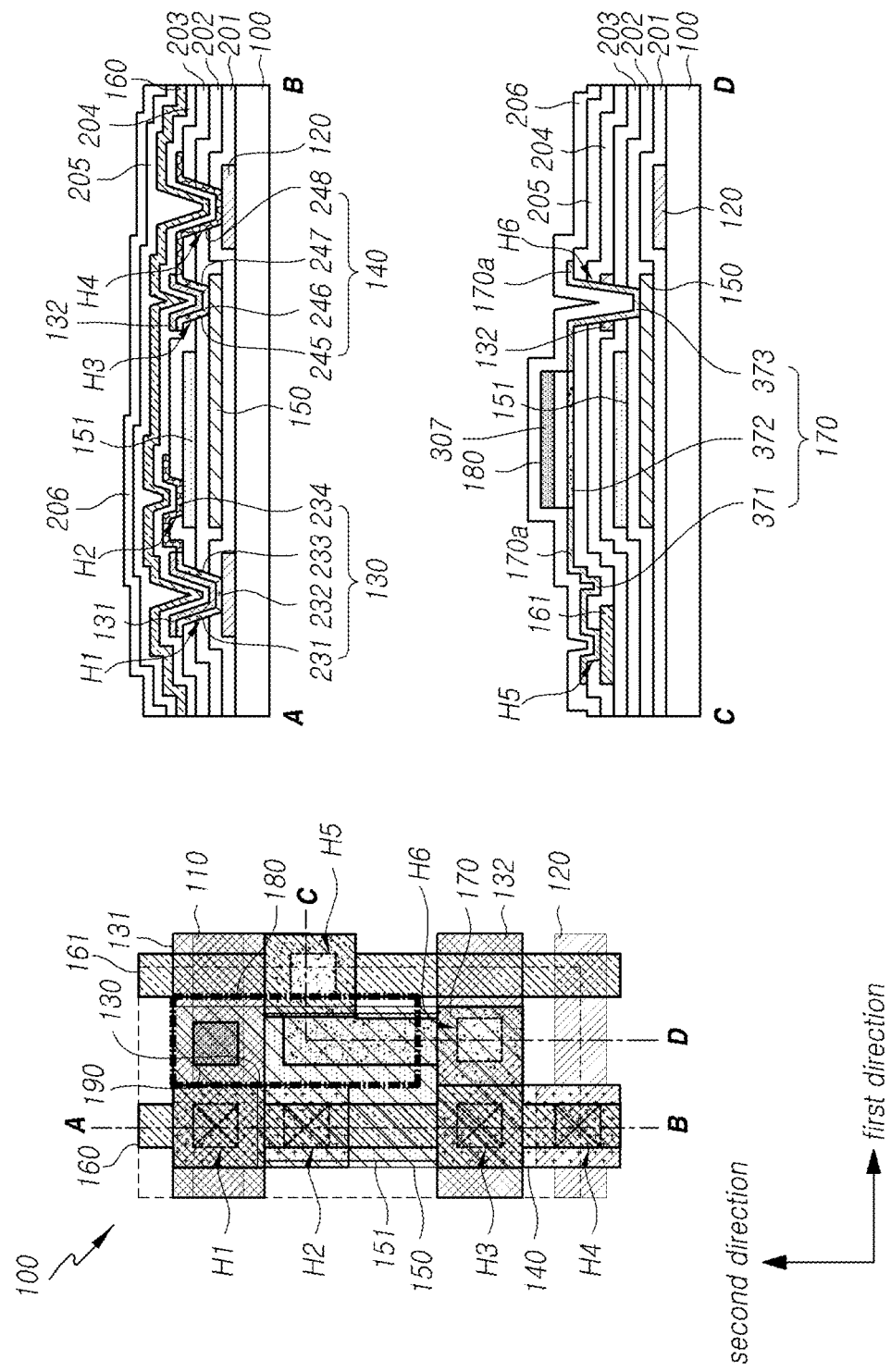

Subsequently, as shown in FIG. 26, the sixth insulating layer 206 may be formed on the substrate 100 on which the third conductive layer 180 is formed.

A method of fabricating the electronic device having the structure of FIGS. 12 to 14 will be described below with reference to FIGS. 27 to 36.

FIGS. 27 to 36 are diagrams schematically illustrating a method of fabricating the electronic device having the structure of FIGS. 12 to 14.

For convenience of description, a region of one subpixel in which three transistors and one capacitor are disposed in an electronic device will be mainly described below.

In the following description, details (a configuration, effects, etc.) which are the same as those of the above-described embodiments may be omitted.

Referring to FIG. 27, the data line 410 and the reference voltage line 420 arranged in the second direction may be disposed on the substrate 400. The data line 410 and the reference voltage line 420 may be disposed apart from each other.

The data line 410 and the reference voltage line 420 may be disposed in the same layer and formed of the same material.

The fourth electrode 411 including a region branching from the data line 410 may be used as the source electrode or the drain electrode of the first transistor T1. The fifth electrode 521 including a region branching from the reference voltage line 420 may be used as the source electrode or the drain electrode of the second transistor T2.

Figure 28:
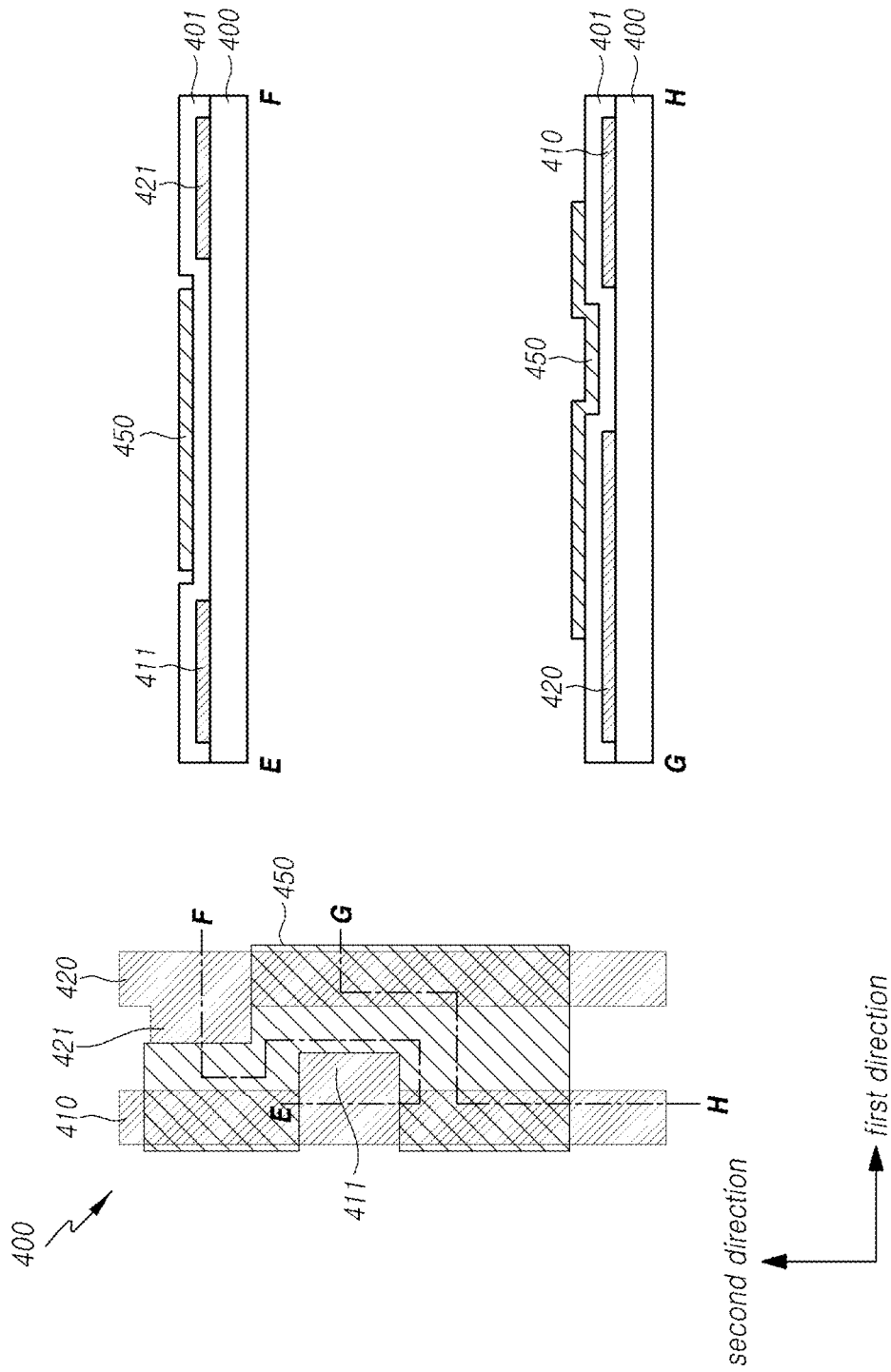

Subsequently, referring to FIG. 28, the first insulating layer 401 may be disposed on the substrate 400 on which the data line 410 and the reference voltage line 420 are disposed.

The first conductive layer 450 may be disposed on the first insulating layer 401.

A part of the first conductive layer 450 may overlap a part of the data line 410 and a part of the reference voltage line 420.

Figure 29:
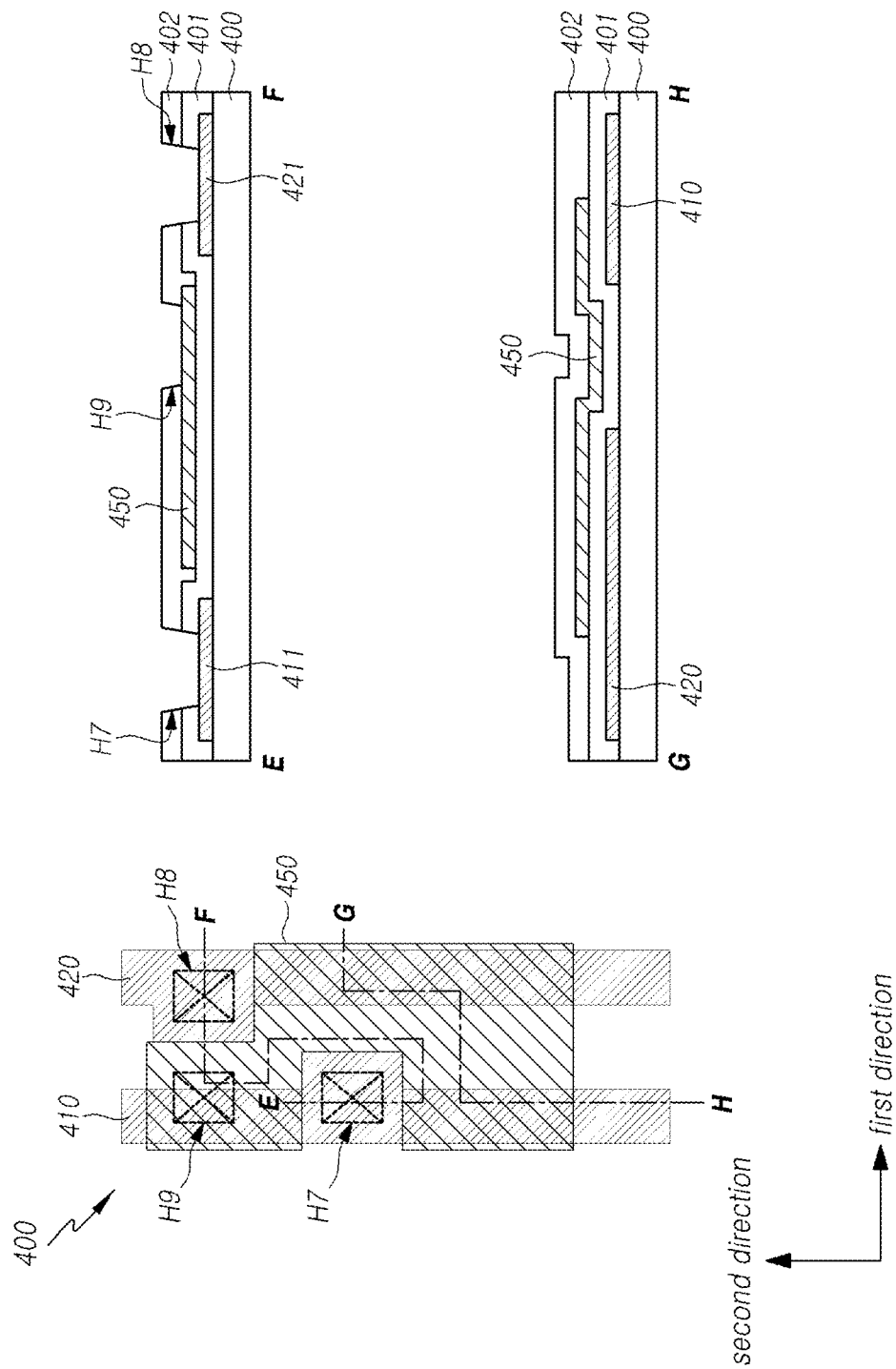

When, as shown in FIG. 29, the second insulating layer 402 may be disposed on the substrate 400 on which the first conductive layer 450 is disposed.

Subsequently, the seventh to ninth holes H7 to H9 may be formed in the first and second insulating layers 401 and 402 through a photolithography process employing a half-tone mask. However, the present disclosure is not limited thereto, and different masks may be used to form the seventh to ninth holes H7 to H9.

The seventh hole H7 may be formed in the first and second insulating layers 401 and 402 and may expose a part of the upper surface of the fourth electrode 411 of the first transistor T1.

The eighth hole H8 may be formed in the first and second insulating layers 401 and 402 and may expose a part of the upper surface of the fifth electrode 421 of the second transistor T2.

The ninth hole H9 may be formed in the second insulating layer 402 and may expose a part of the upper surface of the first conductive layer 450.

Figure 30:
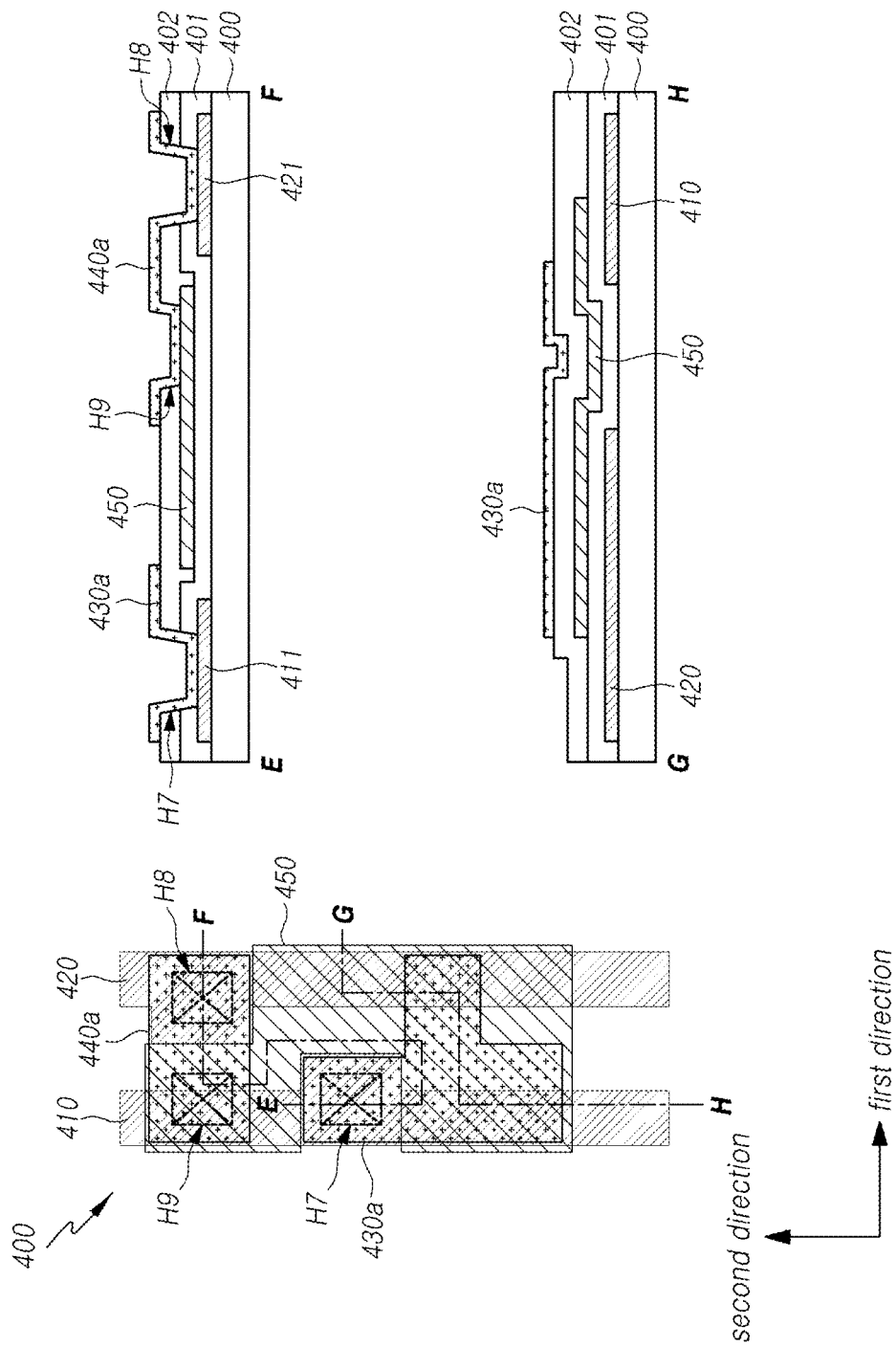

Subsequently, as shown in FIG. 30, a fourth active layer material 430a and a fifth active layer material 440a may be formed.

Specifically, an active layer material may be formed on the substrate 400 on which the second insulating layer 402 is disposed.

As shown in FIG. 30, the active layer material may remain as the fourth active layer material 430a and the fifth active layer material 440a through a wet etching process.

Meanwhile, since the active layer material is disposed on the second insulating layer 402 to overlap the plurality of holes, a photoresist may be formed on the active layer material. For this reason, in the wet etching process, it is possible to form patterns of the active layer material (the fourth active layer material 430a and the fifth active layer material 440a) in desired regions.

In other words, in a process of patterning the active layer material, it is possible to form patterns of the active layer material in desired regions without loss of the active layer material.

The fourth active layer material 430a may be formed to overlap the seventh hole H7 and the first conductive layer 450.

In particular, the fourth active layer material 430a may extend from a part of the upper surface of the second insulating layer 402 to be disposed in the seventh hole H7 and may be formed to extend from the region disposed in the seventh hole H7 to a part of the upper surface of the second insulating layer 402.

The fifth active layer material 440a may be formed to overlap the eighth hole H8 and the ninth hole H9.

In particular, the fifth active layer material 440a may extend from a part of the upper surface of the second insulating layer 402 to be disposed in the eighth hole H8, may extend from the region disposed in the eighth hole H8 to the upper surface of the second insulating layer 402 to be disposed in the ninth hole H9, and may be formed to extend from the region disposed in the ninth hole H9 to a part of the upper surface of the second insulating layer 402.

In this case, in the seventh to ninth holes H7 to H9 having small widths, the active layer material may be formed through a thin film deposition method for controlling thin film deposition such as MOCVD or ALD.

Subsequently, referring to FIGS. 30 and 31, a gate insulating layer material is formed on the substrate 400, and a gate electrode material may be formed on the gate insulating layer material.

The gate insulating layer material and the gate electrode material may be formed through a thin film deposition method for controlling thin film deposition such as MOCVD or ALD.

Figure 31:
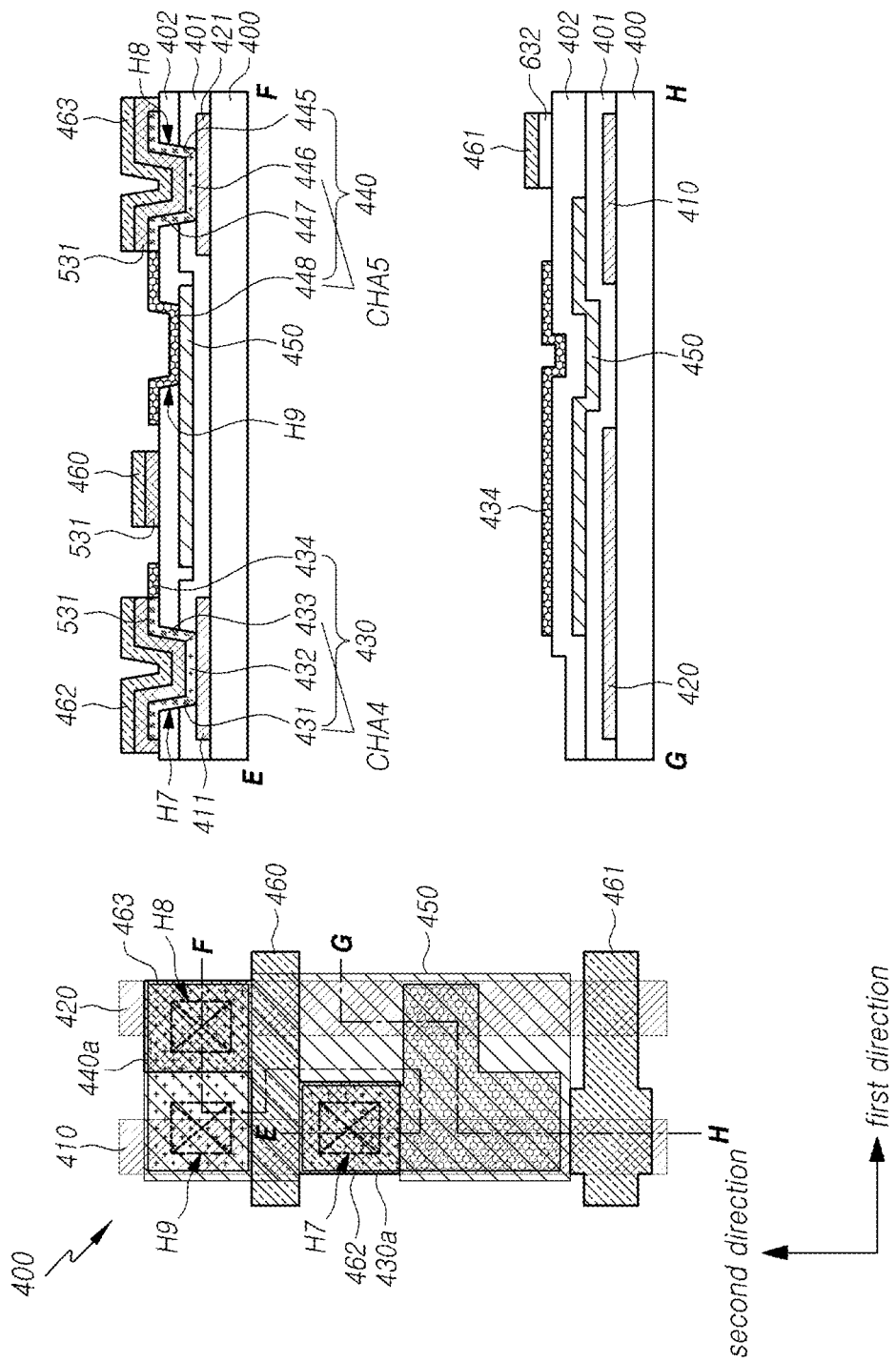

Subsequently, the gate insulating layer material and the gate electrode material are etched together through a dry etching process so that first and second gate insulating layers 531 and 632, the first and second gate lines 460 and 461, and the first and second gate electrodes 462 and 463 branching from the first gate line 460 may be formed as shown in FIG. 31.

In the embodiment of the present disclosure, the gate insulating layer material and the gate electrode material are etched together so that any one of the first gate insulating layer 531 and the second gate insulating layer 632 may be disposed under the first and second gate lines 460 and 461 and the first and second gate electrodes 462 and 463 branching from the first gate line 460.

Meanwhile, the first gate electrode 462 of the first transistor T1 and the first gate insulating layer 531 may overlap a part of the fourth active layer material 430a and the seventh hole H7.

In the dry etching process, the fourth active layer material 430a disposed in a region in which the first gate electrode 462 and the first gate insulating layer 531 disposed under the first gate electrode 462 are disposed remains without any change, but the fourth active layer material 430a disposed in a region from which the gate insulating layer material and the gate electrode material are removed may be made conductive and become the fourth region 434 of the fourth active layer 430 and the second conductive layer 434.

Also, the fifth active layer material 440a disposed in a region in which the second gate electrode 463 and the first gate insulating layer 531 disposed under the second gate electrode 463 are disposed remains as it is, but the fifth active layer material 440a disposed in a region from which the gate insulating layer material and the gate electrode material are removed may be made conductive and become the eighth region 448 of the fifth active layer 440.

The first gate electrode 462 and the first gate insulating layer 531 disposed under the first gate electrode 462 may prevent the fourth channel region CHA4 of the fourth active layer 430 from being made conductive in the dry etching process, and the second gate electrode 463 and the first gate insulating layer 531 disposed under the second gate electrode 463 may prevent the fifth channel region CHA5 of the fifth active layer 440 from being made conductive in the dry etching process.

In the dry etching process, gate electrodes and gate insulating layers may also prevent the second region 432 of the fourth active layer 430 and the sixth region 446 of the fifth active layer 440 from being made conductive.

Figure 32:
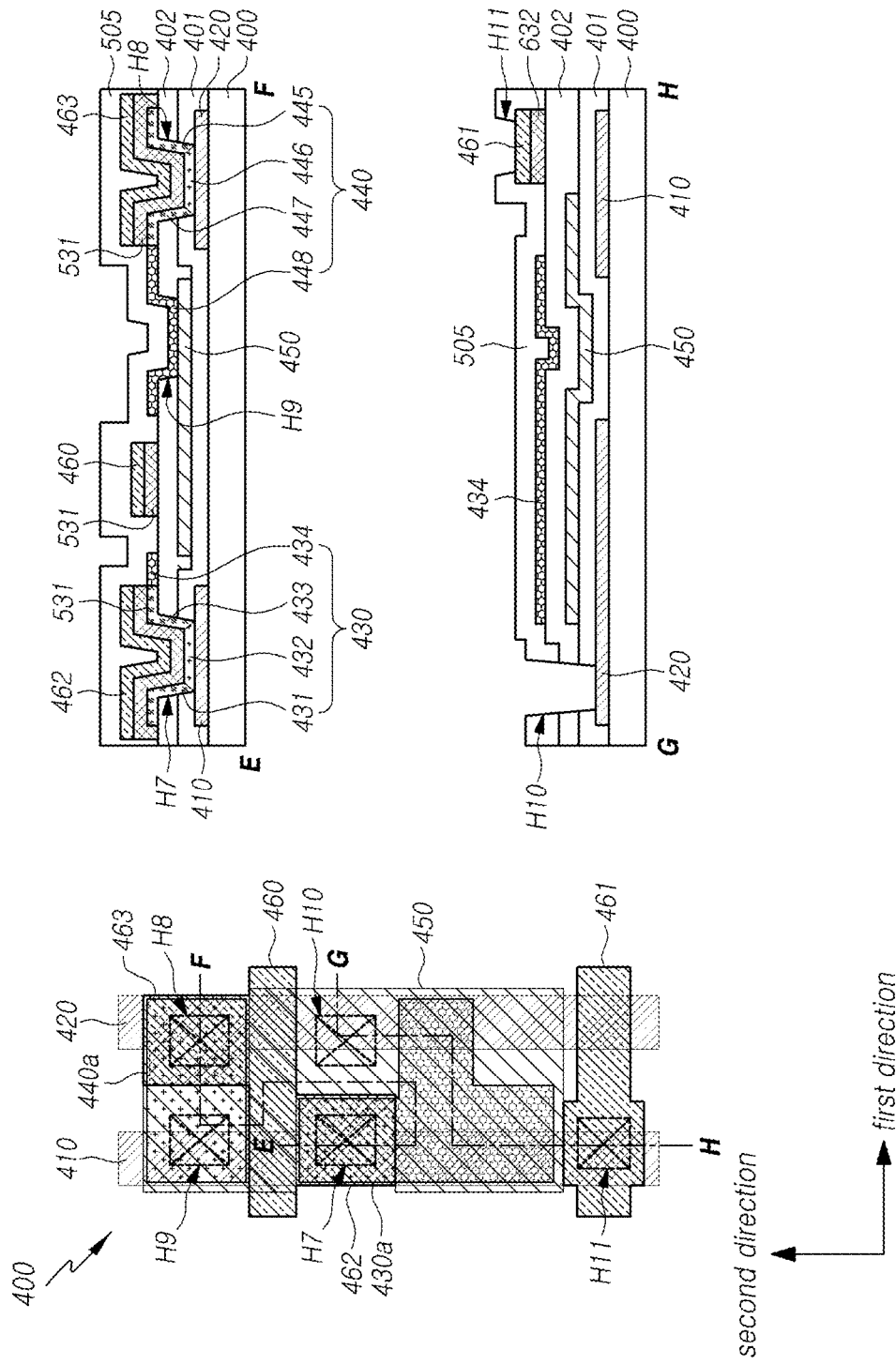

Subsequently, as shown in FIG. 32, the third insulating layer 505 including the tenth hole H10 and the eleventh hole H11 may be formed on the substrate 400.

The third insulating layer 505 may be formed through a process of forming a third insulating layer material on the substrate 400 and then forming the tenth hole H10, which exposes the sixth electrode 420 (corresponding to the reference voltage line) of the third transistor T3, and the eleventh hole H11, which exposes the seventh electrode 461.

The tenth hole H10 and the eleventh hole H11 may be formed through the same process employing a half-tone mask. However, the present disclosure is not limited thereto, and different masks may be used to form the tenth and eleventh holes H10 to H11.

The tenth hole H10 may be formed in the first, second, and third insulating layers 401, 402, and 505.

The eleventh hole H11 may be formed in the third insulating layer 505.

Figure 33:
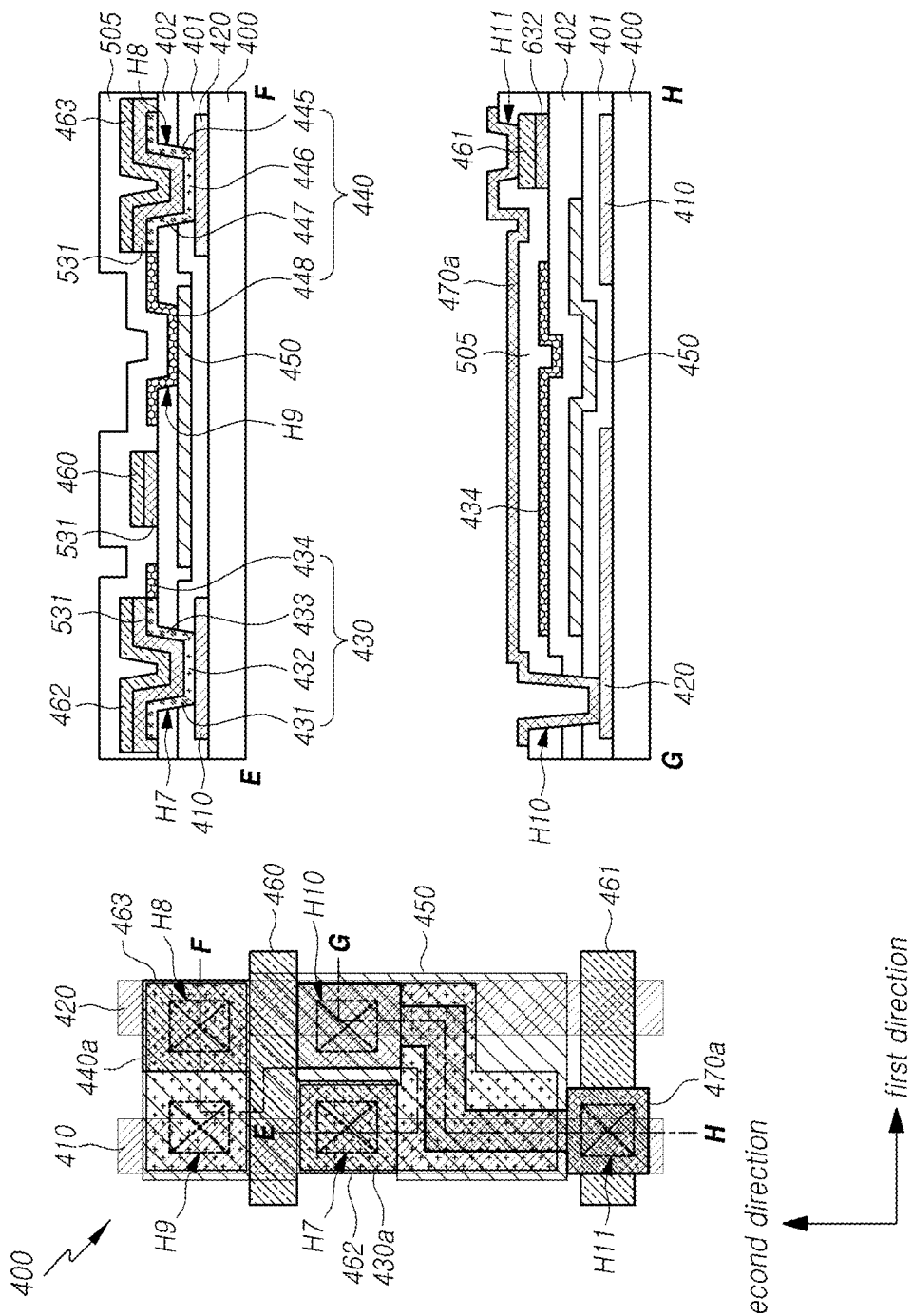

Subsequently, as shown in FIG. 33, the sixth active layer material 470a may be formed.

Specifically, a material for forming the sixth active layer material 470a may be formed on the substrate 400 on which the third insulating layer 505 is formed. Then, the sixth active layer material 470a may be formed in the structure shown in FIG. 33 through a wet etching process.

The sixth active layer material 470a may extend from a part of the upper surface of the third insulating layer 505 to be disposed in the tenth hole H10, may extend from the region disposed in the tenth hole H10 to the upper surface of the third insulating layer 505 to be disposed in the eleventh hole H11, and may be formed to extend from the region disposed in the eleventh hole H11 to a part of the upper surface of the third insulating layer 505.

The sixth active layer material 470a may be formed through MOCVD or ALD so as to be formed in the tenth hole H10 and the eleventh hole H11 having small widths without disconnection.

Figure 34:
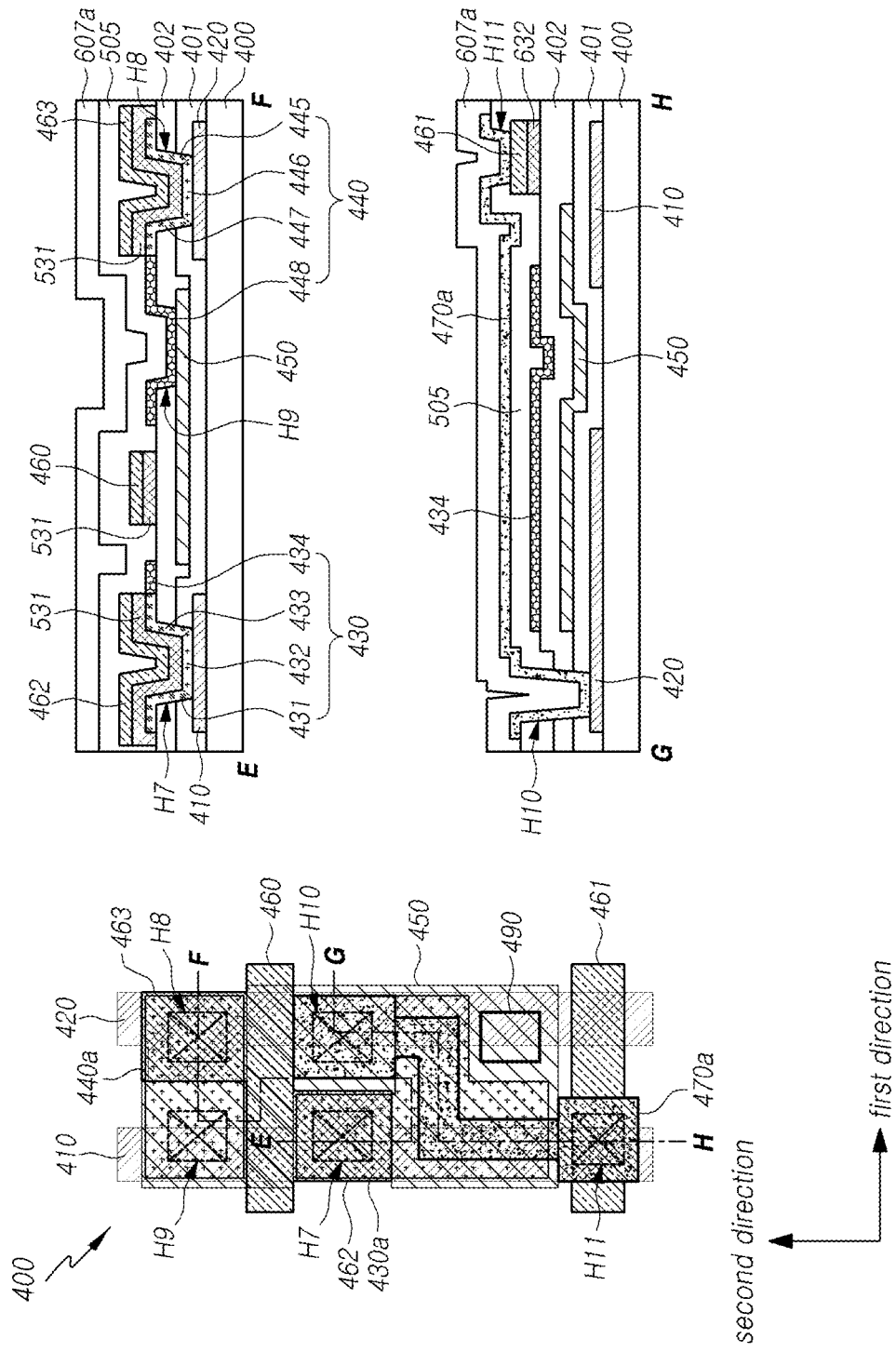

Subsequently, as shown in FIG. 34, a second protection layer material 607a may be formed on the substrate 400 on which the sixth active layer material 470a is formed.

Figure 35:
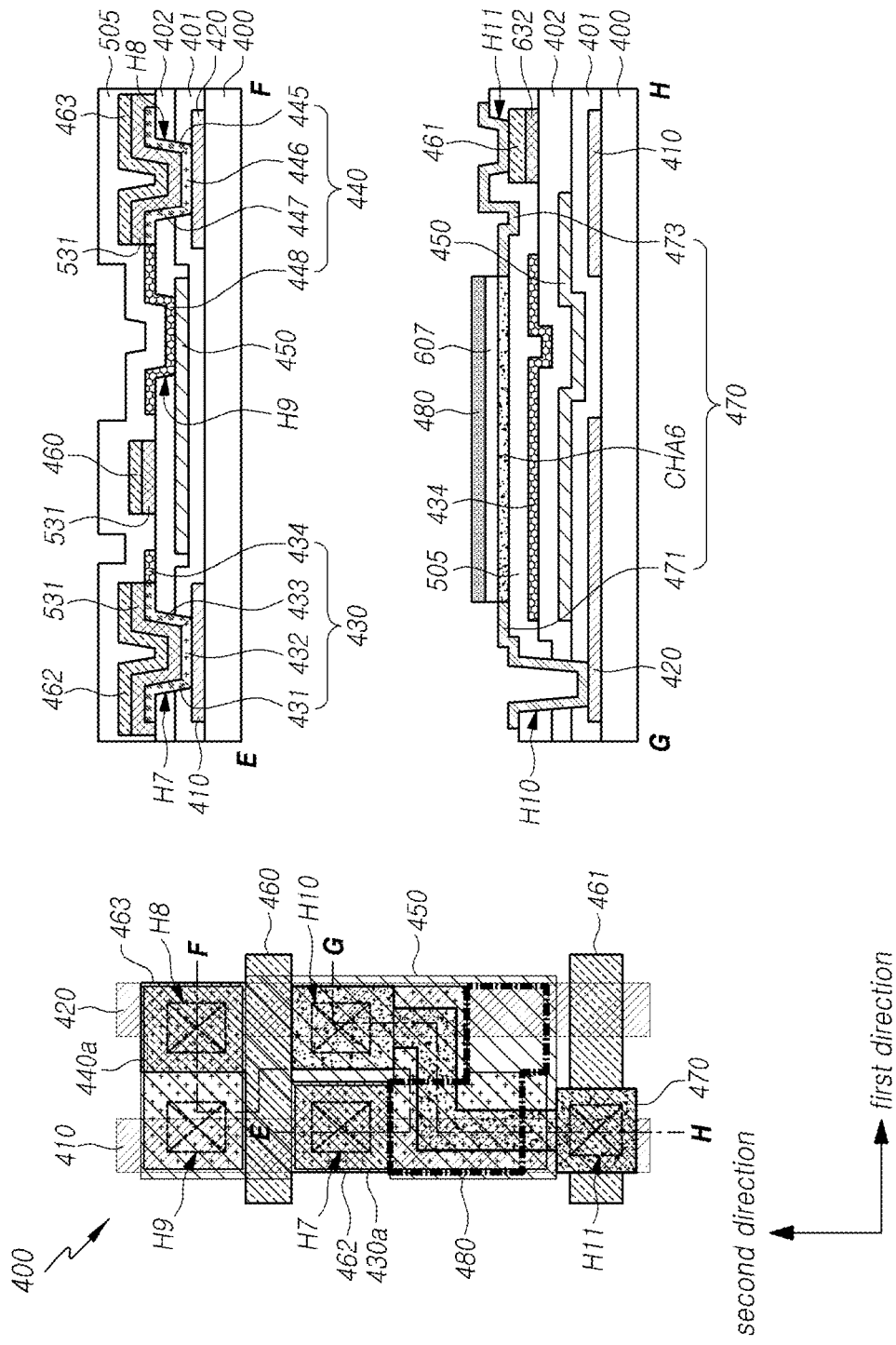

Then, as shown in FIG. 35, the second protection layer material 607a is patterned into the second protection layer 607 disposed on a part of the upper surface of the sixth active layer 470 through a dry etching process. Also, a third conductive layer material may be formed on the second protection layer material 607a. The second protection layer material 607a and the third conductive layer material may be etched through the same process so that the second protection layer 607 and the third conductive layer 480 may be formed, but the present disclosure is not limited thereto.

Also, as shown in the plan view of FIG. 35, the contact hole 490 may be formed in the second protection layer material 607a and the first, second, and third insulating layers 401, 402, and 505 to expose a part of the upper surface of the first conductive layer 450.

Meanwhile, in the dry etching process, the sixth active layer material 470a disposed in a region in which the second protection layer 607 is disposed remains without any change, but the sixth active layer material 470a disposed in a region in which the second protection layer 607 is not disposed may be made conductive.

In this way, the sixth active layer 470 may be formed to have the one end 471 and the other end 473 which are made conductive.

The region of the sixth active layer 470 overlapping the second protection layer 607 may be the sixth channel region CHA6.

Also, as shown in FIG. 35, the third conductive layer 480 may be disposed in the contact hole 490, which exposes a part of the upper surface of the first conductive layer 450, and may be in contact with the first conductive layer 450.

In this case, the first conductive layer 450 may be electrically connected to a ground line.

Meanwhile, FIG. 12 and FIGS. 27 to 35 show a structure in which the third conductive layer 480 is electrically connected to the first conductive layer 450 through the contact hole 490, which exposes a part of the upper surface of the first conductive layer 450, but the present disclosure is not limited thereto.

For example, the second conductive layer 451 (integrated with the fourth active layer 430) may extend under the contact hole 490, and the third conductive layer 480 may be electrically connected to the second conductive layer 451 through the contact hole 490. In this case, the third conductive layer 480 may serve as the gate electrode of the the third transistor T3 together with the second conductive layer 451.

Figure 36:
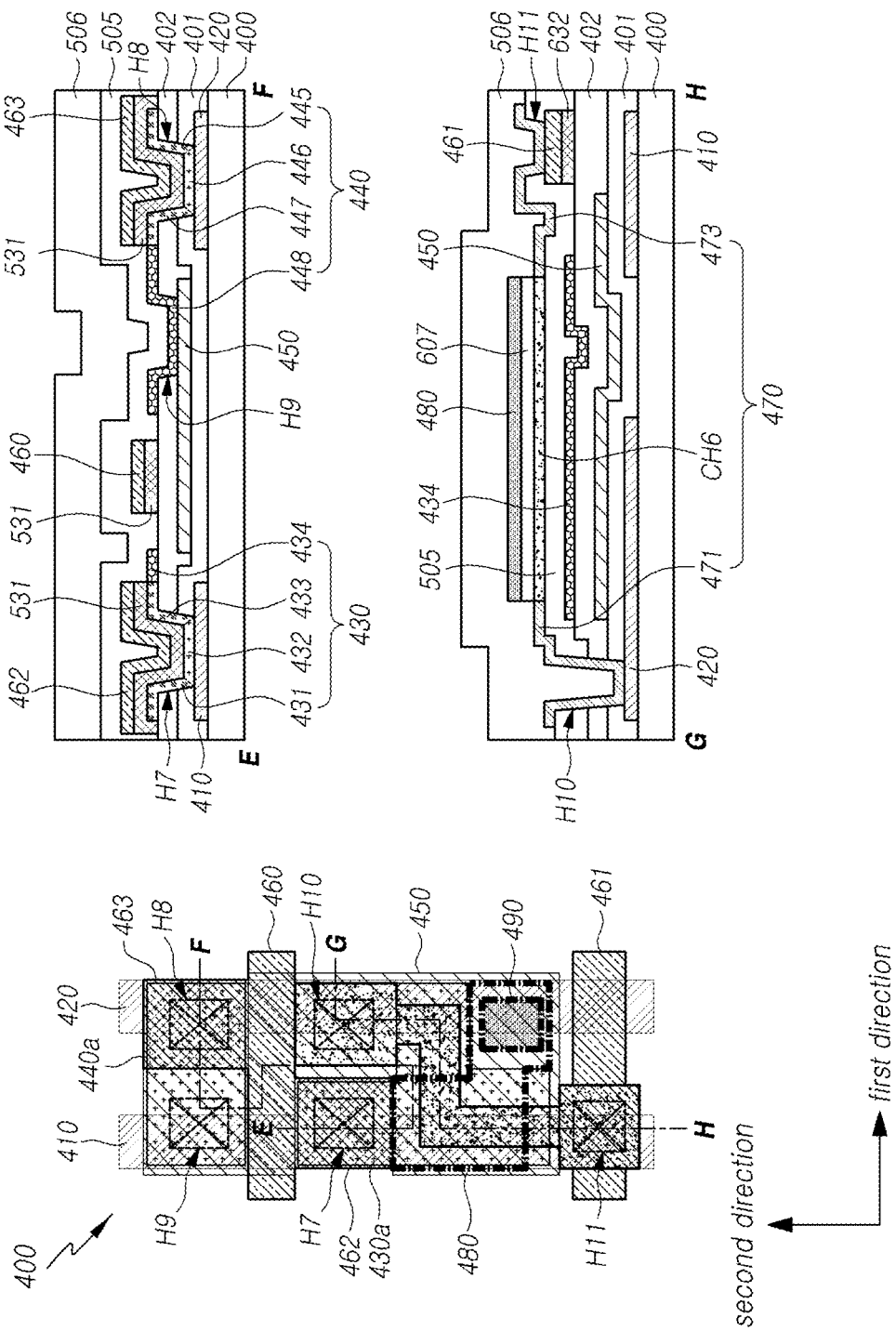

Subsequently, as shown in FIG. 36, the fourth insulating layer 506 may be formed on the substrate 400 on which the third conductive layer 480 is formed.

In a panel including transistors having the above-described structure, the area of subpixels SP may be reduced, and thus it is possible to achieve high resolution.

Meanwhile, for convenience of description, a configuration in which the first to third transistors T1 to T3 are disposed in the active region of a panel has been mainly described, but the present disclosure is not limited thereto.

For example, at least one of the transistors shown in FIGS. 6 to 14 may be disposed in the non-active region of the panel.

According to these embodiments of the present disclosure, it is possible to provide a thin film transistor (TFT) array substrate including at least one transistor having a structure which allows forming of a short channel and integration among a plurality of transistors disposed in a panel and an electronic device including the TFT array substrate.

According to the embodiments of the present disclosure, it is possible to provide a TFT array substrate including at least one transistor having a structure in which a driving margin is increased through a high S-parameter among a plurality of transistors disposed in a panel and an electronic device including the TFT array substrate.

According to the embodiments of the present disclosure, it is possible to provide a TFT array substrate including a transistor having a structure which allows fabrication of an ultra-high definition panel with a reduction in device area and an electronic device including the TFT array substrate.

According to the embodiments of the present disclosure, it is possible to provide a TFT array substrate including a transistor having a structure in which an active layer and an insulating layer have no disconnection and an electronic device including the TFT array substrate.

It will be apparent to those skilled in the art that various modifications and variations can be made in the electronic device of the present disclosure without departing from the technical idea or scope of the disclosure. Thus, it is intended that the present disclosure cover the modifications and variations of this disclosure provided they come within the scope of the appended claims and their equivalents.

What is claimed is:

1. An electronic device, comprising:
   a panel including a first transistor to which a data voltage is configured to be applied;
   a second transistor electrically connected to a data line among a plurality of data lines disposed on the substrate; and
   a driving circuit configured to drive the panel,
   wherein the first transistor comprises:
      a first conductive layer disposed on a substrate; and
      a first active layer disposed on the first conductive layer, having one end and the other end made conductive, and including a first channel region disposed between the one conductive end and the other conductive end,
   wherein a second conductive layer disposed to overlap the first conductive layer with a first insulating layer interposed between the second conductive layer and the first conductive layer constitutes a storage capacitor in the panel,
   wherein the storage capacitor is disposed under the first channel region of the first active layer,
   wherein the second conductive layer is a gate electrode of the first transistor,
   wherein one of a first electrode and the first conductive layer is a source electrode of the first transistor and contacts the one conductive end of the first active layer,
   wherein the other of the first electrode and the first conductive layer is a drain electrode of the first transistor and contacts the other conductive end of the first active layer,
   wherein the first electrode is disposed above the first and second conductive layers and under the first active layer,
   wherein:
      the first insulating layer is disposed on the first conductive layer,
      the second conductive layer is disposed on the first insulating layer,
      the first electrode corresponds to one of a plurality of gate lines disposed on the substrate,
      a second insulating layer is disposed under the first electrode, and
      the one end of the first active layer is in contact with the first electrode through a first hole provided in a fourth insulating layer on the first electrode, and
   wherein the second transistor comprises:
      a second electrode disposed on the substrate and corresponding to the data line;
      a second active layer disposed on a third insulating layer having at least one layer, which is disposed between the first insulating layer and the second insulating layer disposed on the second electrode and including a third hole exposing a part of an upper surface of the second electrode, and including a second channel region;
      a first gate insulating layer disposed on the second active layer; and
      a first gate electrode disposed on the first gate insulating layer.

2. The electronic device of claim 1,
   wherein the other end of the first active layer is in contact with the first conductive layer through a second hole provided in the first to third insulating layers.

3. The electronic device of claim 1, further comprising:
   a first protection layer disposed on the first active layer; and
   a third conductive layer disposed on the first protection layer,
   wherein a region of the first active layer overlapping the first protection layer and the third conductive layer is the first channel region of the first active layer.

4. The electronic device of claim 1, wherein the fourth insulating layer is disposed between the second electrode and the first insulating layer and has the third hole exposing the part of the upper surface of the second electrode, and
   wherein the second active layer comprises:
      a first part disposed on a part of an upper surface of the third insulating layer and disposed on one side surface of each of the first, second, and fourth insulating layers in a region in which the third hole is provided;
      a second part extending from the first part to be in contact with the upper surface of the second electrode;
      a third part extending from the second part to a part of the upper surface of the third insulating layer and disposed on the other side surface of each of the first, second, and fourth insulating layers in the region in which the third hole is provided; and
      a fourth part extending from the third part, including a region disposed in a part of the upper surface of the third insulating layer, and made conductive.

5. The electronic device of claim 4, wherein the first part and the third part of the second active layer correspond to the second channel region of the second active layer, and
   the second channel region of the second active layer includes a part not parallel to the substrate.

6. The electronic device of claim 4, wherein the fourth part of the second active layer does not overlap the first gate insulating layer, and
   the fourth part is in contact with an upper surface of the second conductive layer through a fourth hole provided in the third insulating layer to be spaced apart from the third hole.

7. The electronic device of claim 1, further comprising a third transistor electrically connected to a reference voltage line among a plurality of reference voltage lines disposed parallel to the data lines disposed on the substrate,
wherein the third transistor comprises:
a third electrode disposed in the same layer as the second electrode on the substrate, spaced apart from the second electrode, and corresponding to the reference voltage line;
a third active layer disposed on the first and third insulating layers, which are disposed on the second and third electrodes and include a fifth hole exposing a part of an upper surface of the third electrode, and including a third channel region;
a second gate insulating layer disposed on the third active layer; and
a second gate electrode disposed on the second gate insulating layer.

8. The electronic device of claim 7, wherein the third active layer comprises:
a fifth part disposed on a part of an upper surface of the third insulating layer and disposed on one side surface of each of the first and third insulating layers in a region in which the fifth hole is provided;
a sixth part extending from the fifth part to be in contact with the upper surface of the third electrode;
a seventh part extending from the sixth part to a part of the upper surface of the third insulating layer and disposed on the other side surface of each of the first and third insulating layers in a region in which the fifth hole is provided; and
an eighth part extending from the seventh part, disposed on a part of the upper surface of the third insulating layer, and made conductive.

9. The electronic device of claim 8, wherein the fifth part and the seventh part of the third active layer correspond to the third channel region of the third active layer, and
the third channel region of the third active layer includes a part not parallel to the substrate.

10. The electronic device of claim 8, wherein the fourth insulating layer is disposed between the third electrode and the first insulating layer, and
wherein the first, third, and fourth insulating layers include a sixth hole exposing a part of the upper surface of the third electrode, and
the eighth part of the third active layer does not overlap the second gate insulating layer and is in contact with the upper surface of the third electrode through the sixth hole.

11. The electronic device of claim 7, wherein the first gate electrode of the second transistor and the second gate electrode of the third transistor are integrally formed and correspond to one of the plurality of gate lines crossing the data lines and the reference voltage lines disposed on the substrate.

12. The electronic device of claim 7, wherein one of the second electrode and the second conductive layer is a source electrode of the second transistor,
the other of the second electrode and the second conductive layer is a drain electrode of the second transistor,
one of the third electrode and the first conductive layer is a source electrode of the first transistor, and
the other of the third electrode and the first conductive layer is a drain electrode of the first transistor.

13. The electronic device of claim 1, wherein the second insulating layer is over the first conductive layer and the second conductive layer, and
wherein the first electrode is disposed over the second insulating layer.

14. The electronic device of claim 1, wherein:
the other conductive end of the first active layer contacts the other of the first electrode and the first conductive layer through a second hole in the first insulating layer, and
the first active layer has a region formed along a sidewall of the first insulating layer in the second hole.

15. An electronic device, comprising:
a panel including a first transistor configured to receive a data voltage;
a second transistor connected to one of a plurality of data lines disposed on the substrate; and
a driving circuit configured to drive the panel,
wherein:
the first transistor comprises:
a first conductive layer disposed on a substrate; and
a first active layer disposed on the first conductive layer, having one end and the other end made conductive, and including a first channel region disposed between the one conductive end and the other conductive end,
a second conductive layer disposed to overlap the first conductive layer with a first insulating layer interposed between the second conductive layer and the first conductive layer constitutes a storage capacitor in the panel,
the storage capacitor is disposed under the first channel region of the first active layer,
a fourth electrode is disposed on the substrate,
a second insulating layer is disposed on the fourth electrode,
the first insulating layer is disposed on the first conductive layer,
the second conductive layer and a fifth electrode are disposed on the first insulating layer,
a third insulating layer is disposed on the second conductive layer and the fifth electrode,
the first to third insulating layers include a seventh hole exposing a part of an upper surface of the fourth electrode,
the one conductive end of the first active layer is in contact with the fourth electrode through the seventh hole,
the other conductive end of the first active layer is in contact with the fifth electrode through an eighth hole provided in the third insulating layer, and
the second transistor comprises:
a sixth electrode disposed on the substrate;
a second active layer disposed on the first and second insulating layers, which are disposed on the sixth electrode and include a ninth hole exposing a part of an upper surface of the sixth electrode, and including a second channel region;
a first portion of a second gate insulating layer disposed on the second active layer; and
a first gate electrode disposed on the first portion of the second gate insulating layer.

16. The electronic device of claim 15, further comprising a first gate insulating layer disposed between the fifth electrode and the first insulating layer to overlap the fifth electrode,
wherein the fifth electrode corresponds to one of a plurality of gate lines disposed on the substrate.

17. The electronic device of claim 15, wherein the second conductive layer is a gate electrode of the first transistor,
one of the fourth electrode and the fifth electrode is a source electrode of the first transistor, and the other of the fourth electrode and the fifth electrode is a drain electrode of the first transistor.

18. The electronic device of claim 15, further comprising:
a second protection layer disposed on the first active layer; and
a third conductive layer disposed on the second protection layer,
wherein a region of the first active layer overlapping the second protection layer and the third conductive layer is the first channel region of the first active layer.

19. The electronic device of claim 15, wherein the second active layer comprises:
a first region disposed on a part of an upper surface of the first insulating layer including the ninth hole and disposed on one side surface of each of the first and second insulating layers in a region in which the ninth hole is provided;
a second region extending from the first region to be in contact with the upper surface of the sixth electrode;
a third region extending from the second region to a part of the upper surface of the first insulating layer and disposed on the other side surface of each of the first and second insulating layers in the region in which the ninth hole is provided; and
a fourth region extending from the third region, disposed in a part of the upper surface of the first insulating layer, and made conductive.

20. The electronic device of claim 19, wherein:
the fourth region of the second active layer does not overlap the first portion of the second gate insulating layer and the first gate electrode and overlaps the first conductive layer, and
the fourth region overlapping the first conductive layer corresponds to the second conductive layer.

21. The electronic device of claim 19, wherein the first and third regions correspond to the second channel region of the second active layer, and
the second channel region of the second active layer includes a part not parallel to the substrate.

22. The electronic device of claim 15, further comprising a third transistor electrically connected to one of a plurality of reference voltage lines disposed on the substrate,
wherein the third transistor comprises:
a seventh electrode disposed in the same layer as the sixth electrode on the substrate and spaced apart from the sixth electrode;
a third active layer disposed on the first and second insulating layers, which are disposed on the sixth and seventh electrodes and include a tenth hole exposing a part of an upper surface of the seventh electrode, and including a third channel region;
a second portion of the second gate insulating layer disposed on the third active layer; and
a second gate electrode disposed on the second portion of the second gate insulating layer.

23. The electronic device of claim 22, wherein the third active layer comprises:
a fifth region disposed on a part of an upper surface of the first insulating layer including the tenth hole and disposed on one side surface of each of the first and second insulating layers in a region in which the tenth hole is provided;
a sixth region extending from the fifth region to be in contact with the upper surface of the seventh electrode;
a seventh region extending from the sixth region to a part of the upper surface of the first insulating layer and disposed on the other side surface of each of the first and second insulating layers in a region in which the tenth hole is provided; and
an eighth region extending from the seventh region, disposed on a part of the upper surface of the first insulating layer, and made conductive.

24. The electronic device of claim 23, wherein the eighth region of the third active layer does not overlap the second portion of the second gate insulating layer and the second gate electrode and is in contact with a part of the upper surface of the first conductive layer through an eleventh hole provided in the first insulating layer.

25. The electronic device of claim 23, wherein the fifth and seventh regions correspond to the third channel region of the third active layer, and
the third channel region of the third active layer includes a part not parallel to the substrate.

26. The electronic device of claim 22, wherein one of the sixth electrode and the second conductive layer is a source electrode of the second transistor,
the other of the sixth electrode and the second conductive layer is a drain electrode of the second transistor,
one of the seventh electrode and the first conductive layer is a source electrode of the first transistor, and
the other of the seventh electrode and the first conductive layer is a drain electrode of the first transistor.

27. An electronic device, comprising:
a panel; and
a driving circuit configured to drive the panel,
wherein a first transistor and a second transistor disposed on the panel comprise:
a first electrode of the first transistor disposed on a substrate and a second electrode of the second transistor disposed apart from the first electrode;
a first conductive layer on a first insulating layer disposed on the first electrode and the second electrode;
a third insulating layer disposed on a second conductive layer on a second insulating layer;
a first active layer of the first transistor and a second active layer of the second transistor which are disposed apart from each other on the third insulating layer;
a fourth insulating layer disposed on the first and second active layers; and
a first gate electrode of the first transistor and a second gate electrode of the second transistor which are disposed on the fourth insulating layer,
wherein the first to third insulating layers include a first hole exposing a part of an upper surface of the first electrode and a second hole exposing a part of an upper surface of the first conductive layer,
the first active layer is disposed on a part of an upper surface of the third insulating layer and in the first hole and includes a first channel region having a length proportional to a thickness of the first to third insulating layers, and
the second active layer is disposed on a part of the upper surface of the third insulating layer and in the second hole and includes a second channel region having a length proportional to a thickness of the second and third insulating layers.

28. The electronic device of claim 27, wherein one of the first electrode and the second conductive layer is a source electrode of the first transistor,
the other of the first electrode and the second conductive layer is a drain electrode of the first transistor, one of the second electrode and the first conductive layer is a source electrode of the second transistor, the other of the second electrode and the first conductive layer is a drain electrode of the second transistor, and the first conductive layer constitutes a capacitor together with the second conductive layer disposed on the second insulating layer.

29. The electronic device of claim 27, wherein the first active layer comprises:
 a first part disposed on a part of the upper surface of the third insulating layer and disposed on one side surface of each of the first to third insulating layers in a region in which the first hole is provided;
 a second part extending from the first part to be in contact with the upper surface of the first electrode;
 a third part extending from the second part to a part of the upper surface of the third insulating layer and disposed on the other side surface of each of the first to third insulating layers in the region in which the first hole is provided; and
 a fourth part extending from the third part, disposed on a part of the upper surface of the third insulating layer and in a third hole exposing a part of an upper surface of the second conductive layer disposed on the second insulating layer, and made conductive, and
 the first part and the third part correspond to the first channel region of the first active layer.

30. The electronic device of claim 27, wherein the second active layer comprises:
 a fifth part disposed on a part of the upper surface of the third insulating layer and disposed on one side surface of each of the second and third insulating layers in a region in which the second hole is provided;
 a sixth part extending from the fifth part to be in contact with an upper surface of the first conductive layer;
 a seventh part extending from the sixth part to a part of the upper surface of the third insulating layer and disposed on the other side surface of each of the second and third insulating layers in the region in which the second hole is provided; and
 an eighth part extending from the seventh part, disposed on a part of the upper surface of the third insulating layer and in a fourth hole exposing a part of the upper surface of the second electrode, and made conductive, and
 the fifth part and the seventh part correspond to the second channel region of the second active layer.

31. The electronic device of claim 27, further comprising a third transistor to which a data voltage is applied,
 wherein the third transistor comprises:
 a second conductive layer disposed on the second insulating layer and serving as a gate electrode;
 a third active layer disposed on the third insulating layer, the fourth insulating layer, and a fifth insulating layer, which are sequentially disposed on the second conductive layer, and including a third channel region; and
 a third electrode which is in contact with one end of the third active layer and the first conductive layer which is in contact with the other end of the third active layer,
 the third electrode is disposed on the fourth insulating layer,
 the first conductive layer is disposed on the first insulating layer,
 one of the third electrode and the first conductive layer is a source electrode of the third transistor, and
 the other of the third electrode and the first conductive layer is a drain electrode of the third transistor.

32. The electronic device of claim 31, wherein the third channel region of the third active layer is disposed on a storage capacitor comprising the first conductive layer and the second conductive layer disposed on the first conductive layer.

33. The electronic device of claim 31, wherein at least one of the first to third active layers of the first to third transistors has two or more layers.

* * * * *